(12) United States Patent
Kocon et al.

(10) Patent No.: US 12,218,235 B2
(45) Date of Patent: *Feb. 4, 2025

(54) HYBRID COMPONENT WITH SILICON AND WIDE BANDGAP SEMCONDUCTOR MATERIAL

(71) Applicant: Texas Instruments Incorporated, Dallas, TX (US)

(72) Inventors: Christopher Boguslaw Kocon, Mountain Top, PA (US); Henry Litzmann Edwards, Garland, TX (US); Curry Bachman Taylor, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 470 days.

This patent is subject to a terminal disclaimer.

(21) Appl. No.: 17/487,149

(22) Filed: Sep. 28, 2021

(65) Prior Publication Data

US 2022/0271158 A1 Aug. 25, 2022

Related U.S. Application Data

(60) Provisional application No. 63/152,386, filed on Feb. 23, 2021.

(51) Int. Cl.
*H01L 29/78* (2006.01)
*H01L 29/40* (2006.01)

(52) U.S. Cl.
CPC ........ *H01L 29/7816* (2013.01); *H01L 29/402* (2013.01)

(58) Field of Classification Search
CPC .............. H01L 29/7816; H01L 29/402; H01L 29/0692; H01L 29/0696; H01L 29/66659; H01L 29/0657; H01L 29/0847; H01L 29/267; H01L 29/732; H01L 29/7393; H01L 29/7836; H01L 29/872; H01L 29/1045; H01L 29/1083; H01L 29/165; H01L 29/42368; H01L 29/665; H01L 29/861; H01L 29/7835
See application file for complete search history.

(56) References Cited

U.S. PATENT DOCUMENTS

2020/0335623 A1* 10/2020 Shin .................... H01L 29/7816
2022/0271159 A1 8/2022 Kocon et al.

* cited by examiner

*Primary Examiner* — Shahed Ahmed
*Assistant Examiner* — Khatib A Rahman
(74) *Attorney, Agent, or Firm* — Yudong Kim; Frank D. Cimino

(57) ABSTRACT

A microelectronic device includes a hybrid component. The microelectronic device has a substrate including silicon semiconductor material. The hybrid component includes a silicon portion in the silicon, and a wide bandgap (WBG) structure on the silicon. The WBG structure includes a WBG semiconductor material having a bandgap energy greater than a bandgap energy of the silicon. The hybrid component has a first current terminal on the silicon, and a second current terminal on the WBG semiconductor structure. The microelectronic device may be formed by forming the silicon portion of the hybrid component in the silicon, and subsequently forming the WBG structure on the silicon.

20 Claims, 19 Drawing Sheets

HYBRID COMPONENT WITH SILICON AND WIDE BANDGAP SEMCONDUCTOR MATERIAL

CROSS-REFERENCE TO RELATED APPLICATIONS

This application is related to U.S. Provisional Patent Application No. 63/152,386 (Texas Instruments Docket No. T100462US01), filed on Feb. 23, 2021, and hereby incorporated herein by reference in its entirety.

FIELD

This disclosure relates to the field of microelectronic devices. More particularly, but not exclusively, this disclosure relates to semiconductor components having wide bandgap semiconductor material in microelectronic devices.

BACKGROUND

Semiconductor components are being continually improved to operate at higher potentials and to provide lower resistances to current flow. Fabricating reliable semiconductor components that have increasingly higher performance is challenging.

SUMMARY

The present disclosure introduces a microelectronic device including a hybrid component. The microelectronic device has a substrate including silicon semiconductor material. The hybrid component includes a silicon portion in the silicon, and a wide bandgap (WBG) structure on the silicon. The WBG structure includes a WBG semiconductor material having a bandgap energy greater than a bandgap energy of the silicon. The hybrid component has a first current terminal on the silicon, and a second current terminal on the WBG semiconductor structure. The microelectronic device may be formed by forming the silicon portion of the hybrid component in the silicon, and subsequently forming the WBG structure on the silicon.

DETAILED DESCRIPTION

Figure 1:
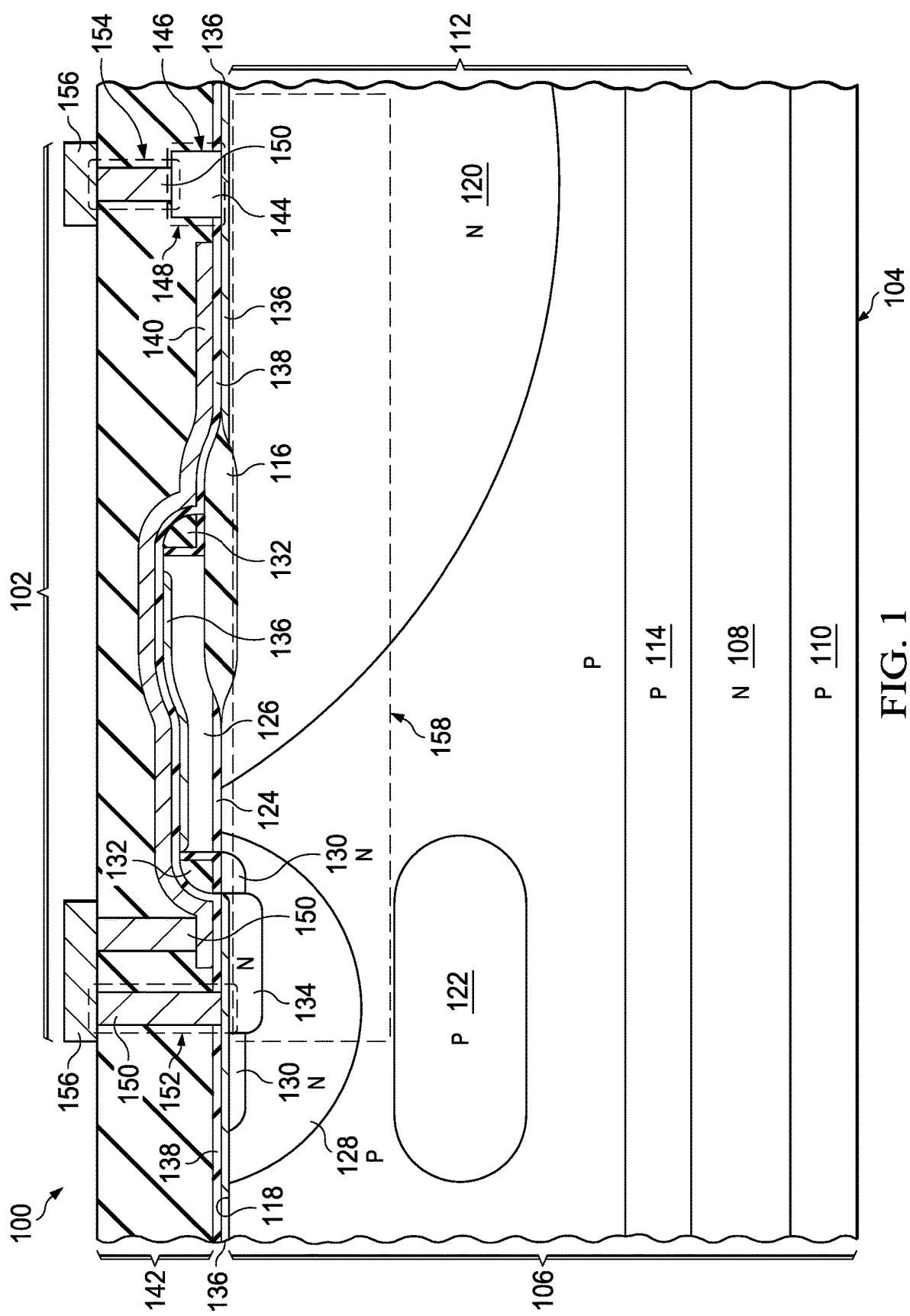
FIG. 1 is a cross section of an example microelectronic device having a hybrid component with a WBG structure that includes metal silicide between a WBG semiconductor material and silicon semiconductor material.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

The following co pending patent applications have related subject matter and are hereby incorporated by reference: U.S. patent application Ser. No. 17/487,187 titled "HYBRID COMPONENT WITH SILICON AND WIDE BANDGAP SEMCONDUCTOR MATERIAL IN SILICON RECESS", by Kocon, et al.), And U.S. patent application Ser. No. 17/487,209, titled "HYBRID COMPONENT WITH SILICON AND WIDE BANDGAP SEMCONDUCTOR MATERIAL IN SILICON RECESS WITH NITRIDE SPACER", by Kocon, et al.), Both filed simultaneously with this application. With their mention in this section, these patent applications are not admitted to be prior art with respect to the present invention.

A microelectronic device is formed in and on a substrate that includes silicon semiconductor material, referred to herein as the silicon. The silicon has a top surface, which is generally planar, but may have a recess. The microelectronic device includes a hybrid component. The hybrid component includes a silicon portion in the silicon, and a wide bandgap (WBG) structure with WBG semiconductor material on the silicon. The hybrid component may be manifested as a laterally diffused metal oxide semiconductor (LDMOS) transistor, a drain extended metal oxide semiconductor (DEMOS) transistor, a bipolar junction transistor, a junction field effect transistor, a gated bipolar, a gated unipolar semiconductor device, an insulated gate bipolar transistor (IGBT), a silicon controlled rectifier (SCR), a metal oxide semiconductor (MOS)-triggered SCR, a MOS-controlled thyristor, a gated diode, or a Schottky diode, by way of example.

In an LDMOS transistor for example, by adding the WBG semiconductor material in series with the silicon drift region, additional drain voltage can be tolerated before breakdown occurs. Due to the high breakdown field strength of WBG semiconductors, the thickness of WBG semiconductor needed to sustain a given voltage drop is much less than silicon. For example, the 30V capability of a silicon LDMOS could be increased to 60V or 100V or more by adding increasingly thicker layers of WBG semiconductor material to the drain region without increasing the areal footprint of the LDMOS. A similar concept applies to other device types described above where adding a WBG semiconductor material in a current path between terminals of a device increases the breakdown voltage between those terminals to a greater extent (for a given thickness) than silicon.

The WBG structure includes a WBG semiconductor material having a bandgap energy greater than a bandgap energy of the silicon. In some examples, the WBG structure may include metal silicide between the WBG semiconductor material and the silicon. In some examples, the WBG structure may include an interface layer between the WBG semiconductor material and the silicon. The interface layer may provide a nucleation layer to facilitate formation of the WBG semiconductor material. The interface layer may provide a stress relief layer to accommodate difference in lattice constants between the silicon and the WBG semiconductor material. The interface layer may consist of multiple layers with increasing lattice constant to minimize effects of large differences in lattice constants between the silicon and the WBG semiconductor material. The interface layer may provide an ohmic layer to reduce electrical resistance in the hybrid component. In some versions of the microelectronic device, the interface layer may be recessed from lateral boundaries of the WBG semiconductor material. In some versions of the microelectronic device, the interface layer may be laterally heterogeneous, that is, may have a varying composition in one or two lateral directions. The interface layer may include, by way of example, one or more refractory metals, one or more metals of the platinum group, one or more two-dimensional materials, or one or more rare earth metals. The interface layer may include a cap layer of gold, to enhance nucleation of the subsequently-formed WBG semiconductor material. For the purposes of this disclosure, refractory metals include niobium, molybdenum, tantalum, tungsten, titanium, vanadium, chromium, zirconium, and hafnium. For the purposes of this disclosure, the metals of the platinum group include ruthenium, rhodium, palladium, osmium, iridium, and platinum. For the purposes of this disclosure, two-dimensional materials include graphene, two-dimensional metal carbide, metal carbonitride, or metal nitride, chalcogenides, hexagonal boron nitride, and two-dimensional tin or molybdenum compounds. For the purposes of this disclosure, rare earth metals include yttrium, scandium, lanthanum, cerium, praseodymium, neodymium, promethium, samarium, europium, gadolinium, terbium, dysprosium, holmium, erbium, thulium, ytterbium, and lutetium. In some examples, the WBG structure may include both a metal silicide layer and an interface layer. In versions of the hybrid component having the interface layer, the metal silicide layer, or both, the WBG semiconductor material is separated from the silicon by less than 100 nanometers at a boundary between the WBG structure and the silicon. In all cases, the microelectronic device is free of interconnect elements, such as interconnect lines, vias, contacts, wire bonds, bump bonds, leads, and such, at a boundary between the WBG structure and the silicon portion of the hybrid component. The microelectronic device has a first current terminal on the silicon portion of the hybrid component, and a second current terminal on the WBG structure of the hybrid component. The first current terminal and the WBG structure are on a same side of the silicon. The WBG structure may include a contact layer between the second current terminal and the WBG semiconductor material, to reduce electrical resistance in the hybrid component. The contact layer may include a metal or a metal silicide, for example. The WBG semiconductor material has at least one lateral dimension adjacent to the silicon that is no greater than 10 times a thickness of the WBG semiconductor material or 10 times a depth of a recess in the silicon in which the WBG semiconductor material is formed, whichever is greater, which may advantageously provide a low number of lattice dislocation defects in the silicon adjacent to the WBG semiconductor material. The thickness of the WBG semiconductor material is in a vertical direction, perpendicular to the lateral dimension. The microelectronic device may be formed by forming the silicon portion of the hybrid component in the silicon, and subsequently forming the WBG structure on the silicon. The first current terminal and the second current terminal may subsequently be formed on the silicon portion and the WBG structure, respectively. The hybrid component is configured to have current between the first current terminal and the second current terminal pass through the boundary between the WBG structure and the silicon.

It is noted that terms such as top, bottom, over, above, under, and below may be used in this disclosure. These terms should not be construed as limiting the position or orientation of a structure or element, but should be used to provide spatial relationship between structures or elements. Examples of materials and dopants that are expressed in the alternative form, using the conjunction "or" are understood to encompass combinations of the materials and dopants. For the purposes of this disclosure, the term "lateral" refers to a direction parallel to a plane of the top surface of the silicon adjacent to the WBG structure, and the term "vertical" is understood to refer to a direction perpendicular to the plane of the top surface of the silicon.

For the purposes of this disclosure, the term "conductive" is understood to mean "electrically conductive." The term "non-conductive" is understood to mean "electrically non-conductive." The term "connected" is understood to mean "electrically connected" so as to be capable of supporting a direct current (DC) electric current between the connected elements.

For the purposes of this description, WBG semiconductor material encompasses semiconductor materials having a bandgap energy greater than silicon, including group IV semiconductor materials having a bandgap energy greater than silicon, group III-V semiconductors having a bandgap energy greater than silicon, group II-VI semiconductors having a bandgap energy greater than silicon, perovskite semiconductor material having a bandgap energy greater than silicon, and other semiconductor materials having a bandgap energy greater than silicon, such as magnesium oxide and magnesium sulfide.

Bandgap energy is an energy range in semiconductor material where no electronic states can exist. Bandgap energy generally refers to the energy difference (commonly expressed in electron volts) between a top of a valence band and a bottom of a conduction band in the semiconductor material. Bandgap energy is the energy required to promote a valence electron bound to an atom to become a conduction electron, which is free to move within the semiconductor material and serve as a charge carrier to conduct electric current.

For the purposes of this description, the term "group IV semiconductor material" includes silicon carbide, and alloy group IV semiconductor materials, such as silicon-silicon carbide, or silicon-germanium-silicon carbide, which have a bandgap energy greater than silicon.

Similarly, the term "III-V semiconductor material" is understood to refer to semiconductor material in which group III elements, that is, boron, aluminum, gallium, and indium, provide a portion of the atoms in the III-V semiconductor material, and group V elements, that is, nitrogen, phosphorus, arsenic, and antimony, provide another portion of the atoms in the III-V semiconductor material. Some III-V semiconductor materials may include essentially one element from group III and one element from group V, such as gallium nitride, gallium phosphide, gallium arsenide, and aluminum nitride. Other III-V semiconductor materials, alloy III-V semiconductors, may include two or more elements from group III or two or more elements from group V, such as aluminum gallium nitride and indium aluminum gallium nitride.

Similarly, the term "II-VI semiconductor material" is understood to refer to semiconductor material in which group II elements, that is, zinc and cadmium, provide a portion of the atoms in the II-VI semiconductor material, and group VI elements, that is, oxygen, sulfur, selenium, and tellurium, provide another portion of the atoms in the II-VI semiconductor material. Some II-VI semiconductor materials may include essentially one element from group II and one element from group VI, such as zinc sulfide, cadmium sulfide, zinc oxide, zinc selenide, and cadmium telluride. Other II-VI semiconductor materials, alloy II-VI semiconductor, may include two or more elements from group II or two or more elements from group VI, such as cadmium zinc telluride.

Compositions of alloy WBG semiconductor materials may be selected to provide at least two or more desired values for the following parameters: bandgap energy, electric field breakdown strength, lattice constant, and epitaxial growth factors such as vapor pressure of precursors and growth temperature. Alloy WBG semiconductor materials may provide more process latitude and higher yield than stoichiometric WBG semiconductor materials.

FIG. 1 is a cross section of an example microelectronic device having a hybrid component with a WBG structure that includes metal silicide between a WBG semiconductor material and silicon semiconductor material. The microelectronic device 100 may be manifested as a discrete semiconductor device, an integrated circuit, a microelectrical mechanical system (MEMS) device, an electro-optical device, or a microfluidic device, by way of example. The hybrid component 102 of this example is described as an LDMOS transistor. Other manifestations of the hybrid component 102 are within the scope of this example.

The microelectronic device 100 includes a substrate 104 that has silicon semiconductor material 106, referred to herein as the silicon 106. The substrate 104 may be, for example, part of a bulk semiconductor wafer, part of a semiconductor wafer with an epitaxial layer, part of a silicon-on-insulator (SOI) wafer, or other structure suitable for forming the microelectronic device 100.

The substrate 104 may include an optional n-type buried layer (NBL) 108 on a portion of a base wafer 110. The base wafer 110 may be p-type with an average dopant concentration of $1 \times 10^{17}$ atoms/cm$^3$ to $1 \times 10^{19}$ atoms/cm$^3$, for example. Alternatively, the base wafer 110 may be lightly doped, with an average dopant concentration below $1 \times 10^{16}$. The NBL 108 may be 2 microns to 10 microns thick, by way of example, and may have an average dopant concentration of $1 \times 10^{16}$ atoms/cm$^3$ to $1 \times 10^{17}$ atoms/cm$^3$. The substrate 104 may include an epitaxial layer 112 of silicon on the NBL 108. The epitaxial layer 112 is part of the silicon 106, and may be 2 microns to 12 microns thick, for example. The epitaxial layer 112 may be p-type, with an average dopant concentration of $1 \times 10^{15}$ atoms/cm$^3$ to $1 \times 10^{16}$ atoms/cm$^3$, by way of example. In versions of this example in which the substrate 104 lacks the NBL 108, the epitaxial layer 112 may be directly on the base wafer 110. The substrate 104 may also include an optional blanket p-type buried layer (PBL) 114 in the epitaxial layer 112. The PBL 114 may be 1 micron to 5 microns thick, and may have an average dopant concentration of $1 \times 10^{15}$ atoms/cm$^3$ to $3 \times 10^{17}$ atoms/cm$^3$, by way of example.

The microelectronic device 100 of this example includes a field relief dielectric layer 116 at a top surface 118 of the silicon 106, extending from a subsequently-formed gate dielectric layer 124 partway over a subsequently-formed n-type drift region 120. The field relief dielectric layer 116 may have a local oxidation of silicon (LOCOS) structure, with tapered edges, as depicted in FIG. 1, referred to as bird's beaks. Alternatively, the field relief dielectric layer 116 may have a shallow trench isolation (STI) structure in which the field relief dielectric layer 116 is in a trench in the silicon 106.

The hybrid component 102 of this example includes the n-type drift region 120 in the silicon 106. The n-type drift region 120 extends partway under the field relief dielectric layer 116. The n-type drift region 120 may have an average dopant concentration of $4 \times 10^{16}$ atoms/cm$^3$ to $1 \times 10^{18}$ atoms/cm$^3$, by way of example.

The hybrid component 102 of this example may include a patterned PBL 122 in the epitaxial layer 112, under a subsequently-formed p-type body well 128. In this example, the patterned PBL 122 may be located from 1 micron to 3 microns below the top surface 118 of the silicon 106, and may have a thickness of 2 microns to 5 microns, by way of example. The patterned PBL 122 may have an average dopant concentration of $5 \times 10^{15}$ atoms/cm$^3$ to $2 \times 10^{16}$ atoms/cm$^3$, by way of example.

The hybrid component 102 of this example includes a gate dielectric layer 124 on the top surface 118 of the silicon 106, extending from the field relief dielectric layer 116 partway over subsequently-formed p-type body well 128. The gate dielectric layer 124 may be 1.5 nanometers to 30 nanometers thick, by way of example. The gate dielectric layer 124 may include primarily silicon dioxide, and may include 5 atomic percent to 10 atomic percent nitrogen atoms to improve reliability. The gate dielectric layer 124 may also include high-k dielectric material, such as hafnium oxide or zirconium oxide. The gate dielectric layer 124 may have a thickness appropriate for an operating voltage of the hybrid component 102.

The hybrid component 102 of this example includes a gate electrode 126 on the gate dielectric layer 124 and extending partway over the field relief dielectric layer 116. The gate electrode 126 may include polycrystalline silicon, commonly referred to as polysilicon, with n-type dopants such as phosphorus, arsenic, and antimony. Alternatively, the gate electrode 126 may include metal silicide extending down to the gate dielectric layer 124, in a gate architecture referred to as a fully silicided (FUSI) gate. In a further option, the gate electrode 126 may include one or more metals such as titanium, titanium nitride, tantalum, or tantalum nitride. The gate electrode 126 may be 100 nanometers to 500 nanometers thick, by way of example.

The hybrid component 102 of this example includes the p-type body well 128 in the silicon 106. The p-type body well 128 extends partway under the gate electrode 126, proximate to the n-type drift region 120. The p-type body well 128 may extend to a depth of 1 micron to 3 microns, for example, and may optionally abut a top portion of the patterned PBL 122. The p-type body well 128 may have an average dopant concentration of $5 \times 10^{17}$ atoms/cm$^3$ to $5 \times 10^{18}$ atoms/cm$^3$, by way of example. The dopant concentration in the p-type body well 128 at the top surface 118 of the silicon 106 under the gate dielectric layer 124 affects a threshold potential of the hybrid component 102 of this example.

The hybrid component 102 of this example further includes a shallow n-type well 130 in the silicon 106, surrounded by the p-type body well 128. The shallow n-type well 130 extends in the silicon 106 proximate to an edge of the gate electrode 126, opposite from the n-type drift region 120. The shallow n-type well 130 may have an average dopant concentration of $1 \times 10^{19}$ atoms/cm$^3$ to $5 \times 10^{19}$ atoms/cm$^3$, by way of example.

The hybrid component 102 of this example may include sidewall spacers 132 on lateral surfaces of the gate electrode 126. In this context, lateral surfaces are sides of the gate electrode 126 that are generally perpendicular to the top surface 118 of the silicon 106 under the gate electrode 126. The sidewall spacers 132 include dielectric material, such as silicon dioxide and silicon nitride. The sidewall spacers 132 may extend 100 nanometers to 500 nanometers from the lateral surfaces of the gate electrode 126.

The hybrid component 102 of this example includes an n-type source contact region 134 in the silicon 106, adjacent to the sidewall spacers 132, opposite from the n-type drift region 120. The n-type source contact region 134 may partially overlap the shallow n-type well 130. The n-type source contact region 134 may have an average dopant concentration of $5 \times 10^{19}$ atoms/cm$^3$ to $5 \times 10^{20}$ atoms/cm$^3$, by way of example.

The hybrid component 102 of this example includes metal silicide 136 on the silicon 106 on the n-type source contact region 134, and on the n-type drift region 120 where exposed by the field relief dielectric layer 116. The hybrid component 102 may further include the metal silicide 136 on the gate electrode 126, in versions of this example in which the gate electrode 126 includes polysilicon. The metal silicide 136 includes silicon and a metal, such as platinum, tungsten, titanium, cobalt, nickel, chromium, or molybdenum. The metal silicide 136 may be 10 nanometers to 50 nanometers thick, by way of example. The metal silicide 136 on the n-type drift region 120 may advantageously provide a catalytic nucleation surface for subsequent formation of WBG semiconductor material.

The hybrid component 102 of this example includes a pre-metal dielectric (PMD) liner 138 formed over the microelectronic device 100. The PMD liner 138 may include one or more layers of silicon nitride, silicon dioxide, or silicon oxynitride. The PMD liner 138 may be 10 nanometers to 100 nanometers thick, for example.

The hybrid component 102 of this example includes a source-connected field plate 140 over the PMD liner 138. The source-connected field plate 140 extends over the gate electrode 126 and partway over the n-type drift region 120. The hybrid component 102 may optionally include a field plate isolation layer of dielectric material between the source-connected field plate 140 and the PMD liner 138, to enable the n-type drift region 120 to be biased to a higher potential during operation of the microelectronic device 100. The source-connected field plate 140 may include metal, polysilicon, or other conductive material. The source-connected field plate 140 is connected to the n-type source contact region 134.

The microelectronic device 100 includes a PMD layer 142 over the PMD liner 138 and the source-connected field plate 140. The PMD layer 142 is non-conductive, and may include one or more sublayers of dielectric material. By way of example, the PMD layer 142 may include a planarized layer of silicon dioxide, phosphosilicate glass (PSG), fluorinated silicate glass (FSG), or borophosphosilicate glass (BPSG), on the PMD liner 138 and the source-connected field plate 140. The PMD layer 142 may further include a PMD cap layer, not explicitly shown, of silicon nitride, silicon carbide, or silicon carbonitride, suitable for an etch-stop layer of a metal CMP stop layer, on the planarized layer. Other layer structures and compositions for the PMD layer 142 are within the scope of this example.

The hybrid component 102 includes a WBG semiconductor material 144 on the metal silicide 136 over the n-type drift region 120. The WBG semiconductor material 144 is in a WBG opening 146 through the PMD layer 142 and the PMD liner 138. The WBG semiconductor material 144 may include a uniform composition, or may include sublayers with varying composition. The WBG semiconductor material 144 may include any of the WBG semiconductor materials disclosed herein. The WBG semiconductor material 144 on the metal silicide 136 provides a WBG structure 148 of the hybrid component 102. The WBG structure 148 is on the silicon 106. The WBG semiconductor material 144 has a lateral dimension adjacent to the silicon 106 that is no greater than 10 times a thickness of the WBG semiconductor material 144 in at least one lateral direction. In this context, lateral refers to a direction parallel to a planar portion of the top surface adjacent to the WBG opening 146.

Additional dielectric material may be formed over the WBG semiconductor material 144 as part of the PMD layer 142, to provide a planar top surface of the PMD layer 142, as indicated in FIG. 1. Having the top surface of the PMD layer 142 to be planar may facilitate formation of an electrical connection to a top of the WBG semiconductor material 144.

The microelectronic device 100 includes contacts 150 through the PMD layer 142 and the PMD liner 138, onto the metal silicide 136 on the n-type source contact region 134, the source-connected field plate 140, and the WBG semiconductor material 144. The contacts 150 are conductive, and provide electrical connections to the n-type source contact region 134, the source-connected field plate 140, and the WBG semiconductor material 144.

The contacts 150 may include a titanium adhesion layer, not explicitly shown, contacting the PMD layer 142, the n-type source contact region 134, the source-connected field plate 140, and the WBG semiconductor material 144, with a titanium nitride diffusion barrier, not explicitly shown, on the titanium adhesion layer, and a tungsten core, not explicitly shown, on the titanium nitride diffusion barrier. Alternatively, the contacts 150 may have a uniform composition of tungsten. Other compositions and structures for the contacts 150 are within the scope of this example.

The microelectronic device 100 includes interconnects 156 on the contacts 150. In some versions of this example, at least one of the interconnects 156 is part of an electrical connection between the n-type source contact region 134 and the source-connected field plate 140, as depicted in FIG. 1. Another of the interconnects 156 provides an electrical connection to the WBG semiconductor material 144 through one or more of the contacts 150. The interconnects 156 are conductive. In one version of this example, the interconnects 156 may have an etched aluminum structure, and may include an adhesion layer, not explicitly shown, of titanium nitride or titanium tungsten, on the PMD layer 142, an aluminum layer, not explicitly shown, with a few atomic percent of silicon, titanium, or copper, on the adhesion layer, and an anti-reflection layer, not explicitly shown, of titanium nitride on the aluminum layer. In another version of this example, the interconnects 156 may have a damascene structure, and may include a barrier liner of tantalum and tantalum nitride, or a barrier liner of cobalt, in an interconnect trench in an intra-metal dielectric (IMD) layer, not explicitly shown, on the PMD layer 142, with a copper fill metal in the interconnect trench on the barrier liner. In further version of this example, the interconnects 156 may have a plated structure, and may include an adhesion layer, not explicitly shown, on the PMD layer 142 and the contacts 150, with copper interconnects on the adhesion layer. In yet another version, the interconnects 156 may include primarily cobalt. Other structures and compositions for the interconnects 156 are within the scope of this example.

A combination of at least the n-type source contact region 134, the shallow n-type well 130, the p-type body well 128, and the n-type drift region 120 provide a silicon portion 158 of the hybrid component 102. The metal silicide 136 on the n-type source contact region 134 combined with the contact 150 on the metal silicide 136 on the n-type source contact region 134 provides a first current terminal 152 of the hybrid component 102. The first current terminal 152 is on the silicon portion 158 of the hybrid component 102. The contact 150 on the WBG structure 148 provides a second current terminal 154 of the hybrid component 102. The hybrid component 102 is configured to have current flow between the first current terminal 152 and the second current terminal 154, directly between the silicon portion 158 and the WBG structure 148.

During operation of the microelectronic device 100, the gate electrode 126 may be biased above threshold, so that the hybrid component 102 is in an on state, in which case current may flow between the first current terminal 152 and the second current terminal 154, through the silicon portion 158 and the WBG structure 148. Furthermore, during operation of the microelectronic device 100, the gate electrode 126 may be biased below threshold, so that the hybrid component 102 is in an off state. While the hybrid component 102 is in the off state, the second current terminal 154 of the hybrid component 102 may be biased at a high potential, for example, 30 volts to 1000 volts, with respect to the first current terminal 152. The WBG semiconductor material 144 may be depleted and thereby accommodate a significant portion of the potential difference between the second current terminal 154 and the first current terminal 152, so that the silicon 106 in the n-type drift region 120 does not break down. The hybrid component 102 may advantageously have a smaller area compared to an all-silicon component operating at the same potential difference. In one version of this example, the hybrid component 102 of this example may advantageously provide a normally-off switch capable of handling operating potential of 30 volts to 1000 volts in a smaller package than multi-chip modules having a discrete depletion-mode gallium nitride transistor and an enhancement mode silicon transistor. In another version of this example, in which the substrate 104 is an SOI substrate, the WBG semiconductor material 144 may include a light-emitting diode (LED) structure, thus advantageously providing an area-efficient and low cost integration for a micro-LED display.

Figure 2:
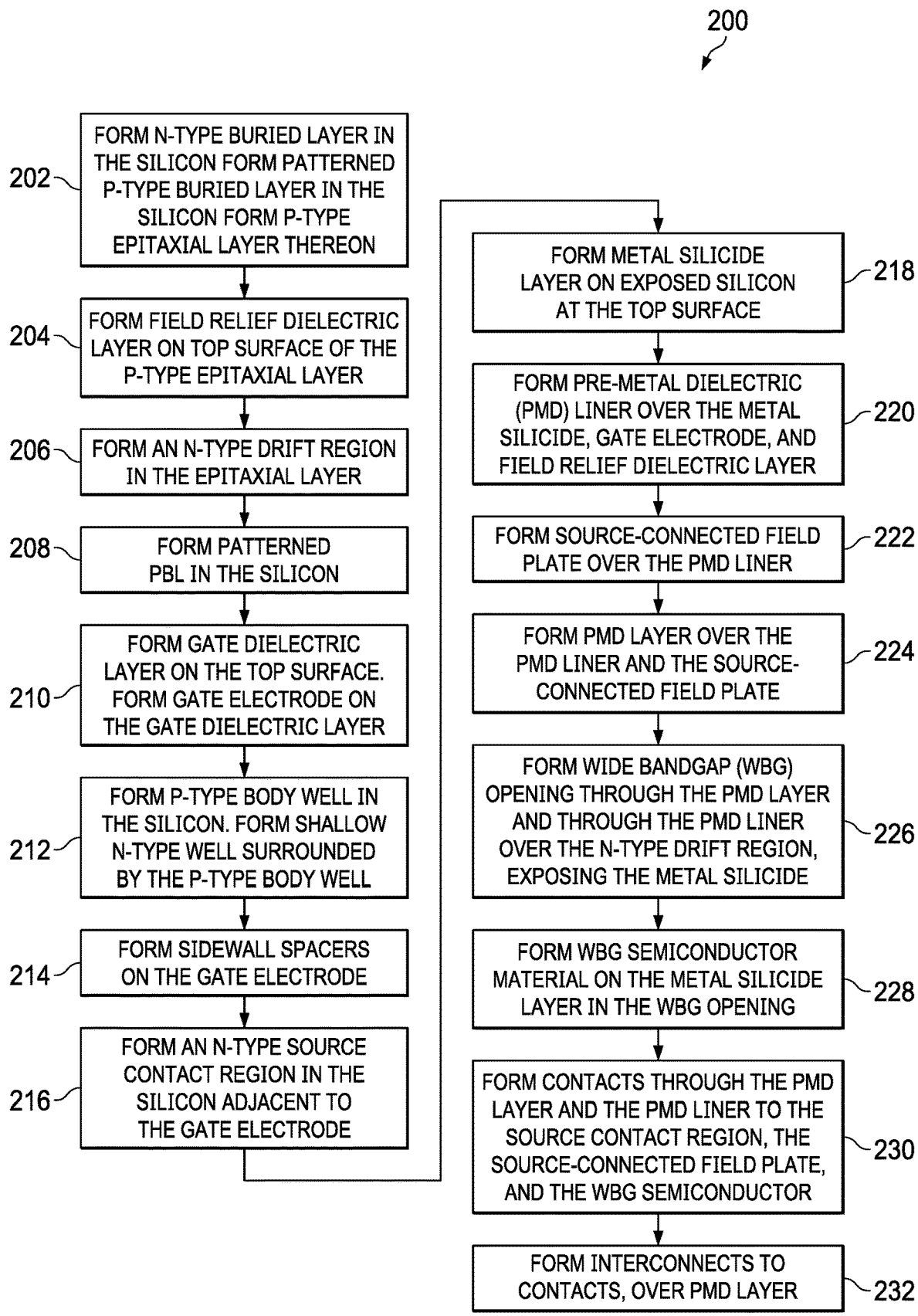
FIG. 2 presents a flowchart of an example method of forming the microelectronic device of FIG. 1.

FIG. 2 presents a flowchart of an example method of forming the microelectronic device 100 of FIG. 1. Structural elements referred to in the steps of the method 200 are shown in FIG. 1. The method 200 includes step 202, which may include optionally forming the NBL 108 on the base wafer 110. The NBL 108 may be formed by forming a hard mask, not explicitly shown, over the base wafer 110 that exposes the base wafer 110 in an area for the NBL 108. N-type dopants, such as antimony and optionally some arsenic, are implanted into the base wafer 110 at a dose of $5\times10^{14}$ ions/cm$^2$ to $3\times10^{15}$ ions/cm$^2$, where exposed by the hard mask. The substrate 104 is heated to diffuse and activate the implanted n-type dopants to form the NBL 108.

Step 202 may include optionally forming the PBL 114 in the silicon 106. The PBL 114 may be formed by implanting boron into the silicon 106 at a dose of $1 \times 10^{14}$ ions/cm$^2$ to $1 \times 10^{15}$ ions/cm$^2$, followed by heating the substrate 104 to activate the implanted boron.

Step 202 includes forming the epitaxial layer 112 on the NBL 108. The epitaxial layer 112 may be formed by an epitaxial process after the NBL 108 is formed. The n-type dopants of the NBL 108 and the p-type dopants of the PBL 114 may diffuse into the epitaxial layer 112 during the epitaxial process. In versions of this example in which the substrate 104 lacks the NBL 108 or the PBL 114, the epitaxial layer 112 may be formed on the base wafer 110.

The method 200 continues with step 204, which includes forming the field relief dielectric layer 116 at the top surface 118 of the silicon 106. The field relief dielectric layer 116 may be formed by a LOCOS process, which includes forming a layer of thermal oxide at the top surface 118, and forming a patterned layer of silicon nitride on the thermal oxide. The field relief dielectric layer 116 is formed by thermal oxidation in areas exposed by the patterned layer of silicon nitride. The patterned layer of silicon nitride is subsequently removed. Alternatively, the field relief dielectric layer 116 may be formed by an STI process, which includes forming a trench in the silicon 106, and filling the trench with silicon dioxide by a sequence of thermal oxidation and chemical vapor deposition (CVD) processes. The silicon dioxide is removed outside the trench by a chemical mechanical polish (CMP) process.

The method 200 continues with step 206, which includes forming the n-type drift region 120 in the silicon 106. The n-type drift region 120 may be formed by forming an implant mask, not explicitly shown, over the top surface 118 that exposes the epitaxial layer 112 in an area for the n-type drift region 120, and implanting n-type dopants, such as phosphorus, into the silicon 106 where exposed by the implant mask. The n-type dopants for the n-type drift region 120 may be implanted in multiple steps at a total dose of $4 \times 10^{12}$ ions/cm$^2$ to $1 \times 10^{13}$ ions/cm$^2$. Subsequently, the substrate 104 is heated to diffuse and activate the implanted n-type dopants.

The method 200 continues with step 208, which includes forming the patterned PBL 122 in the epitaxial layer 112. The patterned PBL 122 may be formed by forming an implant mask, not explicitly shown, over the top surface 118 that exposes the epitaxial layer 112 in an area for the patterned PBL 122, and implanting boron, into the silicon 106 where exposed by the implant mask. The boron for the patterned PBL 122 may be implanted with an energy of 1000 kilo-electron volts (keV) to 1500 keV, at a total dose of $2 \times 10^{12}$ ions/cm$^2$ to $5 \times 10^{12}$ ions/cm$^2$. Subsequently, the substrate 104 is heated to diffuse and activate the implanted boron.

The method 200 continues with step 210, which includes forming the gate dielectric layer 124 on the top surface 118 of the silicon 106. Silicon dioxide in the gate dielectric layer 124 may be formed by thermal oxidation in an ambient containing oxygen and nitrogen. Nitrogen may be introduced into the gate dielectric layer 124 by exposure to nitrogen radicals in decoupled plasma nitridation process or a remote plasma nitridation process, followed by an anneal process. High-k dielectric material, such as hafnium oxide or zirconium oxide, may be formed in the gate dielectric layer 124 by a sputter process, an atomic layer deposition (ALD) process, or a metalorganic chemical vapor deposition (MOCVD) process.

Step 210 further includes forming the gate electrode 126 on the gate dielectric layer 124. Polysilicon in the gate electrode 126 may be formed by a plasma-enhanced chemical vapor deposition (PECVD) process using silane or disilane, followed by a reactive ion etch (RIE) process using an etch mask. A FUSI version of the gate electrode 126 may be formed by forming polysilicon on the gate dielectric layer 124, patterning the polysilicon, and forming a layer of metal such as titanium on the polysilicon. The layer of metal and the polysilicon are heated to form metal silicide that extends to the gate dielectric layer 124. A metal version of the gate electrode 126 may be formed by a metal replacement gate process, in which patterned polysilicon is surrounded by dielectric material and removed by etching to form a gate cavity, exposing the gate dielectric layer 124. The one or more metals are formed on the gate dielectric layer 124 in the gate cavity.

The method 200 continues with step 212, which includes forming the p-type body well 128 in the silicon 106 adjacent to the gate electrode 126, opposite from the n-type drift region 120, and forming the shallow n-type well 130 in the p-type body well 128. The p-type body well 128 and the shallow n-type well 130 may be formed using an implant mask, not explicitly shown, and implanting boron for the p-type body well 128 and implanting arsenic or antimony for the shallow n-type well 130 into the epitaxial layer 112 where exposed by the implant mask. The boron may be implanted at a dose of $8 \times 10^{13}$ ions/cm$^2$ to $3 \times 10^{14}$ ions/cm$^2$, by way of example. The arsenic or antimony may be implanted at a dose of $1 \times 10^{14}$ ions/cm$^2$ to $5 \times 10^{14}$ ions/cm$^2$, by way of example. After the boron and arsenic or antimony are implanted, the substrate 104 is heated to diffuse and activate the implanted boron and arsenic or antimony. In another version of this example, the p-type body well 128 and the shallow n-type well 130 may be formed before forming the gate electrode 126.

The method 200 continues with step 214, which includes forming the sidewall spacers 132 on the gate electrode 126. The sidewall spacers 132 may be formed by forming one or more conformal layers of dielectric material over the gate electrode 126. The dielectric material is subsequently removed from horizontal surfaces, that is, surfaces generally parallel to the top surface 118 of the silicon 106, by an anisotropic etch process such as an RIE process, leaving the dielectric material on the lateral surfaces of the gate electrode 126.

The method 200 continues with step 216, which includes forming the n-type source contact region 134 in the silicon 106. The n-type source contact region 134 may be formed using an implant mask, not explicitly shown, which exposes the silicon 106 in an area for the n-type source contact region 134. N-type dopants, such as phosphorus and arsenic, are implanted into the silicon 106 where exposed by the implant mask. The phosphorus and arsenic may be implanted at a total dose of $1 \times 10^{15}$ ions/cm$^2$ to $1 \times 10^{16}$ ions/cm$^2$, by way of example. After the phosphorus and arsenic are implanted, the substrate 104 is heated, for example by a rapid thermal process (RTP) tool, to activate the implanted phosphorus and arsenic.

The method 200 continues with step 218, which includes forming the metal silicide 136 on the silicon 106, and optionally on polysilicon in the gate electrode 126. The metal silicide 136 may be formed by forming a layer of metal on the microelectronic device 100, contacting the silicon 106 at the top surface 118, and contacting the gate electrode 126. The layer of metal may include platinum, tungsten, titanium, cobalt, nickel, chromium, or molybdenum, by way of example. A cap layer of titanium nitride or tantalum nitride may be formed over the layer of metal. Subsequently, the microelectronic device 100 is heated to react the layer of metal with the silicon 106, and the polysilicon, to form the metal silicide 136. Unreacted metal is removed from the microelectronic device 100, leaving the metal silicide 136 in place. The unreacted metal may be removed by a wet etch process using an aqueous mixture of sulfuric acid and hydrogen peroxide, or an aqueous mixture of nitric acid and hydrochloric acid, by way of example. The metal silicide 136 may provide electrical connections to the n-type source contact region 134, the n-type drift region 120, and the gate electrode 126 with lower resistances compared to a similar microelectronic device without metal silicide.

The method 200 continues with step 220, which includes forming the PMD liner 138 over the microelectronic device 100. The PMD liner 138 may be formed in one or more sublayers by one or more CVD processes. A silicon nitride sublayer may be formed by a low pressure chemical vapor deposition (LPCVD) process using dichlorosilane and ammonia, or by a PECVD process using bis(tertiary-butyl-amino)silane (BTBAS). A silicon dioxide sublayer may be formed by a PECVD process using tetraethyl orthosilicate (TEOS), formally named tetraethoxysilane. A silicon oxynitride sublayer may be formed by a PECVD process using BTBAS and TEOS.

The method 200 continues with step 222, which includes forming the source-connected field plate 140 over the PMD liner 138. The field plate isolation layer may optionally be formed over the PMD liner 138, by a PECVD process using TEOS, for example. The field plate isolation layer may be formed by forming a layer of conductive material over the PMD liner 138, and over the field plate isolation layer, if present. The layer of conductive material may be patterned by an etch process where exposed by an etch mask, not explicitly shown.

The method 200 continues with step 224, which includes forming the PMD layer 142 over the PMD liner 138 and the source-connected field plate 140. The PMD layer 142 may be formed by one or more dielectric deposition processes, including a PECVD process using TEOS, a high density plasma (HDP) process, or a high aspect ratio process (HARP) using TEOS and ozone, by way of example. The PMD layer 142 may be planarized by an oxide CMP process.

The method 200 continues with step 226, which includes forming the WBG opening 146 through the PMD layer 142 and the PMD liner 138. The WBG opening 146 through the PMD layer 142 may be formed by an RIE process using ions and fluorine radicals, which may provide straight sidewalls through the PMD layer 142. The RIE process may be terminated while there is at least a portion of the PMD liner remaining over the metal silicide 136, advantageously preventing ion damage to the metal silicide 136. The WBG opening 146 through the PMD liner 138 may be formed by a remote plasma process, which may provide a desired etch selectivity to the metal silicide. The WBG opening 146 through the PMD liner 138 may be formed by a downstream plasma or an inductively coupled plasma (ICP) process that provides fluorine radicals and controlled energies for ions such as argon ions, which may provide a desired balance between sidewall profile and etch selectivity. Other methods of forming the WBG opening 146 are within the scope of this step 226.

The method 200 continues with step 228, which includes forming the WBG semiconductor material 144 on the metal silicide 136 in the WBG opening 146. In one version of the method 200, the WBG semiconductor material 144 may be formed by an epitaxial process. The epitaxial process may include, for example, MOCVD epitaxy, atomic layer epitaxy, atomic layer deposition with layer-by-layer anneal, molecular beam epitaxy (MBE), or plasma assisted MBE. In another version, the WBG semiconductor material 144 may be formed by forming polycrystalline or amorphous WBG material on the metal silicide 136 in the WBG opening 146, followed by heating the WBG material to recrystallize the WBG material, forming the WBG semiconductor material 144. In a further version, in which the WBG semiconductor material 144 includes perovskite semiconductor material, the WBG semiconductor material 144 may be formed by depositing a sol-gel precursor for the perovskite semiconductor material, for example by a spin coat process, followed by heating the sol-gel precursor to remove volatile material and crystallize the perovskite semiconductor material. Alternatively, the perovskite semiconductor material may be formed by an MOCVD process. Having the WBG semiconductor material 144 with a lateral dimension adjacent to the silicon 106 that is no greater than 10 times a thickness of the WBG semiconductor material 144 in at least one lateral direction may advantageously facilitate forming the WBG semiconductor material 144 in a monocrystalline state, due to limited buildup of lattice mismatch over the lateral dimension.

The method 200 continues with step 230, which includes forming the contacts 150 through the PMD layer 142 and the PMD liner 138. The contacts 150 may be formed by etching contact holes through the PMD layer 142 and the PMD liner 138 to expose the metal silicide 136, the source-connected field plate 140, and the WBG semiconductor material 144. In one version of step 230, the contacts 150 may be formed by sputtering titanium to form the titanium adhesion layer, followed by forming the titanium nitride diffusion barrier using reactive sputtering or an ALD process. The tungsten core may be formed by an MOCVD process using tungsten hexafluoride ($WF_6$) reduced by silane initially and hydrogen after a layer of tungsten is formed on the titanium nitride diffusion barrier. The tungsten, titanium nitride, and titanium is subsequently removed from a top surface of the PMD layer 142 by an etch process, a tungsten CMP process, or a combination of both, leaving the contacts 150 extending to the top surface of the PMD layer 142. In another version of step 230, the contacts 150 may be formed by a selective tungsten deposition process which fills the contact holes with tungsten from the bottom up, forming the contacts 150 with a uniform composition of tungsten. Other methods of forming the contacts 150 are within the scope of this step 230.

The method 200 continues with step 232, which includes forming the interconnects 156 on the contacts 150. In versions of this example in which the interconnects 156 have an etched aluminum structure, the interconnects 156 may be formed by an etched aluminum process, which includes depositing the adhesion layer, the aluminum layer, and the anti-reflection layer, and forming an etch mask, not explicitly shown, followed by an RIE process to etch the anti-reflection layer, the aluminum layer, and the adhesion layer where exposed by the etch mask, and subsequently removing the etch mask.

In versions of this example in which the interconnects 156 have a damascene structure, the interconnects 156 may be formed by a damascene process, which includes forming the IMD layer on the PMD layer 142, and etching the interconnect trenches through the IMD layer to expose the contacts 150. The barrier liner may be formed by sputtering tantalum onto the IMD layer and exposed PMD layer 142 and contacts 150, and forming tantalum nitride on the sputtered tantalum by an ALD process. The copper fill metal may be formed by sputtering a seed layer, not explicitly shown, of copper on the barrier liner, and electroplating copper on the seed layer to fill the interconnect trenches. Copper and barrier liner metal is subsequently removed from a top surface of the IMD layer by a copper CMP process.

In versions of this example in which the interconnects 156 have a plated structure, the interconnects 156 may be formed by a plated interconnect process, which includes sputtering the adhesion layer, containing titanium, on the PMD layer 142 and contacts 150, followed by sputtering a seed layer, not explicitly shown, of copper on the adhesion layer. A plating mask is formed on the seed layer that exposes areas for the interconnects 156. The copper interconnects are formed by electroplating copper on the seed layer where exposed by the plating mask. The plating mask is removed, and the seed layer and the adhesion layer are removed by wet etching between the interconnects.

Figure 3:
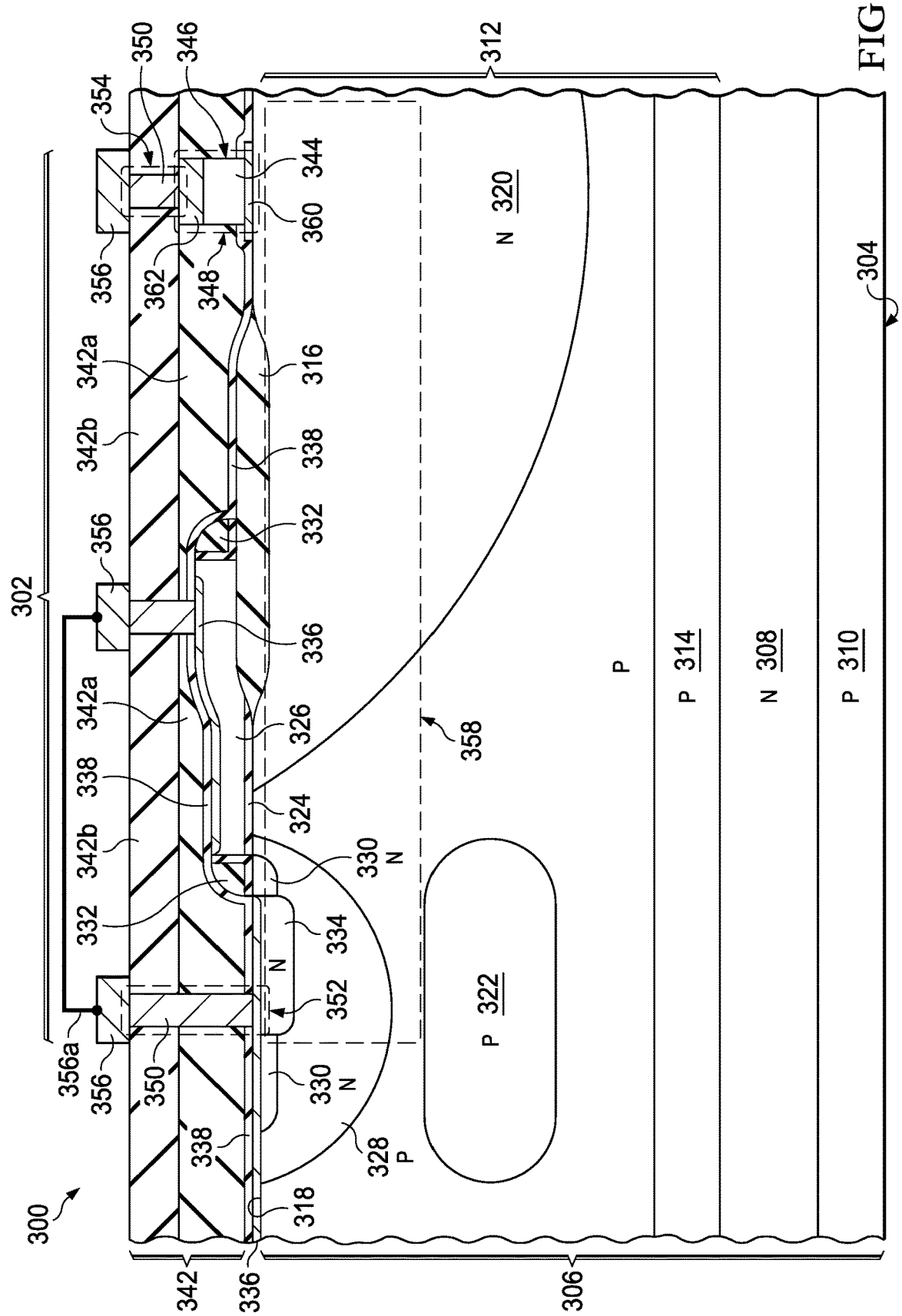
FIG. 3 is a cross section of an example microelectronic device having a hybrid component with a WBG structure with an interface layer between a WBG semiconductor material and silicon semiconductor material, and a WBG contact layer on the WBG semiconductor material.

FIG. 3 is a cross section of an example microelectronic device having a hybrid component with a WBG structure with an interface layer between a WBG semiconductor material and silicon semiconductor material, and a WBG contact layer on the WBG semiconductor material. The microelectronic device 300 may be manifested as any of the device types disclosed in reference to the microelectronic device 100 of FIG. 1. The hybrid component 302 of this example is described as an LDMOS transistor. Other manifestations of the hybrid component 302 are within the scope of this example. The microelectronic device 300 includes a substrate 304 that has silicon semiconductor material 306, referred to herein as the silicon 306. The substrate 304 may be manifested as any of the substrate types disclosed in reference to the substrate 104 of FIG. 1.

The substrate 304 may include an optional NBL 308 on a portion of a base wafer 310. The substrate 304 may include an epitaxial layer 312 of silicon on the NBL 308. In versions of this example in which the substrate 304 lacks the NBL 308, the epitaxial layer 312 may be directly on the base wafer 310. The substrate 304 may also include an optional blanket PBL 314 in the epitaxial layer 312. The optional NBL 308, the base wafer 310, the epitaxial layer 312, and the optional blanket PBL 314 may have the dimensions and dopant concentrations disclosed in reference to the NBL 108, the base wafer 110, the epitaxial layer 112, and the PBL 114 of FIG. 1.

The microelectronic device 300 of this example includes a field relief dielectric layer 316 at a top surface 318 of the silicon 306, extending from a subsequently-formed gate dielectric layer 324 partway over a subsequently-formed n-type drift region 320. The field relief dielectric layer 316 may have the structure and composition disclosed in reference to the field relief dielectric layer 116 of FIG. 1.

The hybrid component 302 of this example includes the n-type drift region 320 in the silicon 306, extending partway under the field relief dielectric layer 316. The hybrid component 302 of this example may include a patterned PBL 322 in the epitaxial layer 312, under a subsequently-formed p-type body well 328. The hybrid component 302 of this example includes a gate dielectric layer 324 on the top surface 318 of the silicon 306, extending from the field relief dielectric layer 316 partway over subsequently-formed p-type body well 328. The hybrid component 302 of this example includes a gate electrode 326 on the gate dielectric layer 324 and extending partway over the field relief dielectric layer 316. The hybrid component 302 of this example includes the p-type body well 328 in the silicon 306. The p-type body well 328 extends partway under the gate electrode 326, proximate to the n-type drift region 320. The hybrid component 302 of this example further includes a shallow n-type well 330 in the silicon 306, surrounded by the p-type body well 328, extending in the silicon 306 proximate to an edge of the gate electrode 326, opposite from the n-type drift region 320. The hybrid component 302 of this example may include sidewall spacers 332 on lateral surfaces of the gate electrode 326. The hybrid component 302 of this example includes an n-type source contact region 334 in the silicon 306, adjacent to the sidewall spacers 332, opposite from the n-type drift region 320. The n-type drift region 320, the patterned PBL 322, the gate dielectric layer 324, the gate electrode 326, the p-type body well 328, the shallow n-type well 330, the sidewall spacers 332, and the n-type source contact region 334 may have the properties, dimensions, compositions, and dopant concentrations disclosed in reference to the corresponding elements of FIG. 1.

The hybrid component 302 of this example may include metal silicide 336 on the silicon 306 on the n-type source contact region 334. The n-type drift region 320 of this example is free of the metal silicide 336. The hybrid component 302 may further include the metal silicide 336 on the gate electrode 326. The metal silicide 336 may have any of the compositions disclosed in reference to the metal silicide 136 of FIG. 1.

The hybrid component 302 of this example includes an interface layer 360 on the n-type drift region 320, in an area for a subsequently-formed WBG semiconductor material 344. The interface layer 360 may include one or more refractory metals, one or more metals of the platinum group, one or more two-dimensional materials, or one or more rare earth metals, and may include a cap layer of gold, to enhance nucleation of the subsequently-formed WBG semiconductor material 344. The interface layer 360 may be a monolayer or two monolayers thick, or may have a thickness up to a few nanometers.

The microelectronic device 300 includes a PMD liner 338 formed over the substrate 304. The PMD liner 338 may have the structure and composition disclosed in reference to the PMD liner 138 of FIG. 1.

The microelectronic device 300 includes a PMD layer 342 over the PMD liner 338. The PMD layer 342 of this example includes a first PMD sublayer 342a on the PMD liner 338, and a second PMD sublayer 342b on the first PMD sublayer 342a. Each of the first PMD sublayer 342a and the second PMD sublayer 342b is non-conductive, and may include one or more sublayers of dielectric material, such as the materials disclosed in reference to the PMD layer 142 of FIG. 1.

The hybrid component 302 includes a WBG semiconductor material 344 on the interface layer 360 over the n-type drift region 320. The WBG semiconductor material 344 is in a WBG opening 346 through the first PMD sublayer 342a and the PMD liner 338. The WBG semiconductor material 344 may have any of the compositions and structures discussed in reference to the WBG semiconductor material 144 of FIG. 1. The hybrid component 302 of this example may include a WBG contact layer 362 on the WBG semiconductor material 344, to provide a low resistance connection to the WBG semiconductor material 344. The WBG contact layer 362 is located on an opposite end of the WBG semiconductor material 344 from the silicon 306. The WBG contact layer 362 may include metal or metal silicide, for example. The WBG contact layer 362 may be 1 nanometer to 100 nanometers thick, by way of example. A combination of the WBG contact layer 362, WBG semiconductor material 344, and the interface layer 360 provide a WBG structure 348 of the hybrid component 302. The WBG structure 348 is on the silicon 306. The WBG semiconductor material 344 has a lateral dimension adjacent to the silicon 306 that is no greater than 10 times a thickness of the WBG semiconductor material 344 in at least one lateral direction. In this example, the second PMD sublayer 342b covers the WBG structure 348.

The microelectronic device 300 includes contacts 350 through the second PMD sublayer 342b, the first PMD sublayer 342a, and the PMD liner 338. The contacts 350 are conductive, and provide electrical connections to the metal silicide 336 on the n-type source contact region 334, the gate electrode 326, and the WBG contact layer 362. The contacts 350 may have any of the structures and compositions disclosed in reference to the contacts 150 of FIG. 1. Other compositions and structures for the contacts 350 are within the scope of this example.

The microelectronic device 300 includes interconnects 356 on the contacts 350. The interconnects 356 are conductive. At least one of the interconnects 356 provides an electrical connection to the n-type source contact region 334 through one or more of the contacts 350. Another of the interconnects 356 provides an electrical connection to the WBG semiconductor material 344 through one or more of the contacts 350. Another of the interconnects 356 provides an electrical connection to the gate electrode 326. In some versions of this example, one or more of the interconnects 356a may optionally connect the n-type source contact region 334 to the gate electrode 326, so that the hybrid component 302 is manifested as a gated diode rather than the LDMOS transistor. The interconnects 356 may have any of the structures and compositions disclosed in reference to the interconnects 156 of FIG. 1. Other compositions and structures for the contacts 350 and the interconnects 356 are within the scope of this example.

A combination of at least the n-type source contact region 334, the shallow n-type well 330, the p-type body well 328, and the n-type drift region 320 provide a silicon portion 358 of the hybrid component 302. The metal silicide 336 on the n-type source contact region 334 combined with the contact 350 on the metal silicide 336 on the n-type source contact region 334 provides a first current terminal 352 of the hybrid component 302. The first current terminal 352 is on the silicon portion 358 of the hybrid component 302. The contact 350 on the WBG structure 348 provides a second current terminal 354 of the hybrid component 302. Operation of the hybrid component 302 may be similar to the operational details disclosed in reference to the hybrid component 102 of FIG. 1.

Figure 4:
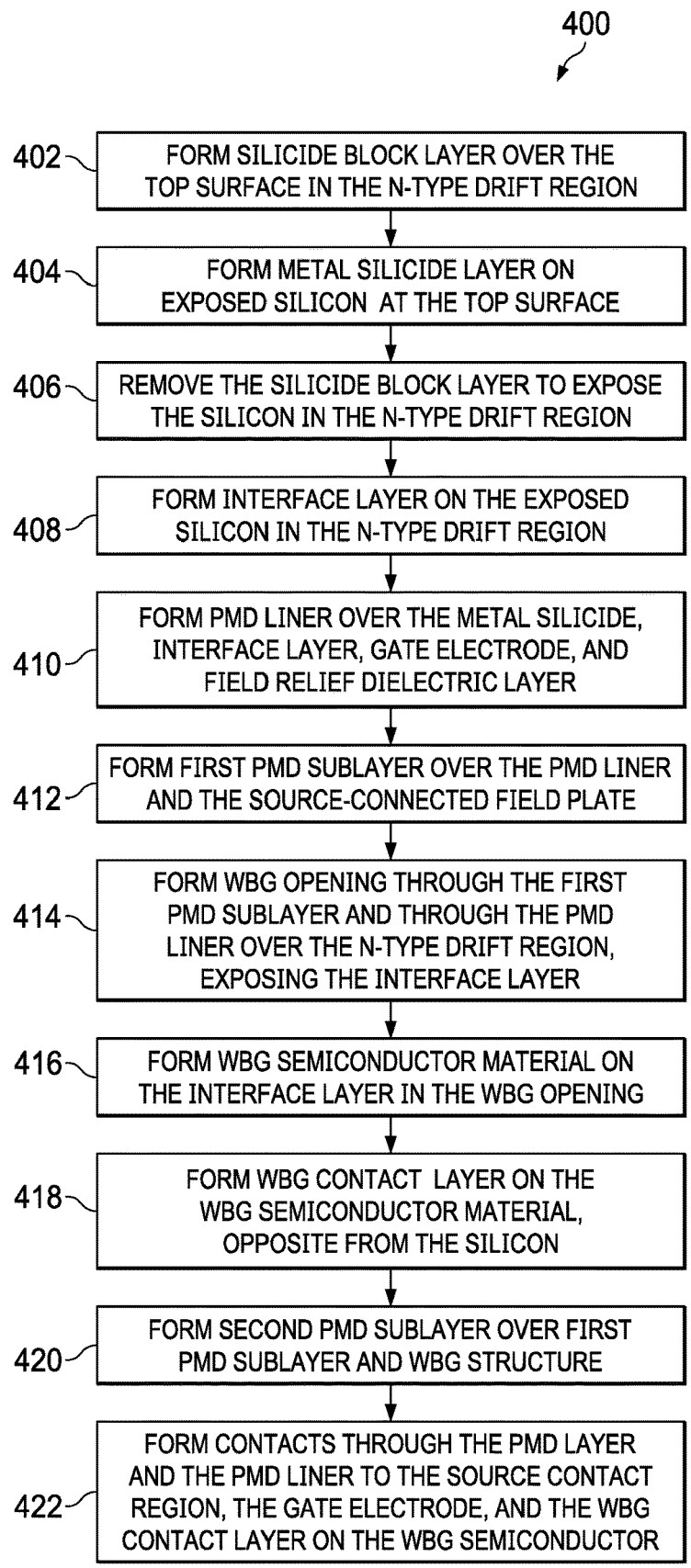
FIG. 4 presents a flowchart of an example method of forming the microelectronic device of FIG. 3.

FIG. 4 presents a flowchart of an example method of forming the microelectronic device 300 of FIG. 3. Structural elements referred to in the steps of the method 400 are shown in FIG. 3. Fabrication of the microelectronic device 300 includes optionally forming the NBL 308 on the base wafer 310, optionally forming the PBL 314 in the silicon 306, forming the epitaxial layer 312 on the NBL 308, forming the field relief dielectric layer 316 at the top surface 318 of the silicon 306, forming the n-type drift region 320 in the silicon 306, forming the patterned PBL 322 in the epitaxial layer 312, forming the gate dielectric layer 324 on the top surface 318 of the silicon 306, forming the gate electrode 326 on the gate dielectric layer 324, forming the p-type body well 328 in the silicon 306 adjacent to the gate electrode 326, opposite from the n-type drift region 320, and forming the shallow n-type well 330 in the p-type body well 328, forming the sidewall spacers 332 on the gate electrode 326, and forming the n-type source contact region 334 in the silicon 306. These elements may be formed as disclosed in steps 202 through 216 of FIG. 2.

After these elements are formed, the method 400 includes step 402, which includes forming a silicide block layer, not explicitly shown in FIG. 3, over the top surface 318 of the silicon 306 in an area for the WBG structure 348. The silicide block layer may include one or more sublayers of dielectric material that do not form silicide with an overlying metal layer during a metal silicide process, such as the process disclosed in reference to step 218 of FIG. 2. The silicide block layer may include silicon dioxide or silicon nitride, by way of example. The silicide block layer may have a thickness of 10 nanometers to 100 nanometers, for example. The silicide block layer may be formed by an LPCVD process or a PECVD process, for example. The n-type source contact region 334 is free of the silicide block layer, to enable formation of the metal silicide 336 on the n-type source contact region 334.

The method 400 continues with step 404, which includes forming the metal silicide 336 on the silicon 306 where exposed by the silicide block layer. The metal silicide 336 may optionally be formed on polysilicon in the gate electrode 326. The metal silicide 336 may be formed as disclosed in reference to step 218 of FIG. 2.

The method 400 continues with step 406, which includes removing the silicide block layer in the area for the WBG structure 348, to expose the top surface 318 of the silicon 306. The silicide block layer may be removed by a wet etch process or a plasma etch process, using an etch mask, not explicitly shown in FIG. 3. Other methods for removing the silicide block layer are within the scope of step 406.

The method 400 continues with step 408, which includes forming the interface layer 360 on the n-type drift region 320, in the area for the WBG semiconductor material 344. The interface layer 360 may include any of the catalyst materials disclosed in reference to FIG. 3. The interface layer 360 may be formed by one or more physical vapor deposition (PVD) processes, such as sputtering or evaporation, MOCVD processes, or ALD processes.

The method 400 continues with step 410, which includes forming the PMD liner 338 over the microelectronic device 300. The PMD liner 338 covers the interface layer 360. The PMD liner 338 may be formed as disclosed in reference to step 220 of FIG. 2.

The method 400 continues with step 412, which includes forming the first PMD sublayer 342a over the PMD liner 338. The first PMD sublayer 342a may be formed as disclosed in reference to step 224 of FIG. 2, for forming the PMD layer 142.

The method 400 continues with step 414, which includes forming the WBG opening 346 through the first PMD sublayer 342a and the PMD liner 338, to expose the interface layer 360. The WBG opening 346 may be formed as disclosed in reference to step 226 of FIG. 2, for forming the WBG opening 146 through the PMD layer 142.

The method 400 continues with step 416, which includes forming the WBG semiconductor material 344 on the interface layer 360 in the WBG opening 346. The WBG semiconductor material 344 may be formed by any of the processes disclosed in reference to step 228 of FIG. 2, for forming the WBG semiconductor material 144 on the metal silicide 136 of FIG. 1. The interface layer 360 may advantageously facilitate forming the WBG semiconductor material 344 at a lower temperature than on the metal silicide 136.

The method 400 continues with step 418, which includes forming the WBG contact layer 362 on the WBG semiconductor material 344. The WBG contact layer 362 may be formed by one or more PVD processes, MOCVD processes, or ALD processes. In one version of step 418, the WBG contact layer 362 may be formed selectively on the WBG semiconductor material 344, so as not to extend over the first PMD sublayer 342a. In another version, the WBG contact layer 362 may be formed on both the WBG semiconductor material 344 and the first PMD sublayer 342a. The WBG contact layer 362 may be subsequently removed from over the first PMD sublayer 342a by a CMP process or other process.

The method 400 continues with step 420, which includes forming the second PMD sublayer 342b over the first PMD sublayer 342a and the WBG contact layer 362. The second PMD sublayer 342b may extend into the WBG opening 346 if the WBG contact layer 362 does not extend to a top surface of the first PMD sublayer 342a. The second PMD sublayer 342b may be formed as disclosed in reference to step 224 of FIG. 2, for forming the PMD layer 142 of FIG. 1.

The method 400 continues with step 422, which includes forming the contacts 350 through the second PMD sublayer 342b to form an electrical connection to the WBG contact layer 362, and through the second PMD sublayer 342b, the first PMD sublayer 342a, and the PMD liner 338 to form electrical connections to the gate electrode 326 and the n-type source contact region 334, through the metal silicide 336. The contacts 350 may be formed as disclosed in reference to step 230 of FIG. 2.

Fabrication of the microelectronic device 300 further includes forming the interconnects 356 on the contacts 350. The interconnects 356 may be formed as disclosed in reference to step 232 of FIG. 2, for forming the interconnects 356 on the contacts 350.

Figure 5:
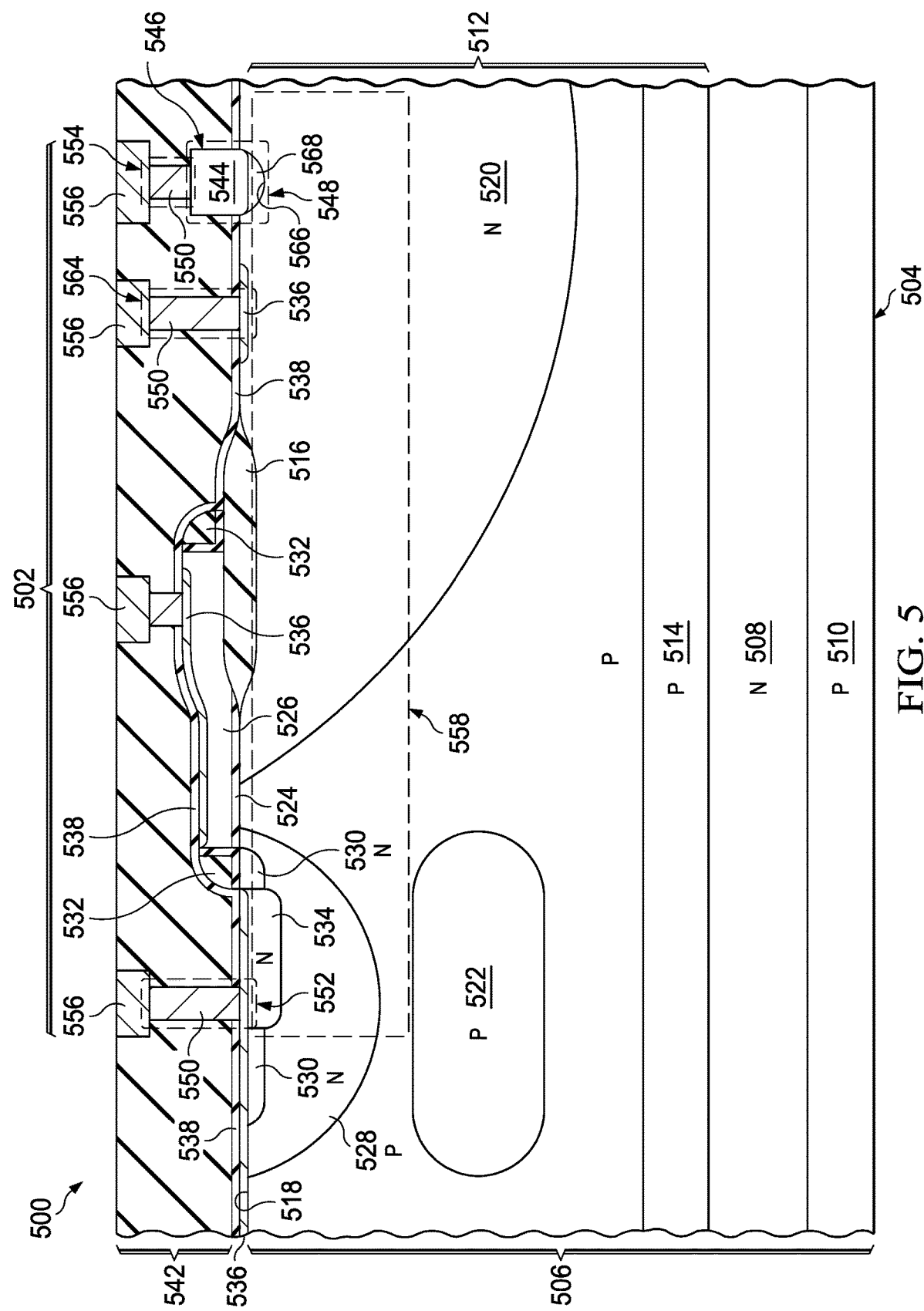
FIG. 5 is a cross section of an example microelectronic device having a hybrid component with a WBG structure in a shallow recess in a silicon semiconductor material.

FIG. 5 is a cross section of an example microelectronic device having a hybrid component with a WBG structure in a shallow recess in a silicon semiconductor material. The microelectronic device 500 may be manifested as any of the device types disclosed in reference to the microelectronic device 100 of FIG. 1. The hybrid component 502 of this example is described as an LDMOS transistor. Other manifestations of the hybrid component 502 are within the scope of this example. The microelectronic device 500 includes a substrate 504 that has silicon semiconductor material 506, referred to herein as the silicon 506. The substrate 504 may be manifested as any of the substrate types disclosed in reference to the substrate 104 of FIG. 1.

The substrate 504 may include an optional NBL 508 on a portion of a base wafer 510. The substrate 504 may include an epitaxial layer 512 of silicon on the NBL 508. In versions of this example in which the substrate 504 lacks the NBL 508, the epitaxial layer 512 may be directly on the base wafer 510. The substrate 504 may also include an optional blanket PBL 514 in the epitaxial layer 512. The optional NBL 508, the base wafer 510, the epitaxial layer 512, and the optional blanket PBL 514 may have the dimensions and dopant concentrations disclosed in reference to the NBL 108, the base wafer 110, the epitaxial layer 112, and the PBL 114 of FIG. 1.

The microelectronic device 500 of this example includes a field relief dielectric layer 516 at a top surface 518 of the silicon 506, extending from a subsequently-formed gate dielectric layer 524 partway over a subsequently-formed n-type drift region 520. The field relief dielectric layer 516 may have the structure and composition disclosed in reference to the field relief dielectric layer 116 of FIG. 1.

The hybrid component 502 of this example includes the n-type drift region 520 in the silicon 506, extending partway under the field relief dielectric layer 516. The hybrid component 502 of this example may include a patterned PBL 522 in the epitaxial layer 512, under a subsequently-formed p-type body well 528. The hybrid component 502 of this example includes a gate dielectric layer 524 on the top surface 518 of the silicon 506, extending from the field relief dielectric layer 516 partway over subsequently-formed p-type body well 528. The hybrid component 502 of this example includes a gate electrode 526 on the gate dielectric layer 524 and extending partway over the field relief dielectric layer 516. The hybrid component 502 of this example includes the p-type body well 528 in the silicon 506. The p-type body well 528 extends partway under the gate electrode 526, proximate to the n-type drift region 520. The hybrid component 502 of this example further includes a shallow n-type well 530 in the silicon 506, surrounded by the p-type body well 528, extending in the silicon 506 proximate to an edge of the gate electrode 526, opposite from the n-type drift region 520. The hybrid component 502 of this example may include sidewall spacers 532 on lateral surfaces of the gate electrode 526. The hybrid component 502 of this example includes an n-type source contact region 534 in the silicon 506, adjacent to the sidewall spacers 532, opposite from the n-type drift region 520. The n-type drift region 520, the patterned PBL 522, the gate dielectric layer 524, the gate electrode 526, the p-type body well 528, the shallow n-type well 530, the sidewall spacers 532, and the n-type source contact region 534 may have the properties, dimensions, compositions, and dopant concentrations disclosed in reference to the corresponding elements of FIG. 1.

The hybrid component 502 of this example may include metal silicide 536 on the silicon 506 on the n-type source contact region 534, and on the n-type drift region 520 around a WBG semiconductor material 544 as part of a silicon-tied field plate 564. In this example, the silicon 506 under the WBG semiconductor material 544 is free of the metal silicide 536. The hybrid component 502 may further include the metal silicide 536 on the gate electrode 526. The metal silicide 536 may have any of the compositions disclosed in reference to the metal silicide 136 of FIG. 1. The metal silicide 536 may be restricted to the n-type source contact region 534 and the n-type drift region 520 around the WBG semiconductor material 544 by a silicide block layer, as disclosed in reference to steps 402 through 406 of FIG. 4. Alternatively, the metal silicide 536 may be restricted to the n-type source contact region 534 and the n-type drift region 520 around the WBG semiconductor material 544 by forming the metal silicide 536 on the silicon 506 where exposed by contact holes for subsequently formed contacts 550. The microelectronic device 500 includes a PMD liner 538 formed over the substrate 504. The microelectronic device 500 includes a PMD layer 542 over the PMD liner 538. The PMD liner 538 and the PMD layer 542 are both non-conductive, and each may include one or more sublayers of dielectric material. The PMD liner 538 and the PMD layer 542 may have the structures and compositions disclosed in reference to the PMD liner 138 and the PMD layer 142 of FIG. 1.

The hybrid component 502 includes the WBG semiconductor material 544 on the silicon 506 in the n-type drift region 520. The WBG semiconductor material 544 is in a WBG opening 546 through the PMD layer 542 and the PMD liner 538. The WBG semiconductor material 544 may have any of the compositions and structures discussed in reference to the WBG semiconductor material 144 of FIG. 1. The hybrid component 502 of this example may include a shallow recess 566 in the silicon 506 below the WBG semiconductor material 544, to provide a more reliable connection between the WBG semiconductor material 544 and the silicon 506. The shallow recess 566 may extend 10 nanometers to 100 nanometers into the silicon 506, by way of example. The hybrid component 502 may include an n-type heavily doped region 568 in the silicon 506 below the shallow recess 566, to reduce an electrical resistance between the WBG semiconductor material 544 and the n-type drift region 520. The n-type heavily doped region 568 may have an n-type dopant concentration of $1\times10^{19}$ atoms/cm$^3$ to $1\times10^{21}$ atoms/cm$^3$, by way of example. The n-type heavily doped region 568 may extend to a depth of 100 nanometers to 1 micron below the top surface 118, by way of example. The WBG semiconductor material 544 provides a WBG structure 548 of the hybrid component 502. The WBG structure 548 is on the silicon 506. The WBG semiconductor material 544 has a lateral dimension adjacent to the silicon 506 that is no greater than 10 times a thickness of the WBG semiconductor material 544 or 10 times a depth of the shallow recess 566, whichever is greater, in at least one lateral direction. In this example, additional dielectric material may be formed over the WBG semiconductor material 544 as part of the PMD layer 542, to provide a planar top surface of the PMD layer 542, as indicated in FIG. 5, accruing the advantage disclosed in reference to FIG. 1.

The microelectronic device 500 includes the contacts 550 through the PMD layer 542 and the PMD liner 538. The contacts 550 are conductive, and provide electrical connections to the metal silicide 536 on the n-type source contact region 534, the gate electrode 526, the n-type drift region 520 around the WBG semiconductor material 544, and the WBG semiconductor material 544. The contacts 550 on the n-type drift region 520 around the WBG semiconductor material 544 provide the silicon-tied field plate 564. The contacts 550 may have any of the structures and compositions disclosed in reference to the contacts 150 of FIG. 1. Other compositions and structures for the contacts 550 are within the scope of this example.

The microelectronic device 500 includes interconnects 556 on the contacts 550. The interconnects 556 are conductive. At least one of the interconnects 556 provides an electrical connection to the n-type source contact region 534 through one or more of the contacts 550. Another of the interconnects 556 provides an electrical connection to the WBG semiconductor material 544 through one or more of the contacts 550. Another of the interconnects 556 provides an electrical connection to the gate electrode 526. The interconnects 556 may have any of the structures and compositions disclosed in reference to the interconnects 156 of FIG. 1. Other compositions and structures for the contacts 550 and the interconnects 556 are within the scope of this example.

A combination of at least the n-type source contact region 534, the shallow n-type well 530, the p-type body well 528, the n-type drift region 520, and the n-type heavily doped region 568 provide a silicon portion 558 of the hybrid component 502. A combination of the metal silicide 536 on the n-type source contact region 534 and the contact 550 on the metal silicide 536 on the n-type source contact region 534 provides a first current terminal 552 of the hybrid component 502. The first current terminal 552 is on the silicon portion 558 of the hybrid component 502. The contact 550 on the WBG structure 548 provides a second current terminal 554 of the hybrid component 502. Operation of the hybrid component 502 may be similar to the operational details disclosed in reference to the hybrid component 102 of FIG. 1.

Figure 6:
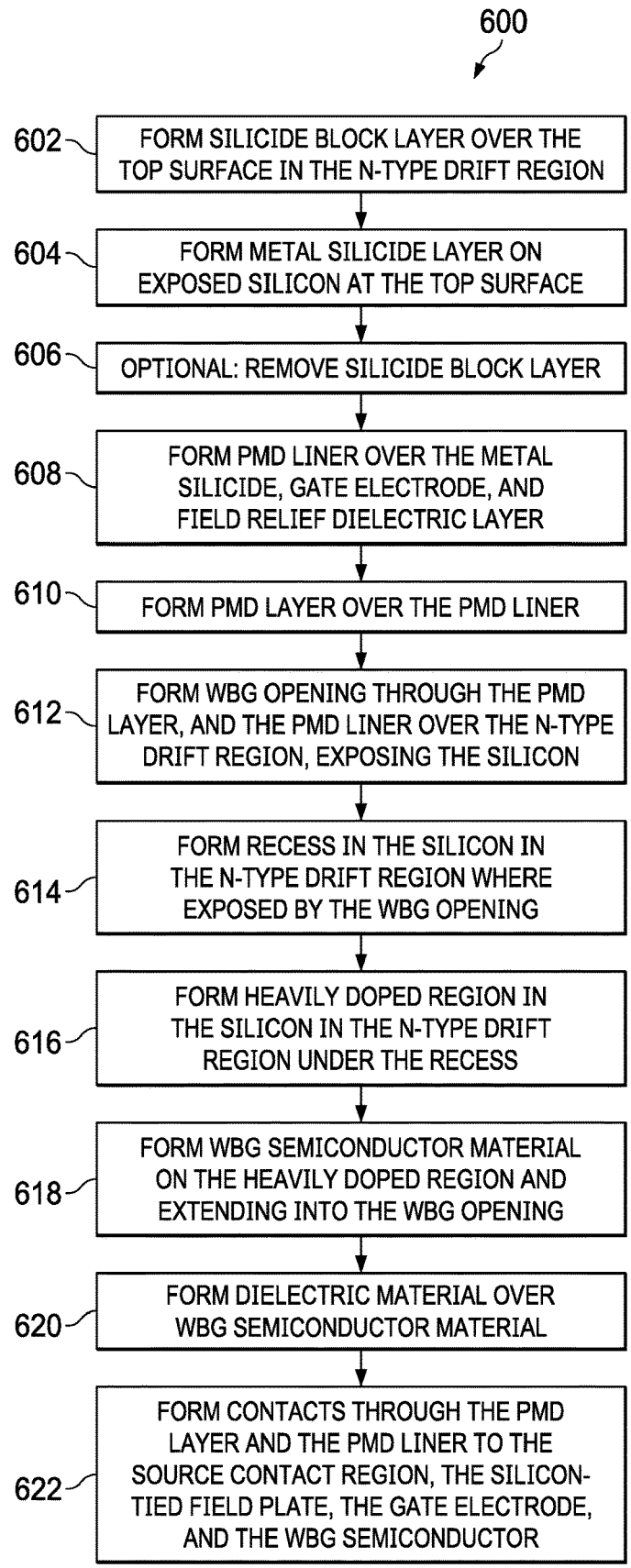
FIG. 6 presents a flowchart of an example method of forming the microelectronic device of FIG. 5.

FIG. 6 presents a flowchart of an example method of forming the microelectronic device 500 of FIG. 5. Structural elements referred to in the steps of the method 600 are shown in FIG. 5. Fabrication of the microelectronic device 500 includes optionally forming the NBL 508 on the base wafer 510, optionally forming the PBL 514 in the silicon 506, forming the epitaxial layer 512 on the NBL 508, forming the field relief dielectric layer 516 at the top surface 518 of the silicon 506, forming the n-type drift region 520 in the silicon 506, forming the patterned PBL 522 in the epitaxial layer 512, forming the gate dielectric layer 524 on the top surface 518 of the silicon 506, forming the gate electrode 526 on the gate dielectric layer 524, forming the p-type body well 528 in the silicon 506 adjacent to the gate electrode 526, opposite from the n-type drift region 520, and forming the shallow n-type well 530 in the p-type body well 528, forming the sidewall spacers 532 on the gate electrode 526, and forming the n-type source contact region 534 in the silicon 506. These elements may be formed as disclosed in steps 202 through 216 of FIG. 2.

After these elements are formed, the method 600 includes step 602, which includes forming a silicide block layer, not explicitly shown in FIG. 5, over the top surface 518 of the silicon 506 in an area for the WBG structure 548. In this example, the silicide block layer exposes the silicon 506 over the n-type source contact region 534 and around the WBG structure 548, to enable formation of the metal silicide 536 on the n-type source contact region 534 and on an area for the silicon-tied field plate 564. The silicide block layer may have any of the structures, compositions, and properties disclosed in reference to the silicide block layer of step 402 of FIG. 4.

The method 600 continues with step 604, which includes forming the metal silicide 536 on the silicon 506 where exposed by the silicide block layer. In this example, the metal silicide 536 is formed at least on the n-type source contact region 534, and around the WBG structure 548 in the area for the silicon-tied field plate 564. The metal silicide 536 may optionally be formed on polysilicon in the gate electrode 526. The metal silicide 536 may be formed as disclosed in reference to step 218 of FIG. 2. Alternatively, the metal silicide 536 may be formed after contact holes for the contacts 550 are formed through the PMD layer 542 and the PMD liner 538, exposing the silicon 506. A layer of titanium may be formed on the silicon 506 exposed by the contact holes. The substrate 504 may subsequently be heated, reacting the titanium with the silicon 506 to form the metal silicide 536 at the bottoms of the contact holes.

The method 600 continues with step 606, which includes optionally removing the silicide block layer in the area for the WBG structure 548, to expose the top surface 518 of the silicon 506. The silicide block layer may be removed as disclosed in reference to step 406 of FIG. 4. Other methods for removing the silicide block layer are within the scope of step 606. Alternatively, the silicide block layer may be left in place over the area for the WBG structure 548.

The method 600 continues with step 608, which includes forming the PMD liner 538 over the microelectronic device 500. The PMD liner 538 covers the silicide block layer, if present, over an area for the WBG structure 548. The PMD liner 538 may be formed as disclosed in reference to step 220 of FIG. 2.

The method 600 continues with step 610, which includes forming the PMD layer 542 over the PMD liner 538. The PMD layer 542 may be formed as disclosed in reference to step 224 of FIG. 2.

The method 600 continues with step 612, which includes forming the WBG opening 546 through the PMD layer 542 and the PMD liner 538, and through the silicide block layer, if present, to expose the silicon 506. The WBG opening 546 may be formed as disclosed in reference to step 226 of FIG. 2.

The method 600 continues with step 614, which includes forming the shallow recess 566 in the silicon 506 where exposed by the WBG opening 546. In one version of step 614, the shallow recess 566 may be formed by a timed isotropic wet etch process using a dilute buffered aqueous solution of hydrofluoric acid or a planar etch solution including nitric acid, acetic acid, and hydrofluoric acid. In a further version, the shallow recess 566 may be formed by a timed isotropic wet etch process using a faceting etchant such as tetramethyl ammonium hydroxide, which provides exposed (1-1-1) facets of the silicon 506 in the shallow recess 566. The (1-1-1) facets may facilitate nucleation of the WBG semiconductor material 544. In another version, the shallow recess 566 may be formed by a timed vapor phase etch process using xenon difluoride, which exhibits high etch selectivity to dielectric material in the PMD layer 542 and the PMD liner 538. In a further version, the shallow recess 566 may be formed by a timed RIE process. Other methods of forming the shallow recess are within the scope of step 614. Forming the shallow recess 566 after forming the WBG opening 546 may advantageously self-align the shallow recess 566 to the WBG opening 546, reducing fabrication cost and complexity of the microelectronic device 500.

The method 600 continues with step 616, which includes forming the n-type heavily doped region 568 in the silicon 506 below the shallow recess 566. The n-type heavily doped region 568 may be formed by implanting n-type dopants, such as antimony, arsenic, or phosphorus into the silicon 506 where exposed by the WBG opening 546 through the PMD layer 542 and the PMD liner 538. Antimony and arsenic may advantageously diffuse less than phosphorus to localize the n-type heavily doped region 568. The n-type dopants may be implanted at low energy, so that the n-type heavily doped region 568 may be formed without using an implant mask, reducing fabrication cost and complexity of the microelectronic device 500.

The method 600 continues with step 618, which includes forming the WBG semiconductor material 544 on the n-type heavily doped region 568 in the shallow recess 566 and extending into the WBG opening 546. The WBG semiconductor material 544 may be formed by any of the processes disclosed in reference to step 228 of FIG. 2, for forming the WBG semiconductor material 144 of FIG. 1. The shallow recess 566 and the n-type heavily doped region 568 may improve reliability of an interface between the WBG semiconductor material 544 and the silicon 506.

The method 600 continues with step 620, which includes forming the additional dielectric material over the WBG semiconductor material 544 as part of the PMD layer 542. The additional dielectric material may be planarized to the top surface of the PMD layer 542.

The method 600 continues with step 622, which includes forming the contacts 550 through the PMD layer 542 and the PMD liner 538 to form electrical connections to the WBG semiconductor material 544, the gate electrode 526, the n-type drift region 520 around the WBG semiconductor material 544, and the n-type source contact region 534. The contacts 550 may be formed as disclosed in reference to step 230 of FIG. 2.

Fabrication of the microelectronic device 500 further includes forming the interconnects 556 on the contacts 550. The interconnects 556 may be formed as disclosed in reference to step 232 of FIG. 2, for forming the interconnects 156 on the contacts 150 of FIG. 1.

Figure 7:
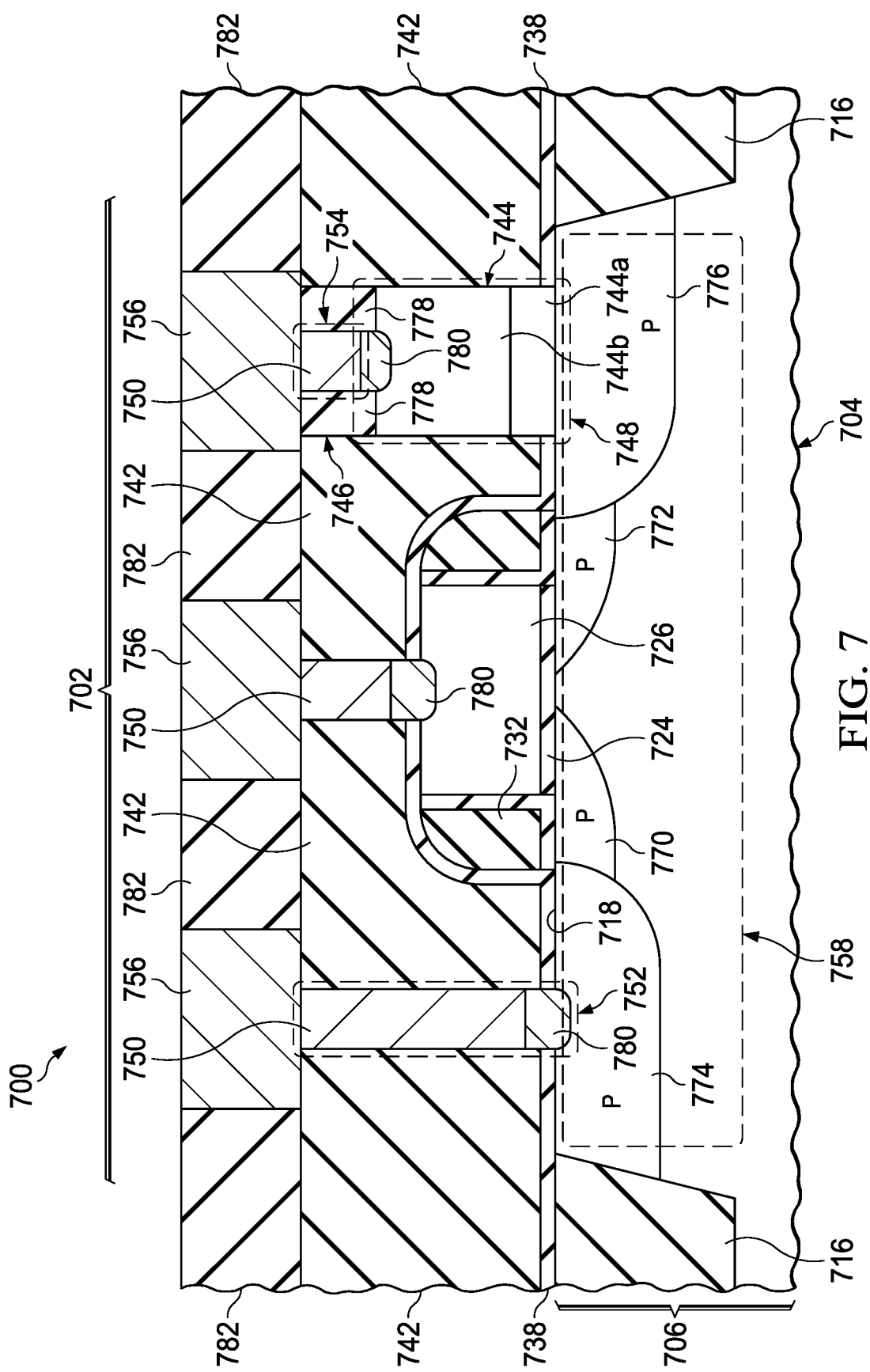
FIG. 7 is a cross section of an example microelectronic device having a hybrid component with a WBG structure including a WBG semiconductor material having a graded portion on silicon semiconductor material.

FIG. 7 is a cross section of an example microelectronic device having a hybrid component with a WBG structure including a WBG semiconductor material having a graded portion on silicon semiconductor material. The microelectronic device 700 may be manifested as any of the device types disclosed in reference to the microelectronic device 100 of FIG. 1. The hybrid component 702 of this example is described as a p-channel metal oxide semiconductor (PMOS) transistor. Other manifestations of the hybrid component 702 are within the scope of this example. The microelectronic device 700 includes a substrate 704 that has silicon semiconductor material 706, referred to herein as the silicon 706. The silicon 706 may be a top portion of a bulk silicon wafer, or may be an epitaxial layer on a portion of a base wafer. The substrate 704 may be manifested as any of the substrate types disclosed in reference to the substrate 104 of FIG. 1.

The microelectronic device 700 of this example includes a field relief dielectric layer 716 at a top surface 718 of the silicon 706, laterally surrounding the hybrid component 702. The field relief dielectric layer 716 may have an STI structure, as depicted in FIG. 7, or may have a LOCOS structure.

The hybrid component 702 of this example includes a p-type source extension 770 and a p-type drain extension 772 in the silicon 706. The silicon 706 between and below the p-type source extension 770 and the p-type drain extension 772 is n-type in this example, as indicated in FIG. 7. The p-type source extension 770 and the p-type drain extension 772 may have an average dopant concentration of $1 \times 10^{18}$ atoms/cm$^3$ to $1 \times 10^{20}$ atoms/cm$^3$, by way of example. The silicon 706 between the p-type source extension 770 and the p-type drain extension 772 may have an average dopant concentration of $1 \times 10^{16}$ atoms/cm$^3$ to $1 \times 10^{17}$ atoms/cm$^3$, which may affect a threshold potential of the hybrid component 702.

The hybrid component 702 of this example includes a gate dielectric layer 724 on the top surface 718 of the silicon 706, extending over the silicon 706 between the p-type source extension 770 and the p-type drain extension 772 and partially overlapping the p-type source extension 770 and the p-type drain extension 772. The hybrid component 702 of this example further includes a gate electrode 726 on the gate dielectric layer 724. The gate electrode 726 also extends over the silicon 706 between the p-type source extension 770 and the p-type drain extension 772 and partially overlapping the p-type source extension 770 and the p-type drain extension 772. The hybrid component 702 of this example may include sidewall spacers 732 on lateral surfaces of the gate electrode 726. The gate dielectric layer 724, the gate electrode 726, and the sidewall spacers 732 may have any of the compositions and structures disclosed in reference to the gate dielectric layer 124, the gate electrode 126, and the sidewall spacers 132, respectively, of FIG. 1.

The hybrid component 702 of this example includes a p-type source contact region 774 in the silicon 706, adjacent to the gate electrode 726, and overlapping the p-type source extension 770. The hybrid component 702 of this example further includes a p-type drain contact region 776 in the silicon 706, adjacent to the gate electrode 726, opposite from the p-type source contact region 774, and overlapping the p-type drain extension 772. The p-type source contact region 774 and the p-type drain extension 772 may have an average dopant concentration of $1 \times 10^{19}$ atoms/cm$^3$ to $1 \times 10^{21}$ atoms/cm$^3$, by way of example.

The microelectronic device 700 includes a PMD liner 738 over the substrate 704. The microelectronic device 700 includes a PMD layer 742 over the PMD liner 738.

The PMD liner 738 and the PMD layer 742 are both non-conductive, and each may include one or more sublayers of dielectric material. The PMD liner 738 and the PMD layer 742 may have the structures and compositions disclosed in reference to the PMD liner 138 and the PMD layer 142 of FIG. 1.

The hybrid component 702 includes a WBG semiconductor material 744 on the silicon 706 over the p-type drain contact region 776. The WBG semiconductor material 744 is in a WBG opening 746 through the PMD layer 742 and the PMD liner 738. The WBG semiconductor material 744 of this example may include a graded WBG portion 744a on the silicon 706, and a uniform WBG portion 744b on the graded WBG portion 744a. The graded WBG portion 744a may have a varying composition and a varying lattice constant, and the uniform WBG portion 744b may have a uniform composition and a uniform lattice constant. The composition of the graded WBG portion 744a may vary smoothly or in discrete steps. At an interface between the graded WBG portion 744a and the silicon 706, the graded WBG portion 744a may have a lattice constant that is close to a lattice constant of the silicon 706. At an interface between the graded WBG portion 744a and the uniform WBG portion 744b, the graded WBG portion 744a may have a lattice constant that is close to a lattice constant of the uniform WBG portion 744b. The graded WBG portion 744a may thus advantageously reduce dislocation defects in the WBG semiconductor material 744. The WBG semiconductor material 744 may have any of the compositions discussed in reference to the WBG semiconductor material 144 of FIG. 1. The WBG semiconductor material 744 has a lateral dimension adjacent to the silicon 706 that is no greater than 10 times a thickness of the WBG semiconductor material 744, in at least one lateral direction.

In this example, additional dielectric material 778 may be formed in the WBG opening 746, over the WBG semiconductor material 744, as part of the PMD layer 742, to provide a planar top surface of the PMD layer 742, as indicated in FIG. 7, accruing the advantage disclosed in reference to FIG. 1.

The microelectronic device 700 includes contacts 750 through the PMD layer 742 and the PMD liner 738, making electrical connections to the p-type source contact region 774, the gate electrode 726, and the WBG semiconductor material 744. In this example, the microelectronic device 700 may include a contact layer 780 under the contacts 750, to provide reduced resistance in the electrical connections. The contact layer 780 may include metal silicide on the p-type source contact region 774 and the gate electrode 726. The contact layer 780 may include metal, or an alloy of metal and semiconductor material, on the WBG semiconductor material 744. The contact layer 780 may include, for example, titanium, nickel, or cobalt. The contacts 750 are conductive, the contacts 750 may have any of the structures and compositions disclosed in reference to the contacts 150 of FIG. 1. Other compositions and structures for the contacts 750 are within the scope of this example.

A combination of at least the p-type source contact region 774, the p-type source extension 770, the p-type drain contact region 776, the p-type drain extension 772, and the silicon 706 between the p-type source extension 770 and the p-type drain extension 772 provide a silicon portion 758 of the hybrid component 702. A combination of the WBG semiconductor material 744 and the contact layer 780 on the WBG semiconductor material 744 provides a WBG structure 748 of the hybrid component 702. The WBG structure 748 is on the silicon 706. A combination of the contact layer 780 on the p-type source contact region 774 and the contact 750 on the contact layer 780 on the p-type source contact region 774 provides a first current terminal 752 of the hybrid component 702. The first current terminal 752 is on the silicon portion 758 of the hybrid component 702. The contact 750 on the WBG structure 748 provides a second current terminal 754 of the hybrid component 702. Operation of the hybrid component 702 may be similar to the operational details disclosed in reference to the hybrid component 102 of FIG. 1.

The microelectronic device 700 may include an IMD layer 782 on the PMD layer 742. The IMD layer 782 is non-conductive, and may include one or more sublayers of dielectric material, including a silicon dioxide layer and a cap layer of silicon nitride, silicon carbide, or silicon carbonitride, to provide a stop layer for a copper CMP process. The microelectronic device 700 includes interconnects 756 on the contacts 750. The interconnects 756 are conductive. The interconnects 756 may have a damascene structure, as disclosed in reference to FIG. 1. Other structures for the interconnects 756 are within the scope of this example. At least one of the interconnects 756 provides an electrical connection to the p-type source contact region 774 through one or more of the contacts 750. Another of the interconnects 756 provides an electrical connection to the WBG semiconductor material 744 through one or more of the contacts 750. Another of the interconnects 756 provides an electrical connection to the gate electrode 726 through one or more of the contacts 750.

The hybrid component 702 of this example may advantageously enable cost-efficient integration of a high voltage transistor in a complementary metal oxide semiconductor (CMOS) fabrication sequence. An n-channel metal oxide semiconductor (NMOS) transistor with a similar WBG structure may be fabricated in the microelectronic device 700 by appropriate changes in dopant polarities.

Figure 8:
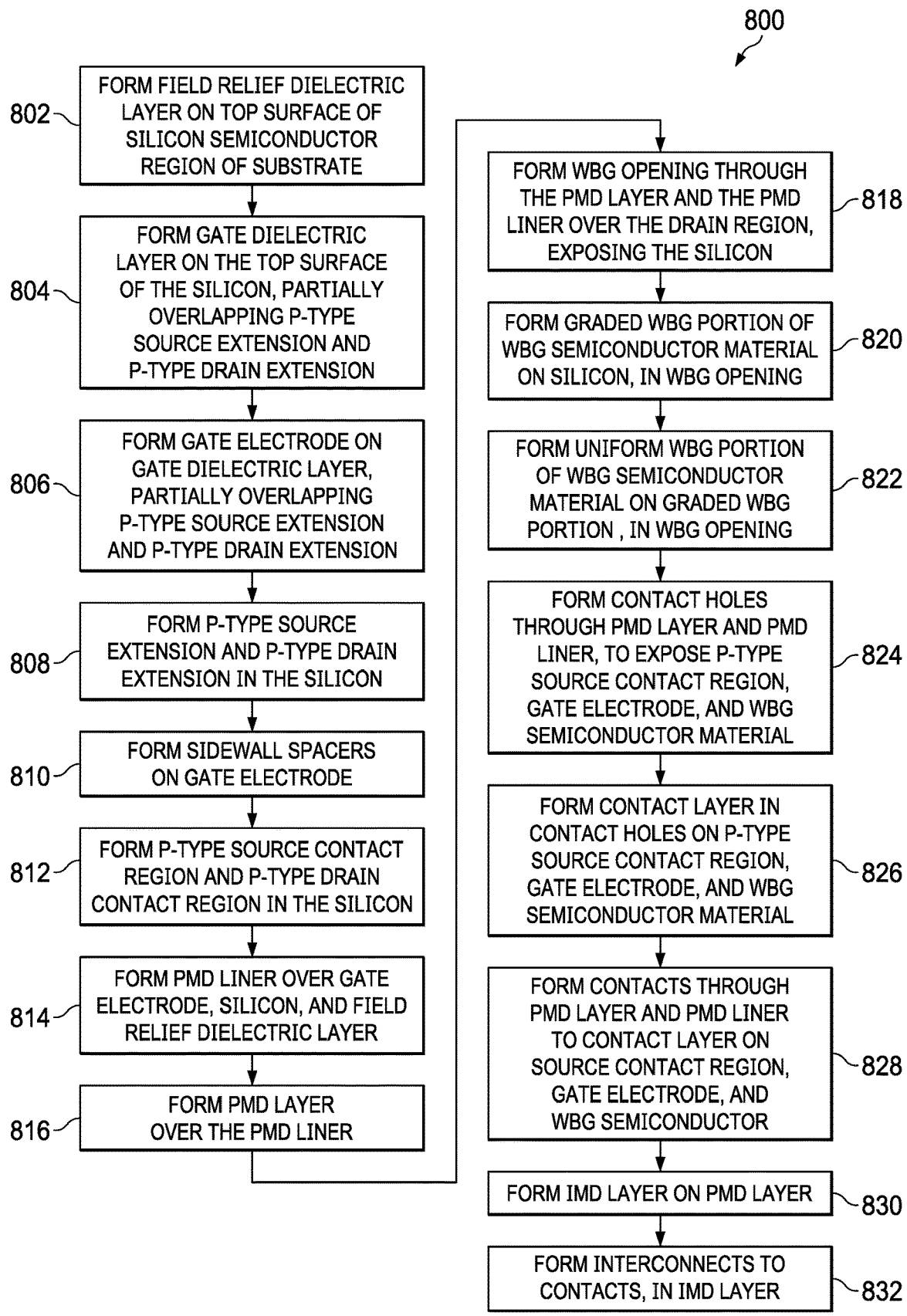
FIG. 8 presents a flowchart of an example method of forming the microelectronic device of FIG. 7.

FIG. 8 presents a flowchart of an example method of forming the microelectronic device 700 of FIG. 7. The method 800 includes step 802, which includes forming the field relief dielectric layer 716 at the top surface 718 of the silicon 706. The field relief dielectric layer 716 may be formed by an STI process, as disclosed in reference to step 204 of FIG. 2. Alternatively, the field relief dielectric layer 716 may be formed by a LOCOS process, also disclosed in reference to step 204 of FIG. 2. Other methods of forming the field relief dielectric layer 716 are within the scope of step 802.

The method 800 continues with step 804, which includes forming the gate dielectric layer 724 on the top surface 718 of the silicon 706. The gate dielectric layer 724 may be formed by any of the methods disclosed in step 210 of FIG. 2, in reference to forming the gate dielectric layer 124 of FIG. 1.

The method 800 continues with step 806, which includes forming the gate electrode 726 on the gate dielectric layer 724. The gate electrode 726 may be formed by any of the methods disclosed in step 210 of FIG. 2, in reference to forming the gate electrode 126 of FIG. 1.

The method 800 continues with step 808, which includes forming the p-type source extension 770 and the p-type drain extension 772 in the silicon 706. The p-type source extension 770 and a p-type drain extension 772 may be formed by forming an implant mask, not explicitly shown, which exposes the gate electrode 726 and the silicon 706 on opposites sides of the gate electrode 726, and implanting p-type dopants, such as boron and gallium, and optionally indium, into the silicon 706 where exposed by the gate electrode 726 and the implant mask. Boron may be implanted as boron difluoride, to add fluorine to the p-type source extension 770 and a p-type drain extension 772. The p-type dopants may be implanted at a total dose of $1 \times 10^{14}$ ions/cm$^2$ to $1 \times 10^{15}$ ions/cm$^2$, by way of example. The substrate 704 is subsequently heated by a rapid thermal process or a flash anneal process to activate the implanted p-type dopants.

The method 800 continues with step 810, which includes forming the sidewall spacers 732 on lateral surfaces of the gate electrode 726. The sidewall spacers 732 may be formed as disclosed in step 214 of FIG. 2, in reference to forming the sidewall spacers 132 of FIG. 1.

The method 800 continues with step 812, which includes forming the p-type source contact region 774 and the p-type drain contact region 776 in the silicon 706. The p-type source contact region 774 and the p-type drain contact region 776 may be formed by forming an implant mask, not explicitly shown, which exposes the gate electrode 726, the sidewall spacers 732, and the p-type source extension 770 and the p-type drain extension 772 in the silicon 706. P-type dopants such as boron are implanted into the silicon 706 where exposed by the gate electrode 726, the sidewall spacers 732, and the implant mask. The p-type dopants may be implanted at a total dose of $1 \times 10^{15}$ ions/cm$^2$ to $5 \times 10^{15}$ ions/cm$^2$, by way of example. The substrate 704 is subsequently heated by a rapid thermal process or a flash anneal process to activate the implanted p-type dopants.

The method 800 continues with step 814, which includes forming the PMD liner 738 over the microelectronic device 700. The PMD liner 738 may be formed as disclosed in reference to step 220 of FIG. 2.

The method 800 continues with step 816, which includes forming the PMD layer 742 over the PMD liner 738. The PMD layer 542 may be formed as disclosed in reference to step 224 of FIG. 2.

The method 800 continues with step 818, which includes forming the WBG opening 746 through the PMD layer 742 and the PMD liner 738, to expose the silicon 706 in the p-type drain contact region 776. The WBG opening 746 may be formed as disclosed in reference to step 226 of FIG. 2.

The method 800 continues with step 820, which includes forming the graded WBG portion 744a of the WBG semiconductor material 744 on the silicon 706 in the WBG opening 746. The graded WBG portion 744a may be formed by varying reactant gases used in an epitaxy process for forming the graded WBG portion 744a. The WBG semiconductor material 744 may be formed by one or more MOCVD epitaxy, atomic layer epitaxy, atomic layer deposition with layer-by-layer anneal, MBE, or plasma assisted MBE processes, by way of example.

The method 800 continues with step 822, which includes forming the uniform WBG portion 744b of the WBG semiconductor material 744 on the graded WBG portion 744a. The WBG semiconductor material 744 may be formed by any of the processes disclosed in reference to step 228 of FIG. 2, for forming the WBG semiconductor material 144 of FIG. 1.

The method 800 continues with step 824, which includes forming contact holes through the PMD layer 742 and the PMD liner 738, to expose the p-type source contact region 774, the gate electrode 726, and the WBG semiconductor material 744. The contact holes may be formed through the PMD layer 742 by a first RIE process which is endpointed after reaching the PMD liner 738, and through the PMD liner 738 by a second RIE process.

The method 800 continues with step 826, which includes forming the contact layer 780 on the p-type source contact region 774, the gate electrode 726, and the WBG semiconductor material 744, in the contact holes. The contact layer 780 may be formed by forming a metal on the p-type source contact region 774, the gate electrode 726, and the WBG semiconductor material 744, at bottoms of the contact holes. The metal may include titanium, nickel, or cobalt, for example. The substrate 704 may be heated to react the metal with the silicon 706 in the p-type source contact region 774, with polysilicon in the gate electrode 726, and with the WBG semiconductor material 744, forming the contact layer 780. The contact layer 780 may have different compositions at different locations in the microelectronic device 700.

The method 800 continues with step 828, which includes forming the contacts 750 in the contact holes, making connections to the contact layer 780. The contacts 750 may be formed as disclosed in reference to step 230 of FIG. 2.

The method 800 continues with step 830, which includes forming the IMD layer 782 on the PMD layer 742 and the contacts 750. The IMD layer 782 may be formed by a series of PECVD processes to form dielectric sublayers of silicon dioxide and the cap layer of silicon nitride, silicon carbide, or silicon carbonitride.

The method 800 continues with step 832, which includes forming the interconnects 756 in the IMD layer 782 on the contacts 750. The interconnects 756 may be formed by a damascene process, as disclosed in reference to step 232 of FIG. 2. Alternatively, the interconnects 756 may be formed by an etched aluminum process, prior to forming the IMD layer 782. Other methods of forming the interconnects 756 are within the scope of step 832.

Figure 9:
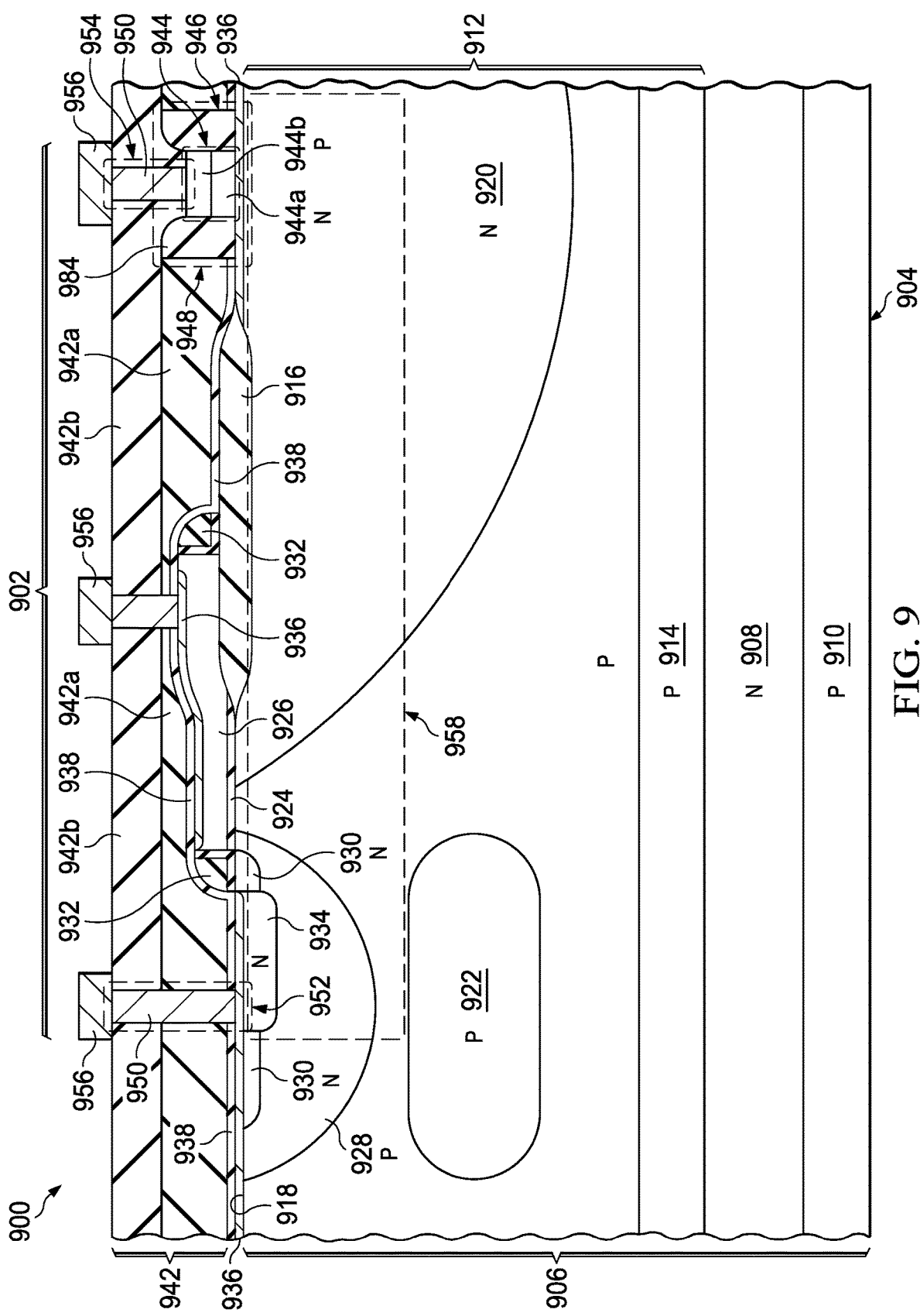
FIG. 9 is a cross section of an example microelectronic device having a hybrid component with a WBG structure having a WBG sidewall laterally surrounding a WBG semiconductor material.

FIG. 9 is a cross section of an example microelectronic device having a hybrid component with a WBG structure having a WBG sidewall laterally surrounding a WBG semiconductor material. The microelectronic device 900 may be manifested as any of the device types disclosed in reference to the microelectronic device 100 of FIG. 1. The hybrid component 902 of this example is described as an LDMOS transistor. Other manifestations of the hybrid component 902 are within the scope of this example. The microelectronic device 900 includes a substrate 904 that has silicon semiconductor material 906, referred to herein as the silicon 906. The substrate 904 may be manifested as any of the substrate types disclosed in reference to the substrate 104 of FIG. 1.

The substrate 904 may include an optional NBL 908 on a portion of a base wafer 910. The substrate 904 may include an epitaxial layer 912 of silicon on the NBL 908. In versions of this example in which the substrate 904 lacks the NBL 908, the epitaxial layer 912 may be directly on the base wafer 910. The substrate 904 may also include an optional blanket PBL 914 in the epitaxial layer 912. The optional NBL 908, the base wafer 910, the epitaxial layer 912, and the optional blanket PBL 914 may have the dimensions and dopant concentrations disclosed in reference to the NBL 108, the base wafer 110, the epitaxial layer 112, and the PBL 114 of FIG. 1.

The microelectronic device 900 of this example includes a field relief dielectric layer 916 at a top surface 918 of the silicon 906, extending from a subsequently-formed gate dielectric layer 924 partway over a subsequently-formed n-type drift region 920. The field relief dielectric layer 916 may have the structure and composition disclosed in reference to the field relief dielectric layer 116 of FIG. 1.

The hybrid component 902 of this example includes the n-type drift region 920 in the silicon 906, extending partway under the field relief dielectric layer 916. The hybrid component 902 of this example may include a patterned PBL 922 in the epitaxial layer 912, under a subsequently-formed p-type body well 928. The hybrid component 902 of this example includes a gate dielectric layer 924 on the top surface 918 of the silicon 906, extending from the field relief dielectric layer 916 partway over subsequently-formed p-type body well 928. The hybrid component 902 of this example includes a gate electrode 926 on the gate dielectric layer 924 and extending partway over the field relief dielectric layer 916. The hybrid component 902 of this example includes the p-type body well 928 in the silicon 906. The p-type body well 928 extends partway under the gate electrode 926, proximate to the n-type drift region 920. The hybrid component 902 of this example further includes a shallow n-type well 930 in the silicon 906, surrounded by the p-type body well 928, extending in the silicon 906 proximate to an edge of the gate electrode 926, opposite from the n-type drift region 920. The hybrid component 902 of this example may include sidewall spacers 932 on lateral surfaces of the gate electrode 926. The hybrid component 902 of this example includes an n-type source contact region 934 in the silicon 906, adjacent to the sidewall spacers 932, opposite from the n-type drift region 920. The n-type drift region 920, the patterned PBL 922, the gate dielectric layer 924, the gate electrode 926, the p-type body well 928, the shallow n-type well 930, the sidewall spacers 932, and the n-type source contact region 934 may have the properties, dimensions, compositions, and dopant concentrations disclosed in reference to the corresponding elements of FIG. 1.

The hybrid component 902 of this example includes metal silicide 936 on the silicon 906, on the n-type source contact region 934 and on the n-type drift region 920. The hybrid component 902 may further include the metal silicide 936 on the gate electrode 926. The metal silicide 936 may have any of the compositions disclosed in reference to the metal silicide 136 of FIG. 1.

The microelectronic device 900 includes a PMD liner 938 formed over the substrate 904. The microelectronic device 900 includes a PMD layer 942 over the PMD liner 938. The PMD layer 942 of this example includes a first PMD sublayer 942a on the PMD liner 938, and a second PMD sublayer 942b on the first PMD sublayer 942a. Each of the first PMD sublayer 942a and the second PMD sublayer 942b is non-conductive, and may include one or more sublayers of dielectric material, such as the materials disclosed in reference to the PMD layer 142 of FIG. 1. The first PMD sublayer 942a may be planarized, as depicted in FIG. 9, or may be conformal. The second PMD sublayer 942b may have a planar top surface, as depicted in FIG. 9, as a result of the first PMD sublayer 942a being planarized, or as a result of a planarizing process, such as an oxide CMP process, being applied to the second PMD sublayer 942b.

The hybrid component 902 includes a WBG opening 946 through the first PMD sublayer 942a and the PMD liner 938, over the metal silicide 936 on the n-type drift region 920. The hybrid component 902 of this example further includes a WBG sidewall 984 in the WBG opening 946, contacting the first PMD sublayer 942a and the PMD liner 938. The WBG sidewall 984 exposes the metal silicide 936 on the n-type drift region 920. The WBG sidewall 984 is non-conductive, and may include dielectric material which provides a stable interface with a WBG semiconductor material 944. The WBG sidewall 984 may include silicon nitride or silicon-doped boron nitride, for example. The hybrid component 902 includes the WBG semiconductor material 944 in the WBG opening 946, on the metal silicide 936 and contacting the WBG sidewall 984. The WBG sidewall 984 may laterally surround the WBG semiconductor material 944. The WBG semiconductor material 944 may have any of the compositions and structures discussed in reference to the WBG semiconductor material 144 of FIG. 1. The WBG semiconductor material 944 has a lateral dimension adjacent to the silicon 906 that is no greater than 10 times a thickness of the WBG semiconductor material 944 in at least one lateral direction. In some versions of this example, the WBG semiconductor material 944 may have an n-type portion 944a on the metal silicide 936 and a p-type portion 944b on the n-type portion 944a, so that the hybrid component 902 is manifested as an IGBT, instead of the LDMOS transistor.

A combination of the WBG sidewall 984, the WBG semiconductor material 944, and the metal silicide 936 between the WBG semiconductor material 944 and the n-type drift region 920 provides a WBG structure 948 of the hybrid component 902. The WBG structure 948 is on the silicon 906. The second PMD sublayer 942b extends over the WBG structure 948, and into the WBG opening 946, if the WBG sidewall 984 and the WBG semiconductor material 944 do not fill the WBG opening 946.

The microelectronic device 900 includes contacts 950 through the second PMD sublayer 942b to the WBG structure 948, and through the second PMD sublayer 942b, the first PMD sublayer 942a and the PMD liner 938 to the metal silicide 936 on the n-type source contact region 934 and the gate electrode 926. The contacts 950 are conductive, and provide electrical connections to the metal silicide 936 on the n-type source contact region 934, the gate electrode 926, and the WBG semiconductor material 944. The contacts 950 may have any of the structures and compositions disclosed in reference to the contacts 150 of FIG. 1. Other compositions and structures for the contacts 950 are within the scope of this example.

The microelectronic device 900 includes interconnects 956 on the contacts 950. The interconnects 956 are conductive. At least one of the interconnects 956 provides an electrical connection to the n-type source contact region 934 through one or more of the contacts 950. Another of the interconnects 956 provides an electrical connection to the WBG semiconductor material 944 through one or more of the contacts 950. Another of the interconnects 956 provides an electrical connection to the gate electrode 926. The interconnects 956 may have any of the structures and compositions disclosed in reference to the interconnects 156 of FIG. 1. Other compositions and structures for the contacts 950 and the interconnects 956 are within the scope of this example.

A combination of at least the n-type source contact region 934, the shallow n-type well 930, the p-type body well 928, and the n-type drift region 920 provide a silicon portion 958 of the hybrid component 902. A combination of the metal silicide 936 on the n-type source contact region 934 and the contact 950 on the metal silicide 936 on the n-type source contact region 934 provides a first current terminal 952 of the hybrid component 902. The first current terminal 952 is on the silicon portion 958 of the hybrid component 902. The contact 950 on the WBG structure 948 provides a second current terminal 954 of the hybrid component 902. Operation of the hybrid component 902 may be similar to the operational details disclosed in reference to the hybrid component 102 of FIG. 1.

Figure 10:
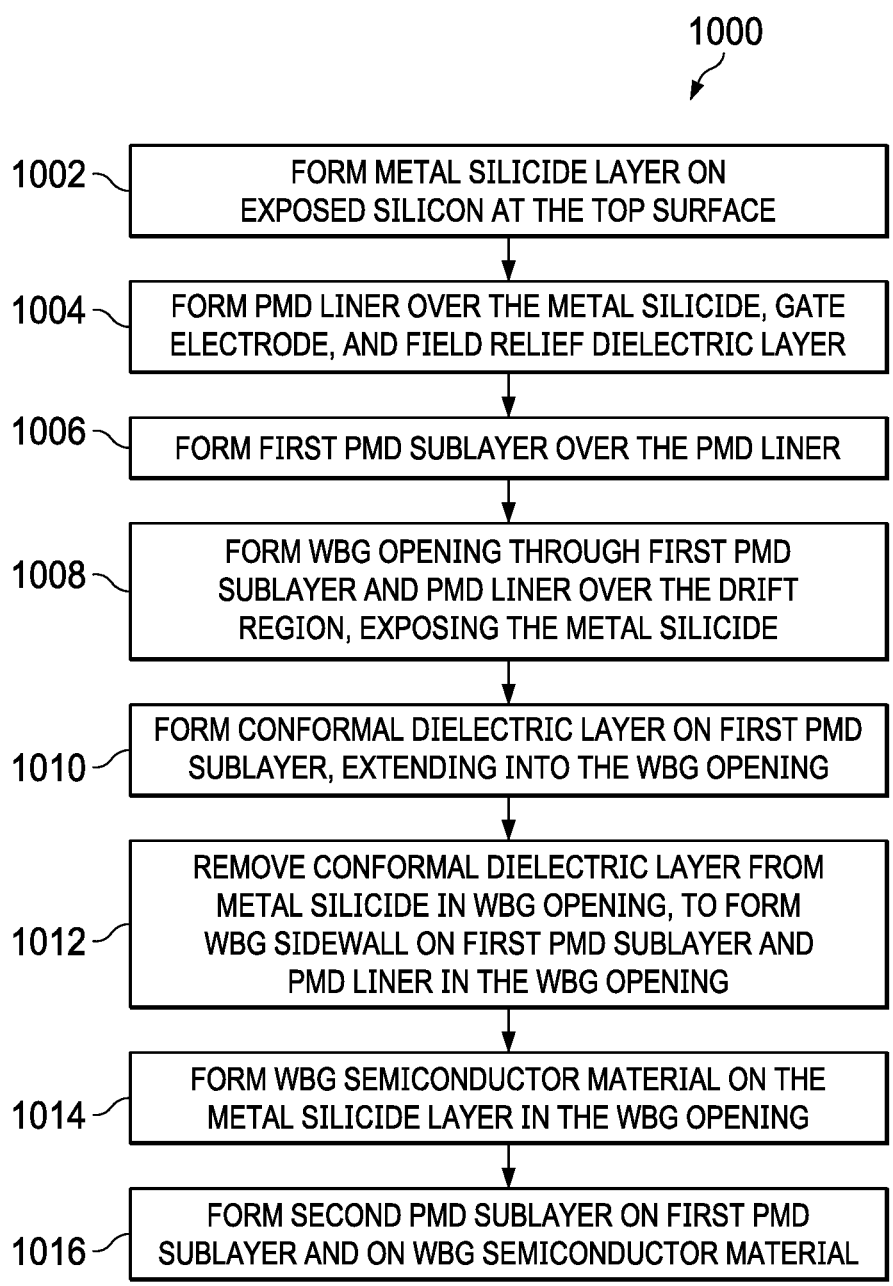
FIG. 10 presents a flowchart of an example method of forming the microelectronic device of FIG. 9.

FIG. 10 presents a flowchart of an example method of forming the microelectronic device 900 of FIG. 9. Structural elements referred to in the steps of the method 1000 are shown in FIG. 9. Fabrication of the microelectronic device 900 includes optionally forming the NBL 908 on the base wafer 910, optionally forming the PBL 914 in the silicon 906, forming the epitaxial layer 912 on the NBL 908, forming the field relief dielectric layer 916 at the top surface 918 of the silicon 906, forming the n-type drift region 920 in the silicon 906, forming the patterned PBL 922 in the epitaxial layer 912, forming the gate dielectric layer 924 on the top surface 918 of the silicon 906, forming the gate electrode 926 on the gate dielectric layer 924, forming the p-type body well 928 in the silicon 906 adjacent to the gate electrode 926, opposite from the n-type drift region 920, and forming the shallow n-type well 930 in the p-type body well 928, forming the sidewall spacers 932 on the gate electrode 926, and forming the n-type source contact region 934 in the silicon 906. These elements may be formed as disclosed in steps 202 through 216 of FIG. 2.

After these elements are formed, the method 1000 includes step 1002, which includes forming the metal silicide 936 on the silicon 906. In this example, the metal silicide 936 is formed at least on the n-type source contact region 934 and on the n-type drift region 920. The metal silicide 936 may optionally be formed on polysilicon in the gate electrode 926. The metal silicide 936 may be formed as disclosed in reference to step 218 of FIG. 2.

The method 1000 continues with step 1004, which includes forming the PMD liner 938 over the microelectronic device 900. The PMD liner 938 covers the metal silicide 936 over an area for the WBG structure 948. The PMD liner 938 may be formed as disclosed in reference to step 220 of FIG. 2.

The method 1000 continues with step 1006, which includes forming the first PMD sublayer 942a over the PMD liner 938. The first PMD sublayer 942a may be formed as disclosed in reference to step 224 of FIG. 2, for forming the PMD layer 142 of FIG. 1.

The method 1000 continues with step 1008, which includes forming the WBG opening 946 through the first PMD sublayer 942a and the PMD liner 938, to expose the metal silicide 936 in the area for the WBG structure 948. The WBG opening 946 may be formed as disclosed in reference to step 226 of FIG. 2.

The method 1000 continues with step 1010, which includes forming a conformal dielectric layer over the first PMD sublayer 942a, extending into the WBG opening 946 along the first PMD sublayer 942a and the PMD liner 938. The conformal dielectric layer includes dielectric material which provides a stable interface with the WBG semiconductor material 944. The conformal dielectric layer may be formed by a PECVD process, for example. The conformal dielectric layer may be 10 nanometers to 200 nanometers thick, by way of example.

The method 1000 continues with step 1012, which includes removing the conformal dielectric layer over the metal silicide 936 in the area for the WBG structure 948, exposing the metal silicide 936, leaving the conformal dielectric layer on the first PMD sublayer 942a and the PMD liner 938 in the WBG opening 946 to form the WBG sidewall 984. The conformal dielectric layer may be removed by an anisotropic etch process such as an RIE process using fluorine radicals.

The method 1000 continues with step 1014, which includes forming the WBG semiconductor material 944 on the metal silicide 936 in the WBG opening 946. The WBG semiconductor material 944 may be formed by any of the processes disclosed in reference to step 228 of FIG. 2, for forming the WBG semiconductor material 144 of FIG. 1.

The method 1000 continues with step 1016, which includes forming the second PMD sublayer 942b over the first PMD sublayer 942a and over the WBG structure 948. The second PMD sublayer 942b may be formed as disclosed in reference to step 224 of FIG. 2, for forming the PMD layer 142 of FIG. 1.

Fabrication of the microelectronic device 900 further includes forming the contacts 950 through the second PMD sublayer 942b to form an electrical connection to the WBG semiconductor material 944, and through second PMD sublayer 942b, the first PMD sublayer 942a, and the PMD liner 938 to form electrical connections to the gate electrode 926 and the n-type source contact region 934. The contacts 950 may be formed as disclosed in reference to step 230 of FIG. 2 of FIG. 1.

Fabrication of the microelectronic device 900 further includes forming the interconnects 956 on the contacts 950. The interconnects 956 may be formed as disclosed in reference to step 232 of FIG. 2, for forming the interconnects 156 on the contacts 150.

Figure 11:
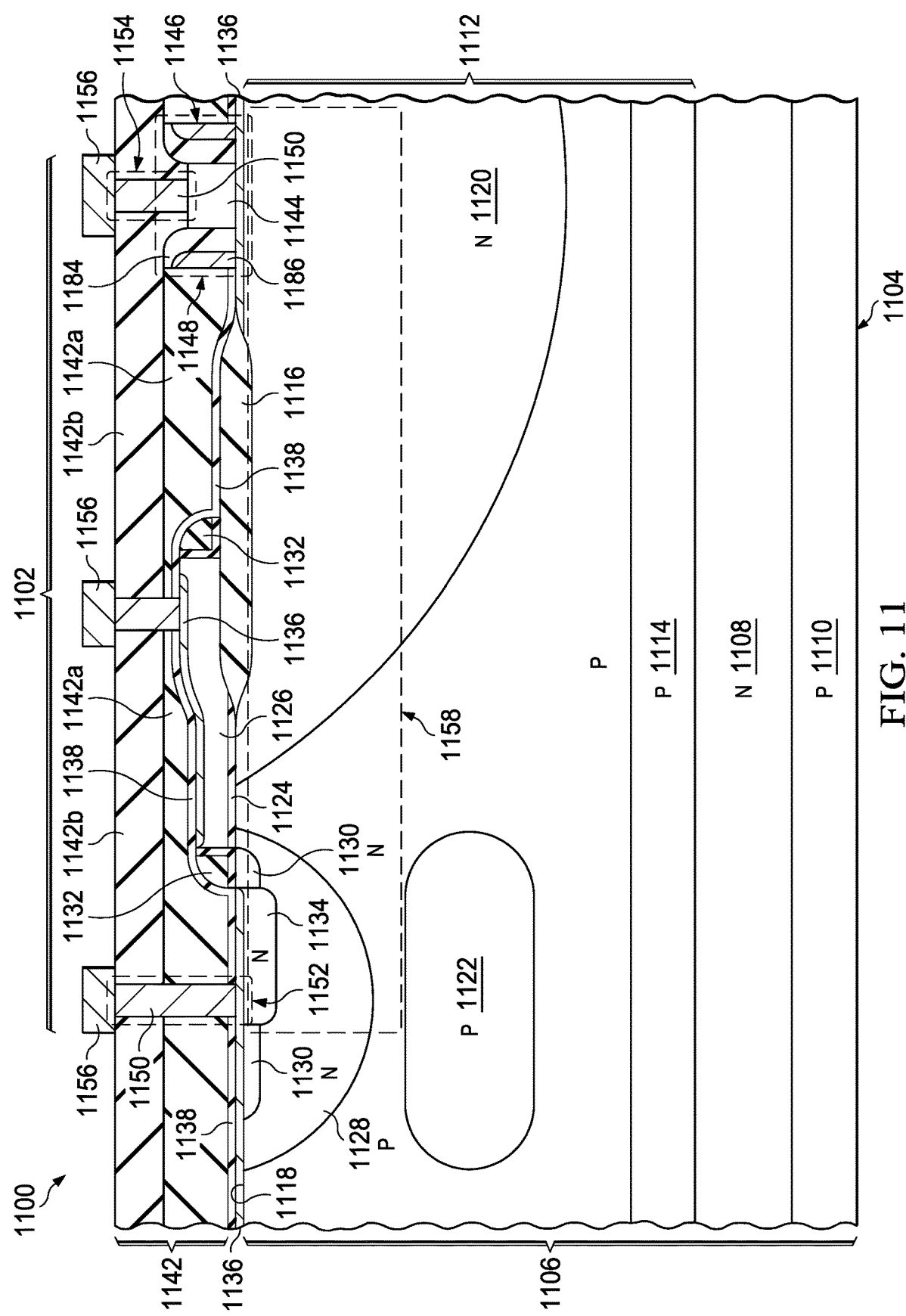
FIG. 11 is a cross section of an example microelectronic device having a hybrid component with a WBG structure having a drain-tied field plate laterally surrounding a WBG semiconductor material.

FIG. 11 is a cross section of an example microelectronic device having a hybrid component with a WBG structure having a drain-tied field plate laterally surrounding a WBG semiconductor material. The microelectronic device 1100 may be manifested as any of the device types disclosed in reference to the microelectronic device 100 of FIG. 1. The hybrid component 1102 of this example is described as an LDMOS transistor, however, other manifestations of the hybrid component 1102 are within the scope of this example. The microelectronic device 1100 includes a substrate 1104 that has silicon semiconductor material 1106, referred to herein as the silicon 1106. The substrate 1104 may be manifested as any of the substrate types disclosed in reference to the substrate 104 of FIG. 1.

The substrate 1104 may include an optional NBL 1108 on a portion of a base wafer 1110. The substrate 1104 may include an epitaxial layer 1112 of silicon on the NBL 1108. In versions of this example in which the substrate 1104 lacks the NBL 1108, the epitaxial layer 1112 may be directly on the base wafer 1110. The substrate 1104 may also include an optional blanket PBL 1114 in the epitaxial layer 1112. The optional NBL 1108, the base wafer 1110, the epitaxial layer 1112, and the optional blanket PBL 1114 may have the dimensions and dopant concentrations disclosed in reference to the NBL 108, the base wafer 110, the epitaxial layer 112, and the PBL 114 of FIG. 1.

The microelectronic device 1100 of this example includes a field relief dielectric layer 1116 at a top surface 1118 of the silicon 1106, extending from a subsequently-formed gate dielectric layer 1124 partway over a subsequently-formed n-type drift region 1120. The field relief dielectric layer 1116 may have the structure and composition disclosed in reference to the field relief dielectric layer 116 of FIG. 1.

The hybrid component 1102 of this example includes the n-type drift region 1120 in the silicon 1106, extending partway under the field relief dielectric layer 1116. The hybrid component 1102 of this example may include a patterned PBL 1122 in the epitaxial layer 1112, under a subsequently-formed p-type body well 1128. The hybrid component 1102 of this example includes a gate dielectric layer 1124 on the top surface 1118 of the silicon 1106, extending from the field relief dielectric layer 1116 partway over subsequently-formed p-type body well 1128. The hybrid component 1102 of this example includes a gate electrode 1126 on the gate dielectric layer 1124 and extending partway over the field relief dielectric layer 1116. The hybrid component 1102 of this example includes the p-type body well 1128 in the silicon 1106. The p-type body well 1128 extends partway under the gate electrode 1126, proximate to the n-type drift region 1120. The hybrid component 1102 of this example further includes a shallow n-type well 1130 in the silicon 1106, surrounded by the p-type body well 1128, extending in the silicon 1106 proximate to an edge of the gate electrode 1126, opposite from the n-type drift region 1120. The hybrid component 1102 of this example may include sidewall spacers 1132 on lateral surfaces of the gate electrode 1126. The hybrid component 1102 of this example includes an n-type source contact region 1134 in the silicon 1106, adjacent to the sidewall spacers 1132, opposite from the n-type drift region 1120. The n-type drift region 1120, the patterned PBL 1122, the gate dielectric layer 1124, the gate electrode 1126, the p-type body well 1128, the shallow n-type well 1130, the sidewall spacers 1132, and the n-type source contact region 1134 may have the properties, dimensions, compositions, and dopant concentrations disclosed in reference to the corresponding elements of FIG. 1.

The hybrid component 1102 of this example includes metal silicide 1136 on the silicon 1106, on the n-type source contact region 1134 and on the n-type drift region 1120. The hybrid component 1102 may further include the metal silicide 1136 on the gate electrode 1126. The metal silicide 1136 may have any of the compositions disclosed in reference to the metal silicide 136 of FIG. 1.

The microelectronic device 1100 includes a PMD liner 1138 formed over the substrate 1104. The microelectronic device 1100 includes a PMD layer 1142 over the PMD liner 1138. The PMD layer 1142 of this example includes a first PMD sublayer 1142a on the PMD liner 1138, and a second PMD sublayer 1142b on the first PMD sublayer 1142a. Each of the first PMD sublayer 1142a and the second PMD sublayer 1142b is non-conductive, and may include one or more sublayers of dielectric material, such as the materials disclosed in reference to the PMD layer 142 of FIG. 1. The first PMD sublayer 1142a may be planarized, as depicted in FIG. 11, or may be conformal. The second PMD sublayer 1142b may have a planar top surface, as depicted in FIG. 11, as a result of the first PMD sublayer 1142a being planarized, or as a result of a planarizing process, such as an oxide CMP process, being applied to the second PMD sublayer 1142b.

The hybrid component 1102 includes a WBG opening 1146 through the first PMD sublayer 1142a and the PMD liner 1138, over the metal silicide 1136 on the n-type drift region 1120. The hybrid component 1102 of this example includes a conformal drain-tied field plate 1186 in the WBG opening 1146, contacting the first PMD sublayer 1142a and the PMD liner 1138, and making electrical contact to the metal silicide 1136 under the WBG opening 1146. The conformal drain-tied field plate 1186 is conductive. The conformal drain-tied field plate 1186 may include one or more metals, such as tungsten, cobalt, titanium, titanium nitride, tantalum, tantalum nitride, or chromium. The conformal drain-tied field plate 1186 may include other conductive material, such as graphene or carbon nanotubes. The conformal drain-tied field plate 1186 may be 10 nanometers to 100 nanometers thick, by way of example. The conformal drain-tied field plate 1186 exposes the metal silicide 1136 on the n-type drift region 1120.

The hybrid component 1102 of this example further includes a WBG sidewall 1184 in the WBG opening 1146, contacting the conformal drain-tied field plate 1186. The WBG sidewall 1184 exposes the metal silicide 1136 on the n-type drift region 1120. The WBG sidewall 1184 is non-conductive, and includes dielectric material which provides a stable interface with a WBG semiconductor material 1144. The WBG sidewall 1184 may include one or more materials disclosed in reference to the WBG sidewall 984 of FIG. 9.

The hybrid component 1102 includes the WBG semiconductor material 1144 in the WBG opening 1146, on the metal silicide 1136 and contacting the WBG sidewall 1184. The WBG semiconductor material 1144 is laterally separated from the conformal drain-tied field plate 1186 by the WBG sidewall 1184. The WBG semiconductor material 1144 may have any of the compositions and structures discussed in reference to the WBG semiconductor material 144 of FIG. 1. The WBG semiconductor material 1144 has a lateral dimension adjacent to the silicon 1106 that is no greater than 10 times a thickness of the WBG semiconductor material 1144 in at least one lateral direction.

A combination of the conformal drain-tied field plate 1186, the WBG sidewall 1184, the WBG semiconductor material 1144, and the metal silicide 1136 between the WBG semiconductor material 1144 and the n-type drift region 1120 provides a WBG structure 1148 of the hybrid component 1102. The WBG structure 1148 is on the silicon 1106. The second PMD sublayer 1142b extends over the WBG structure 1148, and into the WBG opening 1146, if the WBG sidewall 1184 and the WBG semiconductor material 1144 do not fill the WBG opening 1146.

The microelectronic device 1100 includes contacts 1150 through the second PMD sublayer 1142b to the WBG structure 1148, and through the second PMD sublayer 1142b, the first PMD sublayer 1142a and the PMD liner 1138 to the metal silicide 1136 on the n-type source contact region 1134 and the gate electrode 1126. The contacts 1150 are conductive, and provide electrical connections to the metal silicide 1136 on the n-type source contact region 1134, the gate electrode 1126, and the WBG semiconductor material 1144. The contacts 1150 may have any of the structures and compositions disclosed in reference to the contacts 150 of FIG. 1. Other compositions and structures for the contacts 1150 are within the scope of this example.

The microelectronic device 1100 includes interconnects 1156 on the contacts 1150. The interconnects 1156 are conductive. At least one of the interconnects 1156 provides an electrical connection to the n-type source contact region 1134 through one or more of the contacts 1150. Another of the interconnects 1156 provides an electrical connection to the WBG semiconductor material 1144 through one or more of the contacts 1150. Another of the interconnects 1156 provides an electrical connection to the gate electrode 1126. The interconnects 1156 may have any of the structures and compositions disclosed in reference to the interconnects 156 of FIG. 1. Other compositions and structures for the contacts 1150 and the interconnects 1156 are within the scope of this example.

A combination of at least the n-type source contact region 1134, the shallow n-type well 1130, the p-type body well 1128, and the n-type drift region 1120 provide a silicon portion 1158 of the hybrid component 1102. A combination of the metal silicide 1136 on the n-type source contact region 1134 and the contact 1150 on the metal silicide 1136 on the n-type source contact region 1134 provides a first current terminal 1152 of the hybrid component 1102. The first current terminal 1152 is on the silicon portion 1158 of the hybrid component 1102. The contact 1150 on the WBG structure 1148 provides a second current terminal 1154 of the hybrid component 1102. Operation of the hybrid component 1102 may be similar to the operational details disclosed in reference to the hybrid component 102 of FIG. 1.

Figure 12:
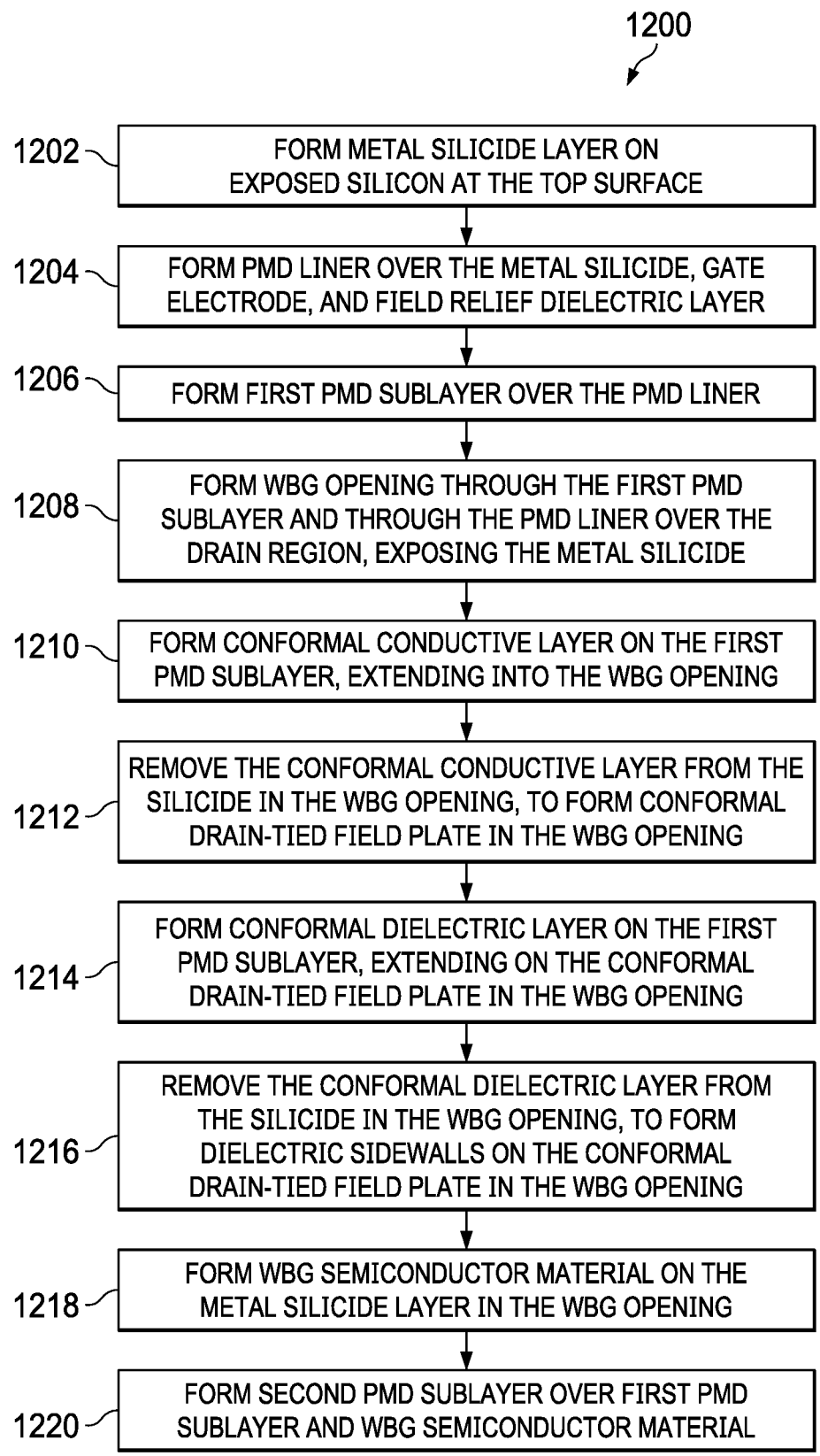
FIG. 12 presents a flowchart of an example method of forming the microelectronic device of FIG. 11.

FIG. 12 presents a flowchart of an example method of forming the microelectronic device 1100 of FIG. 11. Structural elements referred to in the steps of the method 1200 are shown in FIG. 11. Fabrication of the microelectronic device 1100 includes optionally forming the NBL 1108 on the base wafer 1110, optionally forming the PBL 1114 in the silicon 1106, forming the epitaxial layer 1112 on the NBL 1108, forming the field relief dielectric layer 1116 at the top surface 1118 of the silicon 1106, forming the n-type drift region 1120 in the silicon 1106, forming the patterned PBL 1122 in the epitaxial layer 1112, forming the gate dielectric layer 1124 on the top surface 1118 of the silicon 1106, forming the gate electrode 1126 on the gate dielectric layer 1124, forming the p-type body well 1128 in the silicon 1106 adjacent to the gate electrode 1126, opposite from the n-type drift region 1120, and forming the shallow n-type well 1130 in the p-type body well 1128, forming the sidewall spacers 1132 on the gate electrode 1126, and forming the n-type source contact region 1134 in the silicon 1106. These elements may be formed as disclosed in steps 202 through 216 of FIG. 2.

After these elements are formed, the method 1200 includes step 1202, which includes forming the metal silicide 1136 on the silicon 1106. In this example, the metal silicide 1136 is formed at least on the n-type source contact region 334 and on the n-type drift region 1120. The metal silicide 1136 may optionally be formed on polysilicon in the gate electrode 1126. The metal silicide 1136 may be formed as disclosed in reference to step 218 of FIG. 2.

The method 1200 continues with step 1204, which includes forming the PMD liner 1138 over the microelectronic device 1100. The PMD liner 1138 covers the metal silicide 1136 over an area for the WBG structure 1148. The PMD liner 1138 may be formed as disclosed in reference to step 220 of FIG. 2.

The method 1200 continues with step 1206, which includes forming the first PMD sublayer 1142*a* over the PMD liner 1138. The first PMD sublayer 1142*a* may be formed as disclosed in reference to step 224 of FIG. 2, for forming the PMD layer 142 of FIG. 1.

The method 1200 continues with step 1208, which includes forming the WBG opening 1146 through the first PMD sublayer 1142*a* and the PMD liner 1138, to expose the metal silicide 1136 in the area for the WBG structure 1148. The WBG opening 1146 may be formed as disclosed in reference to step 226 of FIG. 2.

The method 1200 continues with step 1210, which includes forming a conformal conductive layer, not explicitly shown, over the first PMD sublayer 1142*a*, extending into the WBG opening 1146 along the first PMD sublayer 1142*a* and the PMD liner 1138. The conformal conductive layer may be formed by a physical deposition process, such as a sputter process or an evaporation process, or by a chemical process, such as an MOCVD process or a plating process.

The method 1200 continues with step 1212, which includes removing the conformal conductive layer over the metal silicide 1136 in the area for the WBG structure 1148, exposing the metal silicide 1136, leaving the conformal conductive layer on the first PMD sublayer 1142*a* and the PMD liner 1138 in the WBG opening 1146 to form the conformal drain-tied field plate 1186. The conformal conductive layer may be removed by an anisotropic etch process such as an ion milling process using argon ions, for example.

The method 1200 continues with step 1214, which includes forming a conformal dielectric layer over the first PMD sublayer 1142*a*, extending into the WBG opening 1146 along the conformal drain-tied field plate 1186. The conformal dielectric layer includes dielectric material which provides a stable interface with the WBG semiconductor material 1144. The conformal dielectric layer may be formed by a PECVD process, for example. The conformal dielectric layer may be 10 nanometers to 200 nanometers thick, by way of example.

The method 1200 continues with step 1216, which includes removing the conformal dielectric layer over the metal silicide 1136 in the area for the WBG structure 1148, exposing the metal silicide 1136, leaving the conformal dielectric layer on the conformal drain-tied field plate 1186 in the WBG opening 1146 to form the WBG sidewall 1184. The conformal dielectric layer may be removed as disclosed in reference to step 1012 of FIG. 10.

The method 1200 continues with step 1218, which includes forming the WBG semiconductor material 1144 on the metal silicide 1136 in the WBG opening 1146. The WBG semiconductor material 1144 may be formed by any of the processes disclosed in reference to step 228 of FIG. 2, for forming the WBG semiconductor material 144 of FIG. 1.

The method 1200 continues with step 1220, which includes forming the second PMD sublayer 1142*b* over the first PMD sublayer 1142*a* and over the WBG structure 1148.

Fabrication of the microelectronic device 1100 further includes forming the second PMD sublayer 1142*b* over the first PMD sublayer 1142*a* and over the WBG structure 1148. The second PMD sublayer 1142*b* may be formed as disclosed in reference to step 224 of FIG. 2, for forming the PMD layer 142 of FIG. 1.

Fabrication of the microelectronic device 1100 further includes forming the contacts 1150 through the second PMD sublayer 1142*b* to form an electrical connection to the WBG semiconductor material 1144, and through second PMD sublayer 1142*b*, the first PMD sublayer 1142*a*, and the PMD liner 1138 to form electrical connections to the gate electrode 1126 and the n-type source contact region 1134. The contacts 1150 may be formed as disclosed in reference to step 230 of FIG. 2.

Fabrication of the microelectronic device 1100 further includes forming the interconnects 1156 on the contacts 1150. The interconnects 1156 may be formed as disclosed in reference to step 232 of FIG. 2, for forming the interconnects 156 on the contacts 150 of FIG. 1.

Figure 13:
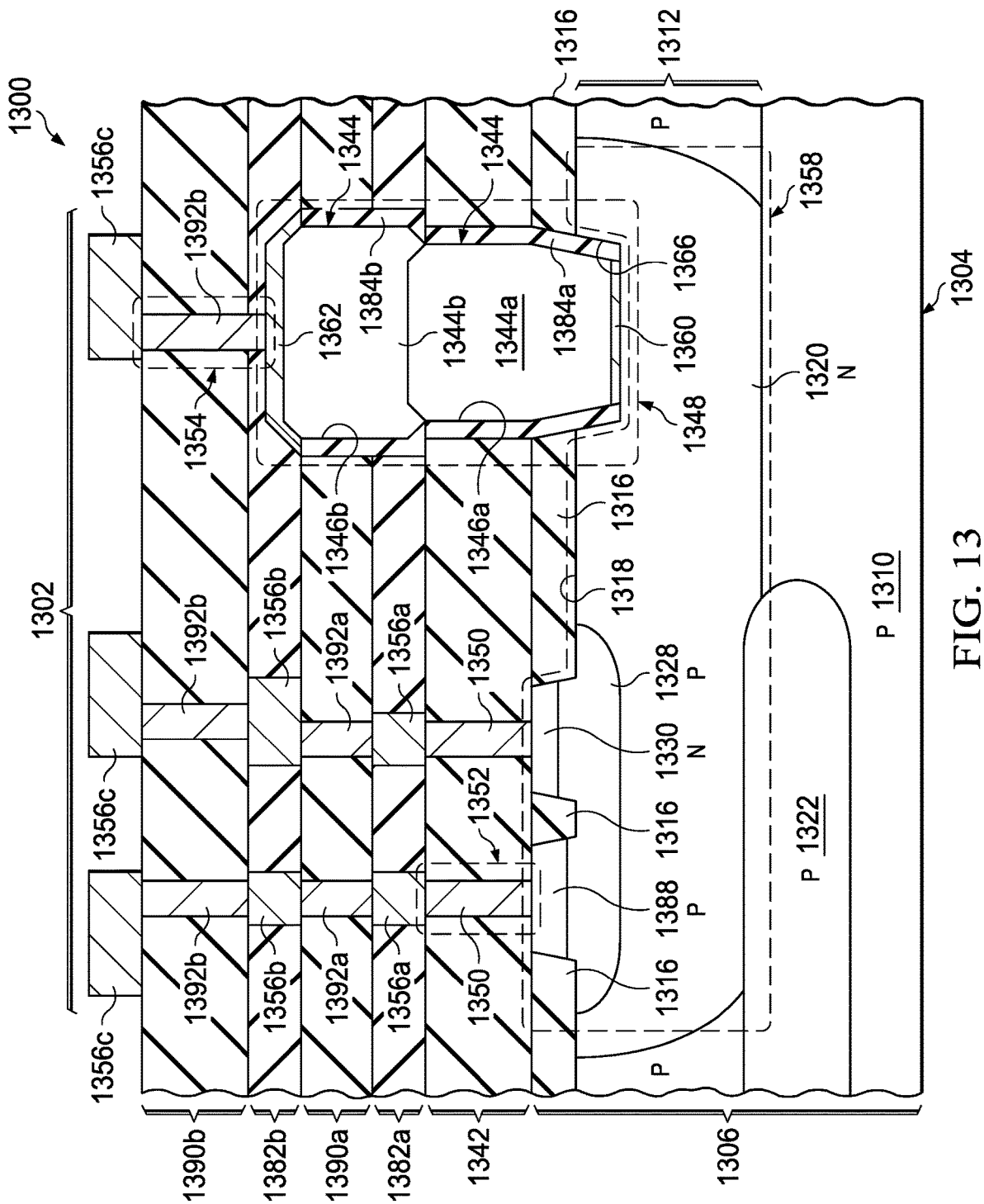
FIG. 13 is a cross section of an example microelectronic device having a hybrid component with a WBG structure having a first WBG semiconductor material in a recess in silicon semiconductor material and a second WBG semiconductor material on the first WBG semiconductor material.

FIG. 13 is a cross section of an example microelectronic device having a hybrid component with a WBG structure having a first WBG semiconductor material in a recess in silicon semiconductor material and a second WBG semiconductor material on the first WBG semiconductor material. The microelectronic device 1300 may be manifested as any of the device types disclosed in reference to the microelectronic device 100 of FIG. 1. The hybrid component 1302 of this example is described as an NPN bipolar transistor, however, other manifestations of the hybrid component 1302 are within the scope of this example. The microelectronic device 1300 includes a substrate 1304 that has silicon semiconductor material 1306, referred to herein as the silicon 1306. The substrate 1304 may be manifested as any of the substrate types disclosed in reference to the substrate 104 of FIG. 1.

The substrate 1304 of this example may include a portion of a base wafer 1310 in the silicon 1306, having p-type conductivity. The base wafer 1310 may have an average dopant concentration of $1 \times 10^{14}$ atoms/cm³ to $1 \times 10^{17}$ atoms/cm³, by way of example. The substrate 1304 may also include a patterned PBL 1322 contacting the base wafer 1310. The patterned PBL 1322 may have an average dopant concentration more than twice the average dopant concentration of the base wafer 1310. The substrate 1304 may further include an epitaxial layer 1312 on the base wafer 1310, extending over the patterned PBL 1322. In this example, the epitaxial layer 1312 may be p-type, and may be 2 microns to 8 microns thick, for example. The epitaxial layer 1312 may have an average dopant concentration of $1 \times 10^{15}$ atoms/cm³ to $1 \times 10^{17}$ atoms/cm³, by way of example. The epitaxial layer 1312 extends to a top surface 1318 of the silicon 1306. The top surface 1318 may not be planar in this example.

The hybrid component 1302 of this example includes an n-type drift region 1320 in the epitaxial layer 1312. The n-type drift region 1320 extends to the top surface 1318 of the silicon 1306. In this example, the n-type drift region 1320 may have an average dopant concentration of $4 \times 10^{16}$ atoms/cm³ to $1 \times 10^{17}$ atoms/cm³, by way of example. The n-type drift region 1320 provides a portion of a collector of the hybrid component 1302.

The microelectronic device 1300 includes a field relief dielectric layer 1316 at a top surface 1318 of the silicon 1306, extending over a portion of the n-type drift region 1320. The field relief dielectric layer 1316 may have an STI structure, with the field relief dielectric layer 1316 located in an isolation trench in the silicon 1306, as depicted in FIG. 13. Other configurations for the field relief dielectric layer 1316 are within the scope of this example.

The hybrid component 1302 of this example includes a p-type base well 1328 in the silicon 1306. The p-type base well 1328 may be laterally surrounded by the n-type drift region 1320, as depicted in FIG. 13. The p-type base well 1328 may have an average dopant concentration of $1 \times 10^{15}$ atoms/cm³ to $1 \times 10^{16}$ atoms/cm³, by way of example.

The hybrid component 1302 of this example includes a p-type base contact region 1388 in the silicon 1306, surrounded by the p-type base well 1328. The p-type base contact region 1388 has a higher average dopant concentration than the p-type base well 1328, to provide a reduced resistance connection to the p-type base well 1328.

The hybrid component 1302 of this example includes an n-type emitter 1330 in the silicon 1306, surrounded by the p-type base well 1328. The n-type emitter 1330 may have an average dopant concentration of $1 \times 10^{18}$ atoms/cm³ to $1 \times 10^{20}$ atoms/cm³, by way of example.

The hybrid component 1302 of this example may include a recess 1366 in the silicon 1306 in the n-type drift region 1320, laterally spaced from the p-type base well 1328. The recess 1366 may extend to a depth of 100 nanometers to 1 micron into the silicon 1306, for example. The hybrid component 1302 may include an interface layer 1360 on the silicon 1306 in the recess 1366. The interface layer 1360 may include any of the materials disclosed in reference to the interface layer 360 of FIG. 3. The n-type drift region 1320 may have a retrograde dopant profile which has a peak of n-type dopants in the silicon 1306 near a bottom of the recess 1366, which may advantageously reduce a resistance of the hybrid component 1302 in an on state.

The microelectronic device 1300 includes a PMD layer 1342 over the top surface 1318 of the silicon 1306. The PMD layer 1342 may have any of the compositions and layer structures disclosed in reference to the PMD liner 138 and the PMD layer 142 of FIG. 1. The microelectronic device 1300 further includes contacts 1350 through the PMD layer 1342, on the p-type base contact region 1388 and the n-type emitter 1330. The contacts 1350 are conductive, and may have any of the compositions and structures disclosed in reference to the contacts 150 of FIG. 1.

The microelectronic device 1300 of this example includes a first IMD layer 1382a on the PMD layer 1342. The microelectronic device 1300 of this example further includes first interconnects 1356a in the first IMD layer 1382a, on the contacts 1350.

The microelectronic device 1300 of this example includes a first inter-level (ILD) layer 1390a on the first IMD layer 1382a. The first ILD layer 1390a is non-conductive, and may include one or more sublayers of dielectric material, including a silicon dioxide layer and a cap layer of silicon nitride, silicon carbide, or silicon carbonitride. The microelectronic device 1300 of this example further includes first vias 1392a through the first ILD layer 1390a, on the first interconnects 1356a. The first vias 1392a are conductive, and may include tungsten, aluminum, or copper, for example.

The microelectronic device 1300 of this example includes a second IMD layer 1382b on the first ILD layer 1390a. The microelectronic device 1300 of this example further includes second interconnects 1356b in the second IMD layer 1382b, on the first vias 1392a. The microelectronic device 1300 of this example includes a second ILD layer 1390b on the second IMD layer 1382b. The microelectronic device 1300 of this example further includes second vias 1392b through the second ILD layer 1390b, on the second interconnects 1356b. The microelectronic device 1300 of this example further includes third interconnects 1356c on the second vias 1392b.

The first IMD layer 1382a and the second IMD layer 1382b are non-conductive, and may have any of the compositions and structures disclosed in reference to the IMD layer 782 of FIG. 7. The second ILD layer 1390b is non-conductive, and may have a similar composition and structure as the first ILD layer 1390a. The first interconnects 1356a, the second interconnects 1356b, and the third interconnects 1356c are conductive, and may have any of the compositions and structures disclosed in reference to the interconnects 156 of FIG. 1. The second vias 1392b are conductive, and may have a similar composition and structure as the first vias 1392a.

The hybrid component 1302 includes a WBG semiconductor material 1344 on the interface layer 1360, if present, in the recess 1366, if present. The WBG semiconductor material 1344 of this example may include a first WBG semiconductor material 1344a in a first WBG opening 1346a through the PMD layer 1342. The WBG semiconductor material 1344 of this example may further include a second WBG semiconductor material 1344b on the first WBG semiconductor material 1344a, in a second WBG opening 1346b through the first IMD layer 1382a and the first ILD layer 1390a. The hybrid component 1302 may include a first WBG sidewall 1384a in the first WBG opening 1346a, between the PMD layer 1342 and the first WBG semiconductor material 1344a. The hybrid component 1302 may also include a second WBG sidewall 1384b in the second WBG opening 1346b, between the first IMD layer 1382a and the second WBG semiconductor material 1344b, and between the first ILD layer 1390a and the second WBG semiconductor material 1344b. The first WBG sidewall 1384a and the second WBG sidewall 1384b are non-conductive, and may accrue the advantage disclosed in reference to the WBG sidewall 984 of FIG. 9. The hybrid component 1302 of this example may include a WBG contact layer 1362 on the WBG semiconductor material 1344, that is, on the second WBG semiconductor material 1344b, to provide a low resistance connection to the WBG semiconductor material 1344. The WBG contact layer 1362 is located opposite from the silicon 1306. The WBG contact layer 1362 may have the composition and structure disclosed for the WBG contact layer 362 of FIG. 3. At least one of the second vias 1392b makes a connection to the WBG semiconductor material 1344 through the WBG contact layer 1362.

A combination of the WBG semiconductor material 1344, including the first WBG semiconductor material 1344a and the second WBG semiconductor material 1344b, the interface layer 1360, the first WBG sidewall 1384a and the second WBG sidewall 1384b, and the WBG contact layer 1362 provides a WBG structure 1348 of the hybrid component 1302. The WBG structure 1348 is on the silicon 1306. The WBG semiconductor material 1344 has a lateral dimension adjacent to the silicon 1306 that is no greater than 10 times a thickness of the WBG semiconductor material 1344 or 10 times a depth of the recess 1366, whichever is greater, in at least one lateral direction. The second IMD layer 1382b may extend over the WBG structure 1348, as depicted in FIG. 13. A combination of at least the n-type drift region 1320, the p-type base well 1328, and the n-type emitter 1330 provide a silicon portion 1358 of the hybrid component 1302. The contact 1350 on the n-type emitter 1330 provides a first current terminal 1352 of the hybrid component 1302. The contact 1350 on the WBG structure 1348 provides a second current terminal 1354 of the hybrid component 1302.

The microelectronic device 1300 may be operated with the p-type base well 1328 biased above threshold, so that the hybrid component 1302 is in an on state, in which case current may flow between the first current terminal 1352 and the second current terminal 1354, through the silicon portion 1358 and the WBG structure 1348. Also, the microelectronic device 1300 may be operated with the p-type base well 1328 biased below threshold, so that the hybrid component 1302 is in an off state, in which case the second current terminal 1354 of the hybrid component 1302 may be biased at a high potential, for example, 30 volts to 1000 volts, with respect to the first current terminal 1352, without causing the silicon 1306 in the n-type drift region 1320 to break down. In the off state, the WBG semiconductor material 1344 may be depleted and thereby accommodate a significant portion of the potential difference between the second current terminal 1354 and the first current terminal 1352. The hybrid component 1302 may accrue the advantage of a smaller area compared to an all-silicon component operating at the same potential difference. The hybrid component 1302 of this example may be used to switch a high voltage input in a power circuit, or may be used to modulate a high voltage sensor input, by way of example. Inclusion of the first WBG semiconductor material 1344a and the second WBG semiconductor material 1344b in the WBG semiconductor material 1344 may enable the hybrid component 1302 to operate at a higher potential between the first current terminal 1352 and the second current terminal 1354 than would be possible with the first WBG semiconductor material 1344a alone.

Figure 14:
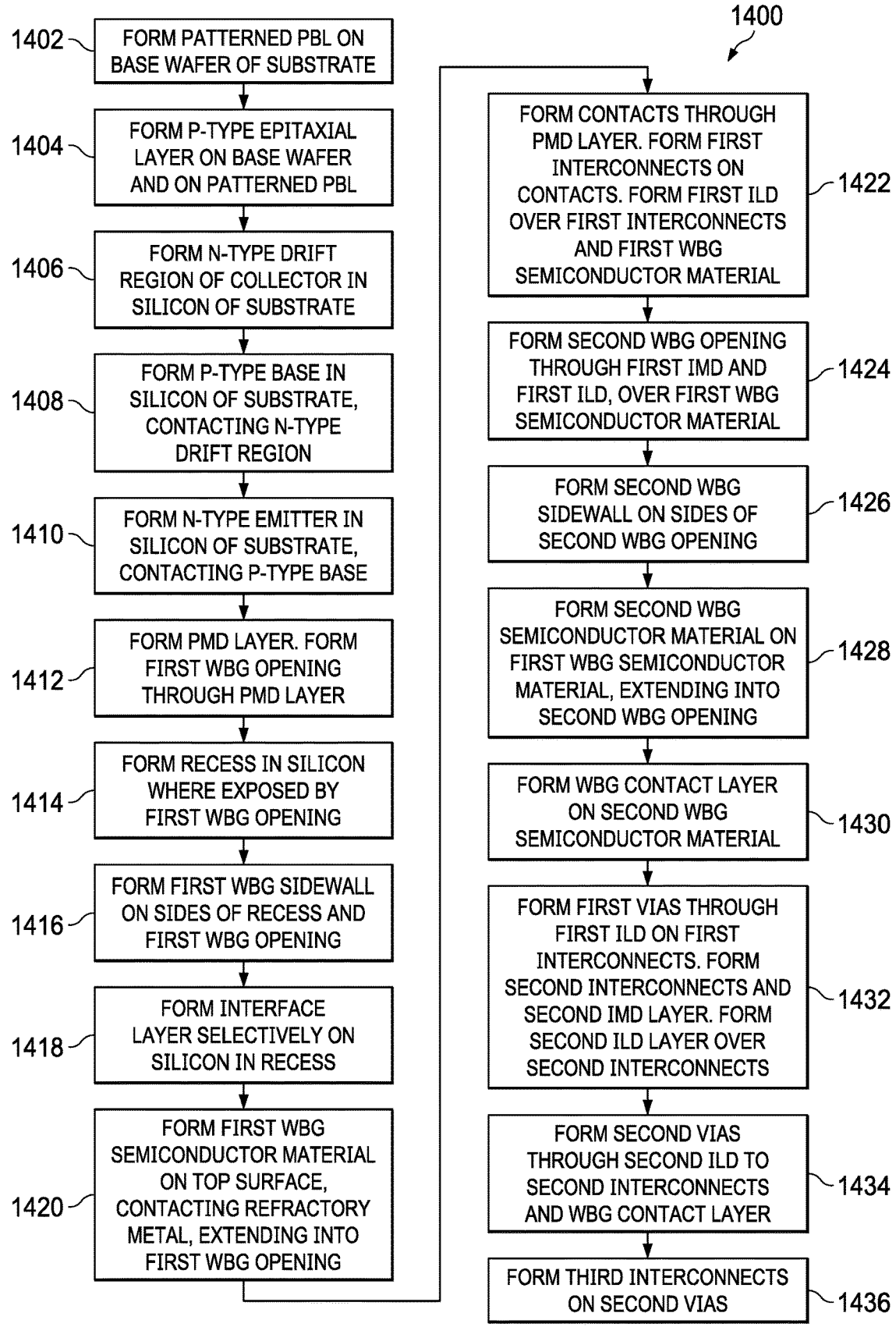
FIG. 14 presents a flowchart of an example method of forming the microelectronic device of FIG. 13.

FIG. 14 presents a flowchart of an example method of forming the microelectronic device 1300 of FIG. 13. Structural elements referred to in the steps of the method 1400 are shown in FIG. 13. The method 1400 includes step 1402, which includes forming the patterned PBL 1322 on the base wafer 1310. The patterned PBL 1322 may be formed by a process similar to the process disclosed in reference to step 202 of FIG. 2 for forming the patterned PBL 122 of FIG. 1.

The method 1400 continues with step 1404, which includes forming the epitaxial layer 1312 on the base wafer 1310, extending over the patterned PBL 1322. The epitaxial layer 1312 may be formed by a process similar to the process disclosed in reference to step 202 of FIG. 2 for forming the epitaxial layer 112 of FIG. 1.

The method 1400 continues with step 1406, which includes forming the n-type drift region 1320 in the silicon 1306. The n-type drift region 1320 may be formed by a process similar to the process disclosed in reference to step 202 of FIG. 2 for forming the n-type drift region 120 of FIG. 1, with appropriate adjustments in doses of the implanted n-type dopants.

The method 1400 continues with step 1408, which includes forming the p-type base well 1328 in the silicon 1306. The p-type base well 1328 may be formed using an implant mask, not explicitly shown, and implanting boron for the p-type base well 1328 into the epitaxial layer 1312 where exposed by the implant mask. The boron may be implanted at a dose of $1 \times 10^{11}$ ions/cm$^2$ to $2 \times 10^{12}$ ions/cm$^2$, by way of example. After the boron is implanted, the substrate 1304 is heated to diffuse and activate the implanted boron.

The method 1400 continues with step 1410, which includes forming the n-type emitter 1330 in the silicon 1306, surrounded by the p-type base well 1328. The n-type emitter 1330 may be formed using an implant mask, not explicitly shown, and implanting phosphorus, arsenic, or antimony for the n-type emitter 1330 into the p-type base well 1328 where exposed by the implant mask. The phosphorus, arsenic, or antimony may be implanted at a total dose of $1 \times 10^{14}$ ions/cm$^2$ to $1 \times 10^{16}$ ions/cm$^2$, by way of example. After the phosphorus, arsenic, or antimony is implanted, the substrate 1304 is heated by a rapid thermal process or a flash anneal to activate the implanted boron.

The method 1400 continues with step 1412, which includes forming the PMD layer 1342 over the top surface 1318 of the silicon 1306. The PMD layer 1342 may be formed as disclosed in reference to steps 220 and 224 of FIG. 2 for forming the PMD liner 138 and the PMD layer 142 of FIG. 1.

Step 1412 further includes forming the first WBG opening 1346a through the PMD layer 1342. The first WBG opening 1346a may be formed as disclosed in reference to step 226 of FIG. 2 for forming the WBG opening 146 of FIG. 1.

The method 1400 continues with step 1414, which includes forming the recess 1366 in the silicon 1306 in the n-type drift region 1320 where exposed by the first WBG opening 1346a. The recess 1366 may be formed by any combination of wet etch processes and dry etch processes. The wet etch processes may include an isotropic wet etch step using a planar etch, or an anisotropic wet etch step using a faceting etch, as disclosed in reference to step 614 of FIG. 6 for forming the shallow recess 566 of FIG. 5. The dry etch processes may include an RIE process using fluorine ions, a downstream plasma or ICP etch process using fluorine radicals, or a vapor phase etch process using xenon difluoride.

The method 1400 continues with step 1416, which includes forming the first WBG sidewall 1384a in the first WBG opening 1346a. The first WBG sidewall 1384a is formed to expose the silicon 1306 at a bottom of the recess 1366. The first WBG sidewall 1384a may be formed by forming a conformal dielectric layer extending into the first WBG opening 1346a, and subsequently removing the conformal dielectric layer from the silicon 1306 at the bottom of the recess 1366 with an anisotropic etch process. The anisotropic etch process may be followed by an isotropic etch process of the silicon 1306 at the bottom of the recess 1366, to reduce lattice damage caused by the anisotropic etch process.

The method 1400 continues with step 1418, which includes forming the interface layer 1360 selectively on the silicon 1306 at the bottom of the recess 1366. The interface layer 1360 may be formed by an MOCVD process using metal organic reagents such as dicobalt octacarbonyl with an ammonia inhibitor or cyclopentadienylcobalt dicarbonyl with ultraviolet irradiation, to prevent or reduce nucleation of cobalt on the first WBG sidewall 1384a, by way of example. Other methods for forming the interface layer 1360 are within the scope of step 1418.

The method 1400 continues with step 1420, which includes forming the first WBG semiconductor material 1344a on the interface layer 1360, surrounded by the first WBG sidewall 1384a. The first WBG semiconductor material 1344a may be formed as disclosed in reference to step 228 of FIG. 2 for forming the WBG semiconductor material 144 of FIG. 1.

The method 1400 continues with step 1422, which includes forming the contacts 1350 through the PMD layer 1342. The contacts 1350 may be formed as disclosed in reference to step 230 of FIG. 2 for forming the contacts 150 of FIG. 1.

Step 1422 also includes forming the first interconnects 1356a and the first IMD layer 1382a on the PMD layer 1342. The first interconnects 1356a may be formed as disclosed in reference to step 232 of FIG. 2 for forming the interconnects 156 of FIG. 1. For versions of step 1422 in which the first interconnects 1356a are formed by an etched aluminum process, the first IMD layer 1382a may be formed after the first interconnects 1356a are formed. For versions of step 1422 in which the first interconnects 1356a are formed by a damascene process, the first IMD layer 1382a may be formed prior to forming the first interconnects 1356a. For versions of step 1422 in which the first interconnects 1356a are formed by a plated interconnect process, the first IMD layer 1382a may be formed after the first interconnects 1356a are formed. The first IMD layer 1382a may be formed by depositing one or more layers of dielectric material, and optionally planarizing the one or more layers by a dielectric CMP process.

Step 1422 also includes forming the first ILD layer 1390a on the first IMD layer 1382a. The first ILD layer 1390a may be formed by depositing one or more layers of dielectric material, including silicon dioxide-based dielectric material or low-k dielectric material, optionally planarizing the one or more layers by a dielectric CMP process, followed by a cap layer of silicon nitride, silicon carbonitride, or silicon carbide.

The method 1400 continues with step 1424, which includes forming the second WBG opening 1346b through the first ILD layer 1390a and the first IMD layer 1382a to expose the first WBG semiconductor material 1344a. The second WBG opening 1346b may be formed by one or more RIE processes using fluorine ions, to remove the various dielectric layers of the first ILD layer 1390a and the first IMD layer 1382a. A downstream plasma process or ICP process may be used to remove the last portion of the first IMD layer 1382a over the first WBG semiconductor material 1344a, to reduce damage to the first WBG semiconductor material 1344a.

The method 1400 continues with step 1426, which includes forming the second WBG sidewall 1384b in the second WBG opening 1346b. The second WBG sidewall 1384b may be formed by a process similar to the process used to form the first WBG sidewall 1384a. The first WBG semiconductor material 1344a is exposed by the second WBG sidewall 1384b.

The method 1400 continues with step 1428, which includes forming the second WBG semiconductor material 1344b in the second WBG opening 1346b on the first WBG semiconductor material 1344a. The second WBG semiconductor material 1344b may be formed by a process similar to the process used to form the first WBG semiconductor material 1344a. Reagent gas flows may be adjusted to provide a different composition in the second WBG semiconductor material 1344b compared to the first WBG semiconductor material 1344a.

The method 1400 continues with step 1430, which includes forming the WBG contact layer 1362 on the second WBG semiconductor material 1344b. The WBG contact layer 1362 may be formed as disclosed in reference to step 418 of FIG. 4 for forming the WBG contact layer 362 of FIG. 3.

The method 1400 continues with step 1432, which includes forming the first vias 1392a through the first ILD layer 1390a, on the first interconnects 1356a. The first vias 1392a may be formed by a damascene process with a titanium-containing liner and a tungsten fill metal, by a damascene process with a barrier liner and electroplated copper fill metal, by a sputter process with an adhesion layer and a sputtered aluminum fill metal, or by a selective cobalt deposition process, by way of example.

Step 1432 also includes forming the second interconnects 1356b and the second IMD layer 1382b, over the first ILD layer 1390a. The second interconnects 1356b and the second IMD layer 1382b may be formed by processes similar to the processes used to form the first interconnects 1356a and the first IMD layer 1382a, as disclosed in reference to step 1422. The second interconnects 1356b make connections to the first vias 1392a. The second IMD layer 1382b may extend over the WBG structure 1348, as depicted in FIG. 13.

Step 1432 further includes forming the second ILD layer 1390b over the second interconnects 1356b and the second IMD layer 1382b. The second ILD layer 1390b may be formed by a process similar to the process used to form the first ILD layer 1390a.

The method 1400 continues with step 1434, which includes forming the second vias 1392b through the second ILD layer 1390b. The second vias 1392b make connections to the second interconnects 1356b and to the WBG structure 1348, as depicted in FIG. 13. The second vias 1392b may be formed by a process similar to the process used to form the first vias 1392a.

The method 1400 continues with step 1436, which includes forming the third interconnects 1356c on the second vias 1392b. The third interconnects 1356c may be formed by processes similar to the processes used to form the second interconnects 1356b. Alternatively, if the third interconnects 1356c have larger pitches than the second interconnects 1356b, the third interconnects 1356c may be formed by different processes, such as plated copper processes, which are more suitable for the larger pitches. A third IMD layer, not explicitly shown, may be formed between the third interconnects 1356c, prior to forming the third interconnects 1356c, or may be formed after forming the third interconnects 1356c.

Figure 15:
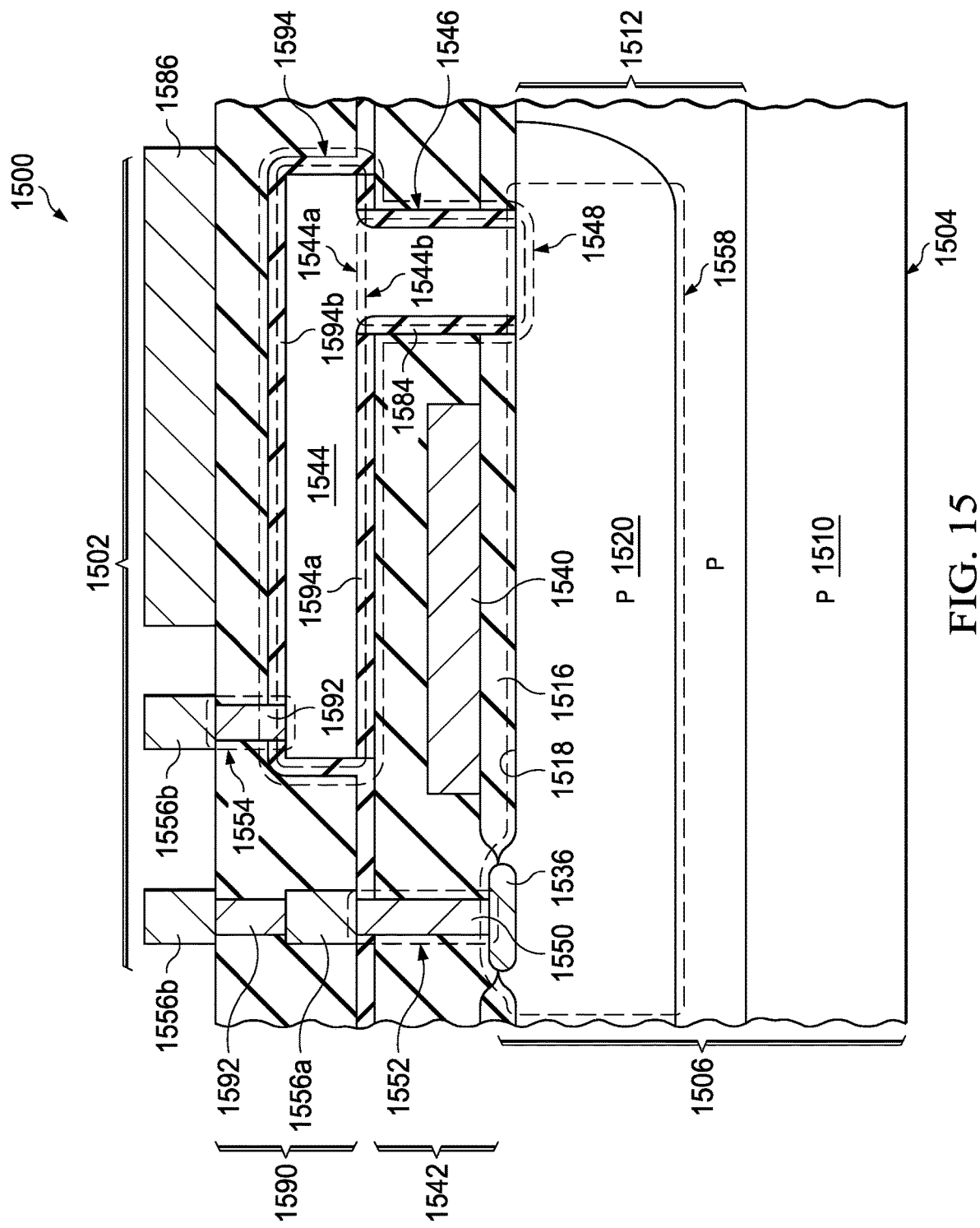
FIG. 15 is a cross section of a further example microelectronic device having a hybrid component with a WBG structure having a WBG semiconductor material including a vertical segment on silicon semiconductor material and a lateral segment on the vertical segment.

FIG. 15 is a cross section of a further example microelectronic device having a hybrid component with a WBG structure having a WBG semiconductor material including a vertical segment on silicon semiconductor material and a lateral segment on the vertical segment. The microelectronic device 1500 may be manifested as any of the device types disclosed in reference to the microelectronic device 100 of FIG. 1. The hybrid component 1502 of this example is described as a Schottky diode, however, other manifestations of the hybrid component 1502 are within the scope of this example. The microelectronic device 1500 includes a substrate 1504 that has silicon semiconductor material 1506, referred to herein as the silicon 1506. The substrate 1504 may be manifested as any of the substrate types disclosed in reference to the substrate 104 of FIG. 1.

The substrate 1504 of this example may include a portion of a base wafer 1510 in the silicon 1506, having p-type conductivity. The base wafer 1510 may have an average dopant concentration of $1\times10^{14}$ atoms/cm$^3$ to $1\times10^{16}$ atoms/cm$^3$, by way of example. The substrate 1504 may include an epitaxial layer 1512 on the base wafer 1510. In this example, the epitaxial layer 1512 may be p-type, and may be 2 microns to 8 microns thick, for example. The epitaxial layer 1512 may have an average dopant concentration of $1\times10^{15}$ atoms/cm$^3$ to $1\times10^{17}$ atoms/cm$^3$, by way of example. The epitaxial layer 1512 extends to a top surface 1518 of the silicon 1506. The top surface 1518 may not be planar in this example.

The hybrid component 1502 of this example includes an n-type drift region 1520 in the epitaxial layer 1512. The n-type drift region 1520 extends to the top surface 1518 of the silicon 1506. In this example, the n-type drift region 1520 may have an average dopant concentration of $1\times10^{16}$ atoms/cm$^3$ to $1\times10^{17}$ atoms/cm$^3$, by way of example. The n-type drift region 1520 provides a portion of a cathode of the hybrid component 1502.

The microelectronic device 1500 includes a field relief dielectric layer 1516 at a top surface 1518 of the silicon 1506, extending over at least a portion of the n-type drift region 1520. The field relief dielectric layer 1516 may have a LOCOS structure, with tapered edges, as depicted in FIG. 15. Other configurations for the field relief dielectric layer 1516 are within the scope of this example.

The hybrid component 1502 of this example includes metal silicide 1536 on the silicon 1506, contacting the n-type drift region 1520. The metal silicide 1536 may include any of the materials disclosed in reference to the metal silicide 136 of FIG. 1. The metal silicide 1536 provides an anode of the hybrid component 1502.

The hybrid component 1502 of this example may include a lower field plate 1540 over the field relief dielectric layer 1516, extending over at least a portion of the n-type drift region 1520. The lower field plate 1540 is conductive, and may include polysilicon or metal, for example.

The microelectronic device 1500 includes a first dielectric layer 1542 over the lower field plate 1540, if present, the silicon 1506, the field relief dielectric layer 1516, and the metal silicide 1536. The first dielectric layer 1542 may have a composition and structure similar to a combination of the PMD liner 138 and the PMD layer 142 of FIG. 1. The microelectronic device 1500 also includes a second dielectric layer 1590 over the first dielectric layer 1542. The second dielectric layer 1590 may have a composition and structure similar to a combination of the first IMD layer 1382a and the first ILD layer 1390a of FIG. 13.

The hybrid component 1502 include a WBG structure 1548 on the silicon 1506. The WBG structure 1548 includes a WBG semiconductor material 1544. In this example, the WBG semiconductor material 1544 may include a vertical segment 1544a on the silicon 1506, and a lateral segment 1544b on the vertical segment 1544a. The vertical segment 1544a may be located in a WBG opening 1546 that extends through the first dielectric layer 1542. In this example, the vertical segment 1544a of the WBG semiconductor material 1544 has a lateral dimension adjacent to the silicon 1506 that is no greater than 10 times a thickness of the WBG semiconductor material 1544, in at least one lateral direction. The lateral segment 1544b extends laterally past the vertical segment 1544a in at least one direction, for example above the n-type drift region 1520 toward the metal silicide 1536.

The vertical segment 1544a of the WBG semiconductor material 1544 may be separated from the first dielectric layer 1542 by a WBG sidewall 1584 which extends from the silicon 1506 to a top of the WBG opening 1546. The WBG sidewall 1584 may include any of the materials disclosed in reference to the WBG sidewall 984 of FIG. 9. The lateral segment 1544b may be separated from the first dielectric layer 1542 and the second dielectric layer 1590 by a passivation sheath 1594 that may advantageously provide chemical stability at surfaces of the lateral segment 1544b. The passivation sheath 1594 may have a composition similar to the composition of the WBG sidewall 1584. The passivation sheath 1594 may include a lower sheath segment 1594a between the lateral segment 1544b and the first dielectric layer 1542. The passivation sheath 1594 may further include an upper sheath segment 1594b between the lateral segment 1544b and the second dielectric layer 1590.

The hybrid component 1502 of this example may include an upper field plate 1586 over the second dielectric layer 1590, extending over at least a portion of the lateral segment 1544b. The upper field plate 1586 is conductive.

The microelectronic device 1500 includes one or more contacts 1550 extending through the first dielectric layer 1542. At least one of the contacts 1550 makes a connection to the metal silicide 1536 of the anode of the hybrid component 1502. The microelectronic device 1500 also includes one or more first interconnects 1556a in the second dielectric layer 1590, on the contacts 1550. The microelectronic device 1500 also includes vias 1592 through portions of the second dielectric layer 1590, on the first interconnects 1556a and on the WBG structure 1548. The microelectronic device 1500 further includes second interconnects 1556b over the second dielectric layer 1590, on the vias 1592. The upper field plate 1586 and the second interconnects 1556b may have a same composition and structure, as a result of being formed concurrently.

A combination of the WBG semiconductor material 1544, including the vertical segment 1544a and the lateral segment 1544b, the WBG sidewall 1584, and the passivation sheath 1594, including the lower sheath segment 1594a and the upper sheath segment 1594b, provides a WBG structure 1548 of the hybrid component 1502. The WBG structure 1548 is on the silicon 1506. A combination of the n-type drift region 1520 and the metal silicide 1536 provides a silicon portion 1558 of the hybrid component 1502. The contact 1550 on the metal silicide 1536 provides a first current terminal 1552 of the hybrid component 1502. The via 1592 on the WBG structure 1548 provides a second current terminal 1554 of the hybrid component 1502.

The microelectronic device 1500 may be operated with the second current terminal 1554 biased negatively with respect to the first current terminal 1552, so that the Schottky diode of the hybrid component 1502 is in a forward bias state, in which case a forward bias current may flow between the first current terminal 1552 and the second current terminal 1554, through the silicon portion 1558 and the WBG structure 1548. The forward bias current may be limited by other elements, not explicitly shown, in the microelectronic device 1500.

Also, the microelectronic device 1500 may be operated with the second current terminal 1554 biased positively with respect to the first current terminal 1552, so that the Schottky diode of the hybrid component 1502 is in a reverse bias state, in which case a leakage current, significantly less than the forward bias current, may flow between the first current terminal 1552 and the second current terminal 1554, through the silicon portion 1558 and the WBG structure 1548. In this reverse bias state, the second current terminal 1554 of the hybrid component 1502 may be biased at a high potential, for example, 30 volts to 1000 volts, with respect to the first current terminal 1552, without causing the silicon 1506 in the n-type drift region 1520 to break down. In the reverse bias state, the WBG semiconductor material 1544 may be depleted and thereby accommodate a significant portion of the potential difference between the second current terminal 1554 and the first current terminal 1552. The hybrid component 1502 may accrue the advantage of a smaller area compared to an all-silicon component operating at the same potential difference. The lower field plate 1540 and the upper field plate 1586 may be biased to reduce an electric field in the WBG semiconductor material 1544, which may advantageously enable a larger potential difference to be applied between the second current terminal 1554 and the first current terminal 1552. Inclusion of the vertical segment 1544a and the lateral segment 1544b in the WBG semiconductor material 1544 may enable the hybrid component 1502 to operate at a higher potential between the first current terminal 1552 and the second current terminal 1554 than would be possible with the vertical segment 1544a alone.

Figure 16:
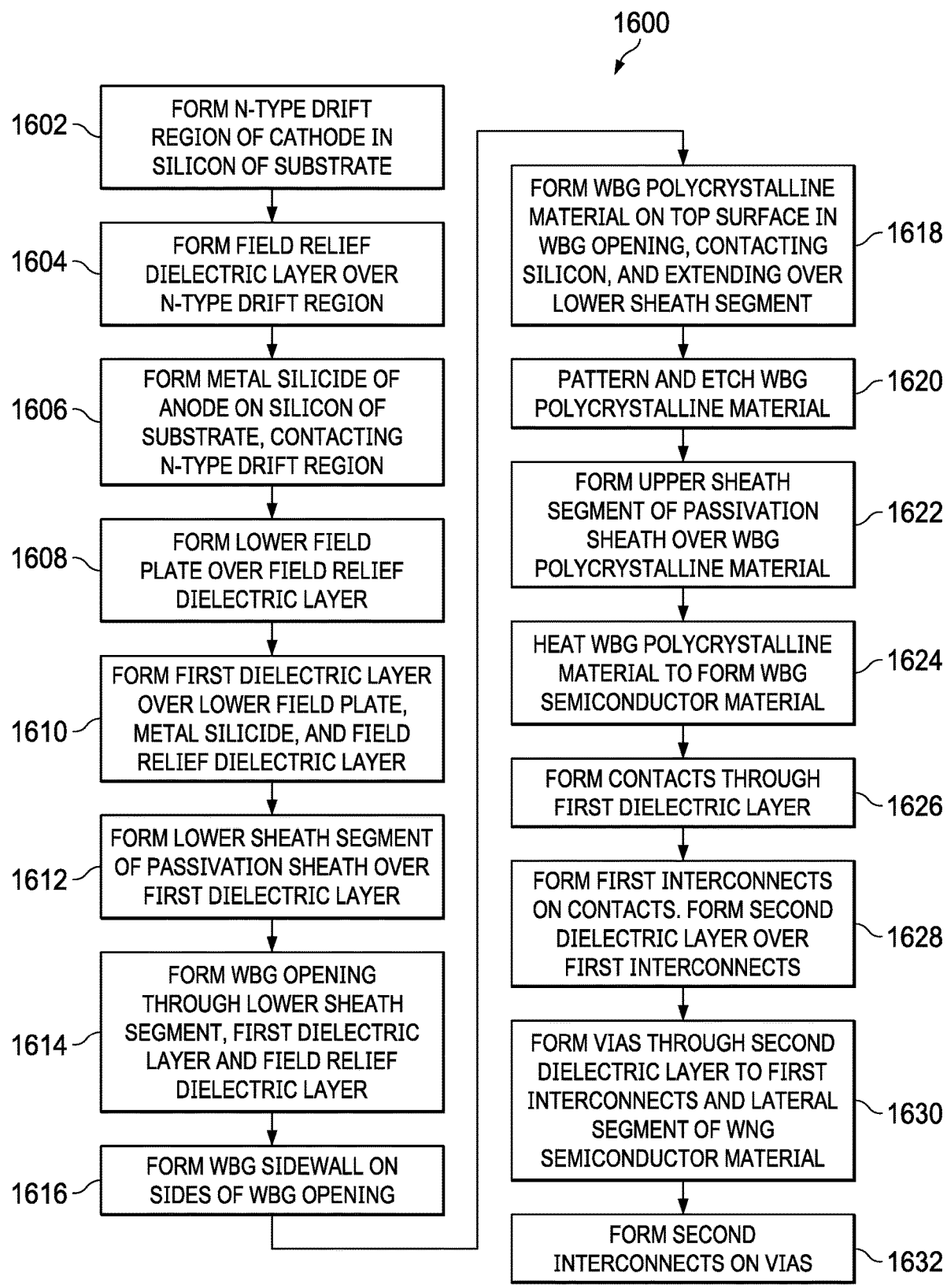
FIG. 16 presents a flowchart of an example method of forming the microelectronic device of FIG. 15.

FIG. 16 presents a flowchart of an example method of forming the microelectronic device 1500 of FIG. 15. Structural elements referred to in the steps of the method 1600 are shown in FIG. 15. The method 1600 includes step 1602, which includes forming the n-type drift region 1520 of the cathode in the epitaxial layer 1512. The n-type drift region 1520 may be formed as disclosed in reference to step 206 of FIG. 2 for forming the n-type drift region 120 of FIG. 1.

The method 1600 continues with step 1604, which includes forming the field relief dielectric layer 1516 at a top surface 1518 of the silicon 1506. The field relief dielectric layer 1516 may be formed by a LOCOS process, as indicated in FIG. 15, may be formed by an STI process, or may be formed by another process.

The method 1600 continues with step 1606, which includes forming the metal silicide 1536 on the silicon 1506. The metal silicide 1536 may be formed as disclosed in reference to step 218 of FIG. 2 for forming the metal silicide 136 of FIG. 1.

The method 1600 continues with step 1608, which includes forming the lower field plate 1540 over the field relief dielectric layer 1516. The lower field plate 1540 may include polysilicon or other gate material, and may be formed concurrently with gates, not explicitly shown, of the microelectronic device 1500. Alternatively, the lower field plate 1540 may include metal, such as aluminum, and may be formed by forming a layer of metal over the field relief dielectric layer 1516, and patterning the metal using an etch mask with an RIE process or a wet etch process.

The method 1600 continues with step 1610, which includes forming the first dielectric layer 1542 over the lower field plate 1540, the silicon 1506, the field relief dielectric layer 1516, and the metal silicide 1536. The first dielectric layer 1542 may be formed as disclosed in reference to steps 220 and 224 of FIG. 2 for forming the PMD liner 138 and the PMD layer 142 of FIG. 1.

The method 1600 continues with step 1612, which includes forming the lower sheath segment 1594a of the passivation sheath 1594 on the first dielectric layer 1542. The lower sheath segment 1594a may be formed by forming a layer of dielectric material suitable for the lower sheath segment 1594a, not explicitly shown, on the first dielectric layer 1542. The layer of dielectric material may be formed by a PECVD process using BTBAS, for example.

Following formation of the layer of dielectric material suitable for the lower sheath segment 1594a, the method 1600 continues with step 1614, which includes forming the WBG opening 1546 through the layer of dielectric material suitable for the lower sheath segment 1594a, the first dielectric layer 1542, and the field relief dielectric layer 1516. The WBG opening 1546 may be formed by a sequence of RIE processes that are specific for the materials in the stack of the layer of dielectric material, the first dielectric layer 1542, and the field relief dielectric layer 1516. The WBG opening 1546 exposes the silicon 1506, in this example.

Following formation of the WBG opening 1546, the method 1600 continues with step 1616, which includes forming the WBG sidewall 1584 on sides of the WBG opening 1546, contacting the first dielectric layer 1542 and the field relief dielectric layer 1516. The WBG sidewall 1584 may be formed as disclosed in reference to step 1012 of FIG. 10, for forming the WBG sidewall 984 of FIG. 9.

The method 1600 continues with step 1618, which includes forming WBG polycrystalline material, not explicitly shown, on the layer of dielectric material suitable for the lower sheath segment 1594a and extending into the WBG opening 1546, contacting the silicon 1506. The WBG polycrystalline material may be formed by a PVD process, such as a sputter process or an evaporation process, by an MOCVD process, by a PECVD process, or by a sol-gel spin coat process, for example. The WBG polycrystalline material may have a stoichiometry equal to a desired stoichiometry of the WBG semiconductor material 1544.

Following formation of the WBG polycrystalline material, the method 1600 continues with step 1620, which includes patterning and etching the WBG polycrystalline material. Step 1620 may include forming an etch mask, not explicitly shown, over the WBG polycrystalline material, and removing the WBG polycrystalline material where exposed by the etch mask. The WBG polycrystalline material may be removed by a wet etch process, by a plasma etch process, or a combination of both. A portion or all of the layer of dielectric material suitable for the lower sheath segment 1594a may be removed as well, leaving the layer of dielectric material suitable for the lower sheath segment 1594a under the remaining WBG polycrystalline material to form the lower sheath segment 1594a. The etch mask is subsequently removed, for example, by an asher process.

The method 1600 continues with step 1622, which includes forming the upper sheath segment 1594b of the passivation sheath 1594 on the WBG polycrystalline material. The upper sheath segment 1594b may have a similar composition to the lower sheath segment 1594a, and may be formed by a similar process. A combination of the upper sheath segment 1594b, the lower sheath segment 1594a, and the WBG sidewall 1584 may surround the WBG polycrystalline material, reducing loss of material from the WBG polycrystalline material during a subsequent recrystallization process.

After forming the upper sheath segment 1594b, the method 1600 continues with step 1624, which includes heating the WBG polycrystalline material in the recrystallization process to form the WBG semiconductor material 1544. The WBG polycrystalline material may be heated by a furnace process, which may advantageously provide a low cost per device process, compared to localized or rapid heating processes. Alternatively, the WBG polycrystalline material may be heated by a rapid thermal process, which may advantageously limit degradation of the silicon portion 1558 of the hybrid component 1502 compared to longer duration heating processes. In another option, the WBG polycrystalline material may be heated by a localized optical heat source such as a laser or focused LED, which may further limit degradation of the silicon portion 1558 of the hybrid component 1502 by heating primarily the WBG polycrystalline material and limiting heating of surrounding areas of the microelectronic device 1500. The recrystallization process may advantageously form a low resistance connection between the WBG semiconductor material 1544 and the silicon 1506.

The method 1600 continues with step 1626, which includes forming the contacts 1550 through the first dielectric layer 1542. The contacts 1550 may be formed as disclosed in reference to step 230 of FIG. 2 for forming the contacts 150 of FIG. 1. In an alternate version of method 1600, the contacts 1550 may be formed prior to the recrystallization process of step 1624.

After the contacts 1550 are formed, the method 1600 continues with step 1628, which includes forming the first interconnects 1556a and forming the second dielectric layer 1590. In one version of method 1600, the first interconnects 1556a may be formed by an etched aluminum process or by a plated interconnect process, and the second dielectric layer 1590 may be formed after the first interconnects 1556a. In alternate versions of method 1600, the first interconnects 1556a may be formed by a damascene process, and the second dielectric layer 1590 may be formed prior to forming the first interconnects 1556a.

The method 1600 continues with step 1630, which includes forming the vias 1592 through portions of the second dielectric layer 1590, on the first interconnects 1556 and on the WBG structure 1548. The vias 1592 may be formed as disclosed in reference to step 1432 or step 1434 of FIG. 14 for forming the first vias 1392a or second vias 1392b of FIG. 13.

The method 1600 continues with step 1632, which includes forming the second interconnects 1556b over the second dielectric layer 1590, on the vias 1592. The second interconnects 1556b may be formed by a process sequence similar to the process sequence used to form the first interconnects 1556a. The process sequence used to form the second interconnects 1556b may include forming a third dielectric layer, not explicitly shown, of the microelectronic device 1500 over the second dielectric layer 1590.

Figure 17:
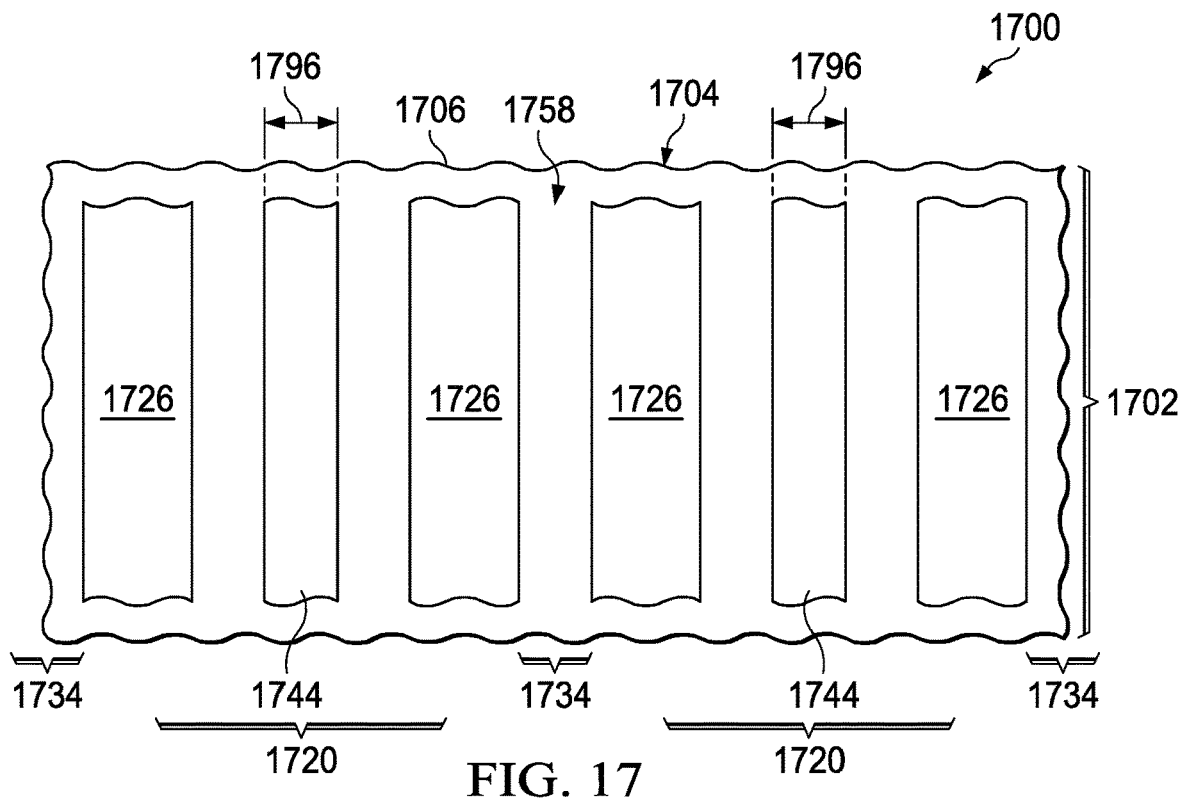
FIG. 17 is a top view of an example microelectronic device having a hybrid component with a WBG structure having a WBG semiconductor material in rows across the hybrid component.

FIG. 17 is a top view of an example microelectronic device having a hybrid component with a WBG structure having a WBG semiconductor material in rows across the hybrid component. The microelectronic device 1700 may be manifested as any of the device types disclosed in reference to the microelectronic device 100 of FIG. 1. The hybrid component 1702 of this example is described as a DEMOS transistor, however, other manifestations of the hybrid component 1702 are within the scope of this example. The microelectronic device 1700 includes a substrate 1704 that has silicon semiconductor material 1706, referred to herein as the silicon 1706. The substrate 1704 may be manifested as any of the substrate types disclosed in reference to the substrate 104 of FIG. 1.

The hybrid component 1702 of this example includes an n-type drift region 1720 in the silicon 1706, configured in rows. The hybrid component 1702 of this example has a linear array configuration. The hybrid component 1702 includes a gate electrode 1726 over the silicon 1706, and an n-type source contact region 1734 in the silicon 1706, configured in rows adjacent to the gate electrode 1726, opposite from the n-type drift region 1720. The n-type drift region 1720 and the n-type source contact region 1734 are parts of a silicon portion 1758 of the hybrid component 1702.

The hybrid component 1702 includes a WBG semiconductor material 1744 which extends in rows across the hybrid component 1702, over the n-type drift region 1720. The WBG semiconductor material 1744 has a lateral dimension 1796 adjacent to the silicon 1706 that is no greater than 10 times a thickness of the WBG semiconductor material 1744 or 10 times a depth of a recess in the silicon 1706 in which the WBG semiconductor material 1744 is formed, whichever is greater, in at least one lateral direction. In this example, the WBG semiconductor material 1744 may extend more than the lateral dimension 1796, in another lateral direction that is perpendicular to the lateral dimension 1796, as depicted in FIG. 17. Having the WBG semiconductor material 1744 with the lateral dimension 1796 adjacent to the silicon 1706 less than the lateral dimension 1796 in at least one lateral direction may advantageously facilitate forming the WBG semiconductor material 1744 in a monocrystalline state, due to limited buildup of lattice mismatch with respect to the silicon 1706 over the lateral dimension 1796.

Figure 18:
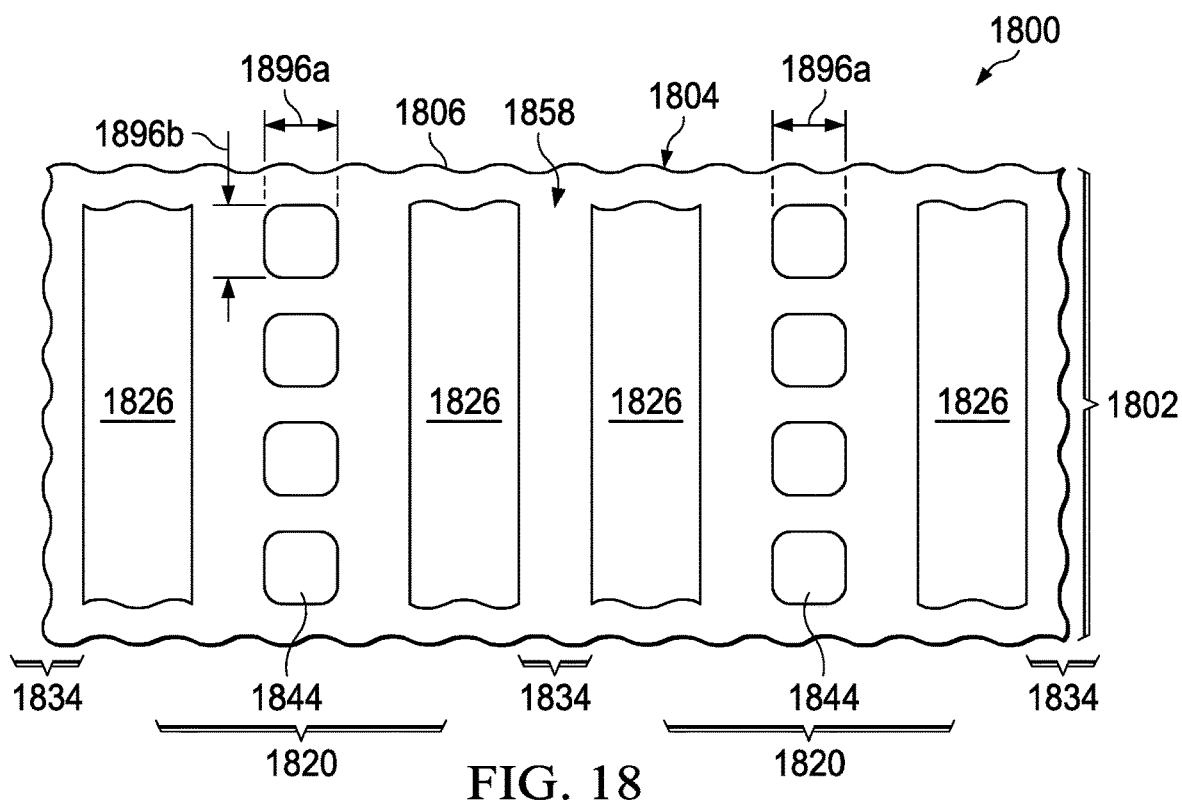
FIG. 18 is a top view of an example microelectronic device having a hybrid component with a WBG structure having a WBG semiconductor material configured as islands across the hybrid component.

FIG. 18 is a top view of an example microelectronic device having a hybrid component with a WBG structure having a WBG semiconductor material configured as islands across the hybrid component. The microelectronic device 1800 may be manifested as any of the device types disclosed in reference to the microelectronic device 100 of FIG. 1. The hybrid component 1802 of this example is described as a DEMOS transistor, however, other manifestations of the hybrid component 1802 are within the scope of this example. The microelectronic device 1800 includes a substrate 1804 that has silicon semiconductor material 1806, referred to herein as the silicon 1806. The substrate 1804 may be manifested as any of the substrate types disclosed in reference to the substrate 104 of FIG. 1.

The hybrid component 1802 of this example has a linear array configuration. The hybrid component 1802 of this example includes an n-type drift region 1820 in the silicon 1806, a gate electrode 1826 over the silicon 1806, and an n-type source contact region 1834 in the silicon 1806, all configured in rows, as depicted in FIG. 18. The n-type drift region 1820 and the n-type source contact region 1834 are parts of a silicon portion 1858 of the hybrid component 1802.

The hybrid component 1802 includes a WBG semiconductor material 1844 which is formed as islands across the hybrid component 1802, over the n-type drift region 1820. In this example, the silicon 1806 between the islands of the WBG semiconductor material 1844 is part of the n-type drift region 1820. The WBG semiconductor material 1844 has a first lateral dimension 1896a adjacent to the silicon 1806 that is no greater than 10 times a thickness of the WBG semiconductor material 1844 or 10 times a depth of a recess in the silicon 1806 in which the WBG semiconductor material 1844 is formed, whichever is greater, in a first lateral direction. In this example, the WBG semiconductor material 1844 has a second lateral dimension 1896*b* adjacent to the silicon 1806 that is no greater than 10 times a thickness of the WBG semiconductor material 1844 or 10 times a depth of a recess in the silicon 1806 in which the WBG semiconductor material 1844 is formed, whichever is greater, in a second lateral direction, perpendicular to the first lateral direction, as depicted in FIG. 18. Having the WBG semiconductor material 1844 with the two lateral dimensions 1896*a* and 1896*b* adjacent to the silicon 1806 no greater than 10 times a thickness of the WBG semiconductor material 1844 or 10 times a depth of a recess in the silicon 1806, whichever is greater, in two lateral directions may advantageously facilitate forming the WBG semiconductor material 1844 in a monocrystalline state, due to limited buildup of lattice mismatch with respect to the silicon 1806 over the two lateral dimensions 1896*a* and 1896*b*. The islands of the WBG semiconductor material 1844 may be located close together, for example within a few microns, advantageously enabling a high current density through the WBG semiconductor material 1844 while maintaining low defects due to lattice mismatch.

Figure 19:
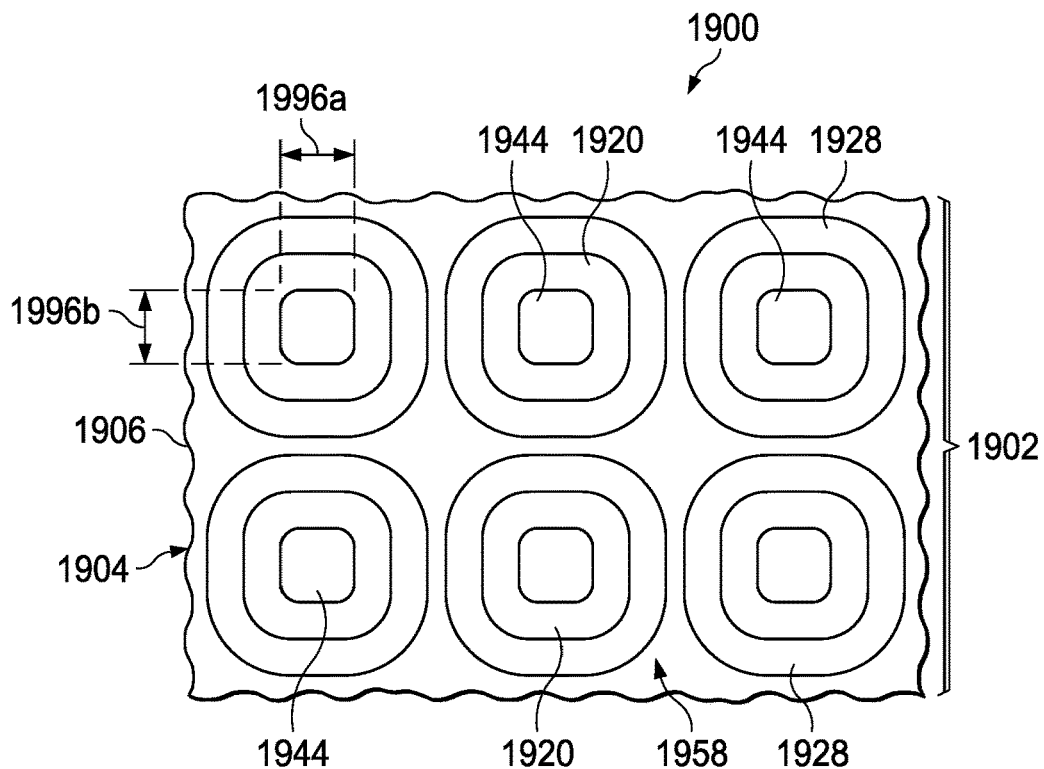
FIG. 19 is a top view of an example microelectronic device having a hybrid component with a WBG structure including a WBG semiconductor material configured as islands surrounded by separate drift region in silicon semiconductor material, in a rectangular array.

FIG. 19 is a top view of an example microelectronic device having a hybrid component with a WBG structure including a WBG semiconductor material configured as islands surrounded by separate drift region in silicon semiconductor material, in a rectangular array. The microelectronic device 1900 may be manifested as any of the device types disclosed in reference to the microelectronic device 100 of FIG. 1. The hybrid component 1902 of this example is described as a bipolar junction transistor, however, other manifestations of the hybrid component 1902 are within the scope of this example. The microelectronic device 1900 includes a substrate 1904 that has silicon semiconductor material 1906, referred to herein as the silicon 1906. The substrate 1904 may be manifested as any of the substrate types disclosed in reference to the substrate 104 of FIG. 1.

The hybrid component 1902 of this example has a two dimensional rectangular array configuration. The hybrid component 1902 includes a WBG semiconductor material 1944 which is formed as islands across the hybrid component 1902. The hybrid component 1902 of this example includes an n-type drift region 1920 in the silicon 1906, laterally surrounding each of the islands of the WBG semiconductor material 1944. The n-type drift region 1920 is part of a collector of the hybrid component 1902.

The hybrid component 1902 includes a p-type base well 1928 in the silicon 1906, laterally surrounding each of the islands of the WBG semiconductor material 1944, and laterally separated from the islands by the n-type drift region 1920. The n-type drift region 1920 and the p-type base well 1928 are part of a silicon portion 1958 of the hybrid component 1902. The silicon portion 1958 laterally surrounds each of the islands of the WBG semiconductor material 1944, in this example. The WBG semiconductor material 1944 has a first lateral dimension 1996*a* adjacent to the silicon 1906 that is no greater than 10 times a thickness of the WBG semiconductor material 1944 or 10 times a depth of a recess in the silicon 1906 in which the WBG semiconductor material 1944 is formed, whichever is greater, in a first lateral direction. In this example, the WBG semiconductor material 1944 has a second lateral dimension 1996*b* adjacent to the silicon 1906 that is no greater than 10 times a thickness of the WBG semiconductor material 1944 or 10 times a depth of a recess in the silicon 1906 in which the WBG semiconductor material 1944 is formed, whichever is greater, in a second lateral direction, perpendicular to the first lateral direction, as depicted in FIG. 19. Having the WBG semiconductor material 1944 with the two lateral dimensions 1996*a* and 1996*b* adjacent to the silicon 1906 limited as disclosed may accrue the advantages disclosed in reference to the islands of the WBG semiconductor material 1844 of FIG. 18. The two dimensional rectangular array configuration of this example may advantageously provide more uniform electric fields in the silicon 1906 compared to linear configurations.

Figure 20:
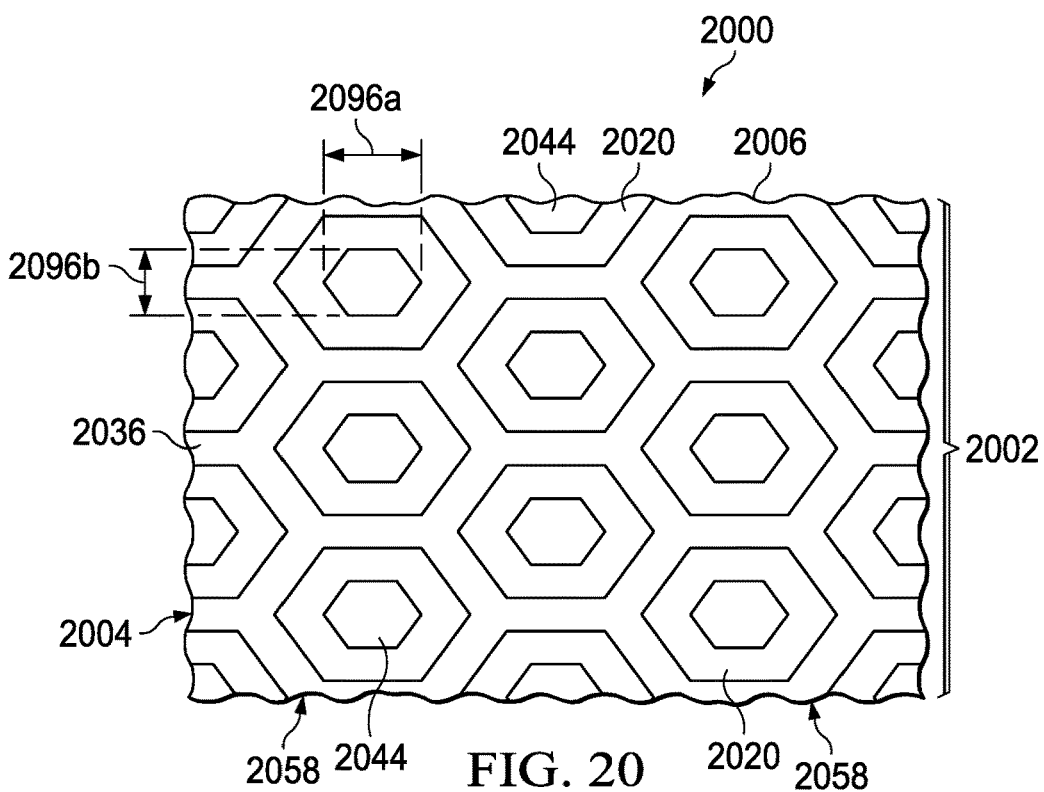
FIG. 20 is a top view of an example microelectronic device having a hybrid component with a WBG structure including a WBG semiconductor material configured as islands surrounded by separate drift region in silicon semiconductor material, in a rectangular array.

FIG. 20 is a top view of an example microelectronic device having a hybrid component with a WBG structure including a WBG semiconductor material configured as islands surrounded by separate drift region in silicon semiconductor material, in a rectangular array. The microelectronic device 2000 may be manifested as any of the device types disclosed in reference to the microelectronic device 100 of FIG. 1. The hybrid component 2002 of this example is described as a Schottky diode, however, other manifestations of the hybrid component 2002 are within the scope of this example. The microelectronic device 2000 includes a substrate 2004 that has silicon semiconductor material 2006, referred to herein as the silicon 2006. The substrate 2004 may be manifested as any of the substrate types disclosed in reference to the substrate 104 of FIG. 1.

The hybrid component 2002 of this example has a two dimensional hexagonal array configuration. The hybrid component 2002 includes a WBG semiconductor material 2044 which is formed as islands across the hybrid component 2002. The hybrid component 2002 of this example includes an n-type drift region 2020 in the silicon 2006, laterally surrounding each of the islands of the WBG semiconductor material 2044. The n-type drift region 2020 is part of a cathode of the hybrid component 2002.

The hybrid component 2002 includes metal silicide 2036 on the silicon 2006, laterally surrounding each of the islands of the WBG semiconductor material 2044, and laterally separated from the islands by the n-type drift region 2020. The n-type drift region 2020 is part of a silicon portion 2058 of the hybrid component 2002. The silicon portion 2058 laterally surrounds each of the islands of the WBG semiconductor material 2044, in this example. The WBG semiconductor material 2044 has a first lateral dimension 2096*a* adjacent to the silicon 2006 in a first lateral direction, and a second lateral dimension 2096*b* adjacent to the silicon 2006 in a second lateral direction, perpendicular to the first lateral direction, as depicted in FIG. 20. Both the first lateral dimension 2096*a* and the second lateral dimension 2096*b* are no greater than 10 times a thickness of the WBG semiconductor material 2044 or 10 times a depth of a recess in the silicon 2006 in which the WBG semiconductor material 2044 is formed, whichever is greater. Having the WBG semiconductor material 2044 with the two lateral dimensions 2096*a* and 2096*b* adjacent to the silicon 2006 limited as disclosed may accrue the advantages disclosed in reference to the islands of the WBG semiconductor material 1844 of FIG. 18. The two dimensional hexagonal array configuration of this example may advantageously provide higher current densities in the hybrid component 2002 compared to two dimensional array configurations.

Figure 21:
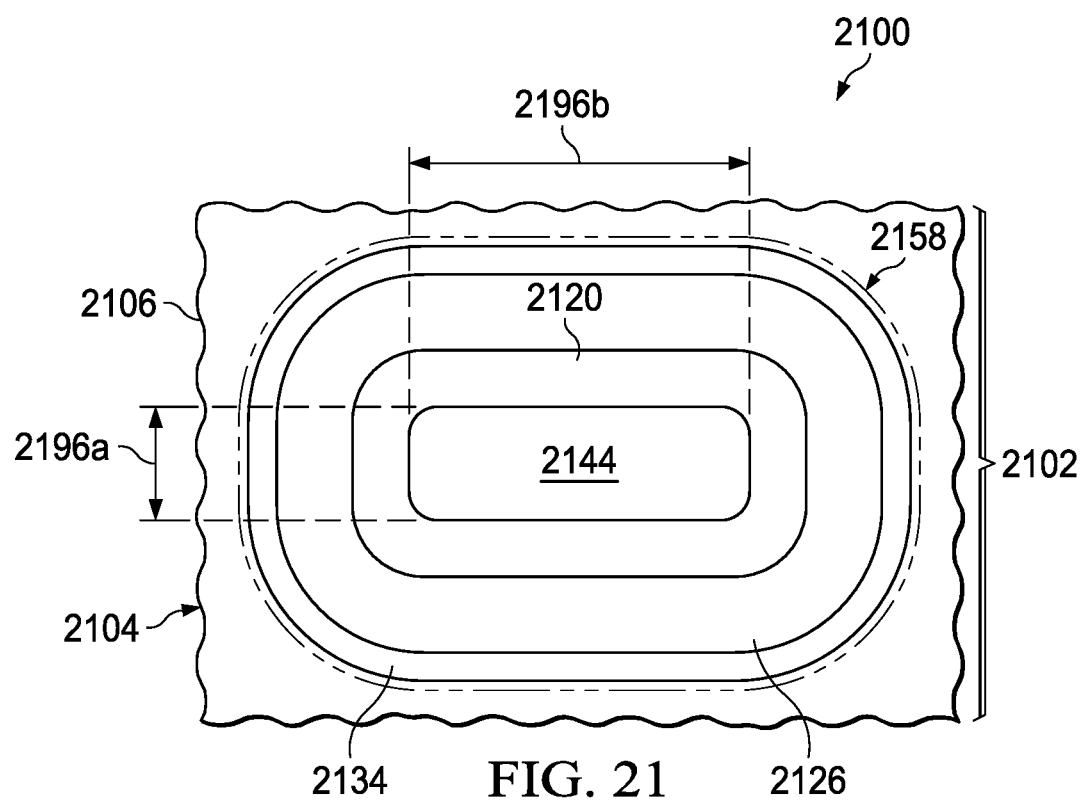
FIG. 21 is a top view of an example microelectronic device having a hybrid component with a WBG structure including a WBG semiconductor material in an elongated island.

FIG. 21 is a top view of an example microelectronic device having a hybrid component with a WBG structure including a WBG semiconductor material in an elongated island. The microelectronic device 2100 may be manifested as any of the device types disclosed in reference to the microelectronic device 100 of FIG. 1. The hybrid component 2102 of this example is described as a DEMOS transistor, however, other manifestations of the hybrid component 2102 are within the scope of this example. The microelectronic device 2100 includes a substrate 2104 that has silicon semiconductor material 2106, referred to herein as the silicon 2106. The substrate 2104 may be manifested as any of the substrate types disclosed in reference to the substrate 104 of FIG. 1.

The hybrid component 2102 of this example includes a WBG semiconductor material 2144, configured in a single island on the silicon 2106. The WBG semiconductor material 2144 has a first lateral dimension 2196a adjacent to the silicon 2106 that is no greater than 10 times a thickness of the WBG semiconductor material 2144 or 10 times a depth of a recess in the silicon 2106 in which the WBG semiconductor material 2144 is formed, whichever is greater, in at least one lateral direction. In this example, the WBG semiconductor material 2144 has a second lateral dimension 2196b adjacent to the silicon 2106 in a second lateral direction, perpendicular to the first lateral direction, which may be greater than the first lateral dimension 2196a, as indicated in FIG. 21.

The hybrid component 2102 includes an n-type drift region 2120 in the silicon 2106, laterally surrounding the WBG semiconductor material 2144. The hybrid component 2102 further includes a gate electrode 2126 over the silicon 2106, laterally surrounding the n-type drift region 2120, and an n-type source contact region 2134 in the silicon 2106, laterally surrounding the gate electrode 2126. The n-type drift region 2120 and the n-type source contact region 2134 are parts of a silicon portion 2158 of the hybrid component 2102. The silicon portion 2158 laterally surrounds the WBG semiconductor material 2144, in this example. Having the WBG semiconductor material 2144 with the first lateral dimension 2196a adjacent to the silicon 2106 in the first lateral direction that is limited as disclosed, and having the second lateral dimension 2196b adjacent to the silicon 2106 greater than the first lateral dimension 2196a in the second lateral direction may advantageously provide a desired current through the hybrid component 2102 while maintaining low defects due to lattice mismatch.

Various features of the examples disclosed herein may be combined in other manifestations of example microelectronic devices. For example, any of the hybrid components 102 through 2102 may be manifested as an LDMOS transistor, a DEMOS transistor, a bipolar junction transistor, a junction field effect transistor (JFET), or a diode. Any of the WBG semiconductor materials 144 through 2144 may include one or more group IV semiconductor materials, III-V compound semiconductor materials, II-VI semiconductor materials, perovskite semiconductor materials, magnesium oxide, or magnesium sulfide. Any of the hybrid components 102 through 2102 may have a recess in the silicon 106 through 2106 below the WBG structures 148 through 2148, similar to the shallow recess 566 or the recess 1366. Any of the hybrid components 102 through 2102 may have a heavily doped region in the silicon 106 through 2106 below the WBG structure 148 through 2148, similar to the n-type heavily doped region 568. Any of the WBG structures 148 through 2148 may include metal silicide between the WBG semiconductor materials 144 through 2144 and the silicon 106 through 2106, similar to the metal silicide 136, 936, or 1136. Any of the WBG structures 148 through 2148 may include an interface layer between the WBG semiconductor materials 144 through 2144 and the silicon 106 through 2106, similar to the interface layers 360 or 1360. Any of the hybrid components 102 through 2102 may have the WBG semiconductor materials 144 through 2144 in direct contact with the silicon 106 through 2106, similar to the hybrid components 502, 702, or 1502. Any of the WBG semiconductor materials 144 through 2144 may include a graded WBG portion with a varying composition and a varying lattice constant, similar to the graded WBG portion 744a. Any of the WBG semiconductor materials 144 through 2144 may include a first WBG semiconductor material and a second WBG semiconductor material 1344b on the first WBG semiconductor material, similar to the first WBG semiconductor material 1344a and the second WBG semiconductor material 1344b. Any of the WBG semiconductor materials 144 through 2144 may include a vertical segment and a lateral segment on the vertical segment, similar to the vertical segment 1544a and the lateral segment 1544b. Any of the WBG semiconductor materials 144 through 2144 may extend in rows across the hybrid components 102 through 2102, similar to the WBG semiconductor material 1744 as shown in FIG. 17. Any of the WBG semiconductor materials 144 through 2144 may be formed as islands across the hybrid components 102 through 2102, similar to the WBG semiconductor material 1844 as shown in FIG. 18. Any of the hybrid components 102 through 2102 may be configured with the WBG semiconductor materials 144 through 2144 laterally surrounded by the silicon portions 158 through 2158, similar to the hybrid components 1902, 2002, or 2102, as shown in FIG. 19 through FIG. 21. Any of the WBG structures 148 through 2148 may include a WBG contact layer 362 on the WBG semiconductor materials 144 through 2144, similar to the WBG contact layer 362 or 1362. Any of the WBG structures 148 through 2148 may include a WBG sidewall, similar to the WBG sidewalls 984, 1184, or 1584. Any of the hybrid components 102 through 2102 may have a field plate adjacent to the WBG semiconductor materials 144 through 2144, similar to the field plates 140, 564, 1186, 1540, or 1586.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a hybrid component;
   a substrate, the substrate including silicon;
   a silicon portion of the hybrid component, the silicon portion being in the silicon;
   a first current terminal of the hybrid component on the silicon portion of the hybrid component;
   a wide bandgap (WBG) structure including a WBG semiconductor material, on the silicon portion, the WBG semiconductor material having a bandgap energy greater than a bandgap energy of the silicon; and
   a second current terminal of the hybrid component on the WBG structure.

2. The microelectronic device of claim 1, wherein the WBG semiconductor material includes a semiconductor material selected from the group consisting of a group IV semiconductor, a group III-V semiconductor, and a group II-VI semiconductor.

3. The microelectronic device of claim 1, wherein the hybrid component is selected from the group consisting of a laterally diffused metal oxide semiconductor (LDMOS)

transistor, a drain extended metal oxide semiconductor (DEMOS) transistor, a bipolar junction transistor, a junction field effect transistor, a gated bipolar, a gated unipolar semiconductor device, an insulated gate bipolar transistor (IGBT), a silicon controlled rectifier (SCR), a metal oxide semiconductor (MOS)-triggered SCR, a MOS-controlled thyristor, a gated diode, and a Schottky diode.

4. The microelectronic device of claim 1, wherein the WBG semiconductor material extends into a recess in the silicon.

5. The microelectronic device of claim 1, wherein the WBG semiconductor material includes a first layer adjacent to the silicon having a first lattice constant, and includes a second layer contacting the first layer having a second lattice constant, wherein the first lattice constant is between the second lattice constant and a lattice constant of the silicon.

6. The microelectronic device of claim 1, wherein the silicon immediately below the WBG semiconductor material has an average dopant concentration greater than $1 \times 10^{19}$ cm$^{-3}$.

7. The microelectronic device of claim 1, wherein the WBG structure includes a metal silicide layer between the WBG semiconductor material and the silicon.

8. The microelectronic device of claim 1, wherein the WBG structure includes an interface layer between the WBG semiconductor material and the silicon, the interface layer including a material selected from the group consisting of a refractory metal, a platinum group metal, a two-dimensional material, and a rare earth metal.

9. The microelectronic device of claim 1, wherein the WBG structure includes a contact layer on the WBG semiconductor material.

10. The microelectronic device of claim 1, wherein the hybrid component includes a WBG sidewall contacting the WBG semiconductor material and laterally surrounding the WBG semiconductor material, the WBG sidewall including a dielectric material selected from the group consisting of silicon nitride and boron nitride.

11. The microelectronic device of claim 1, wherein the hybrid component includes a field plate laterally surrounding the WBG semiconductor material.

12. The microelectronic device of claim 1, wherein the WBG semiconductor material is a first WBG semiconductor material, and the WBG structure includes a second WBG semiconductor material on the first WBG semiconductor material.

13. The microelectronic device of claim 1, wherein the WBG semiconductor material includes a vertical segment adjacent to the silicon and a lateral segment extending laterally above the silicon, wherein the second current terminal contacts the WBG structure over the lateral segment.

14. The microelectronic device of claim 1, wherein the WBG semiconductor material has at least one lateral dimension adjacent to the silicon that is no greater than 10 times a thickness of the WBG semiconductor material or 10 times a depth of a recess in the silicon in which the WBG semiconductor material is located, whichever is greater.

15. The microelectronic device of claim 1, wherein the hybrid component is configured to have current between the first current terminal and the second current terminal pass through a boundary between the WBG structure and the silicon.

16. A microelectronic device, comprising:
a hybrid component;
a silicon portion of the hybrid component in silicon of a substrate of the microelectronic device;
a wide bandgap (WBG) structure on one or more portions of the silicon, the WBG structure including WBG semiconductor material having a bandgap energy greater than a bandgap energy of the silicon;
a dielectric layer on one or more other portions of the silicon;
a first current terminal of the hybrid component on the silicon portion of the hybrid component; and
a second current terminal of the hybrid component on the WBG structure.

17. The microelectronic device of claim 16, wherein the WBG semiconductor material includes a lateral segment extending laterally above the silicon, wherein the second current terminal contacts the WBG structure over the lateral segment.

18. The microelectronic device of claim 17, wherein the WBG semiconductor material includes a vertical segment adjacent to the silicon, connected to the lateral segment and contacting the silicon.

19. A microelectronic device, comprising:
a hybrid component;
a silicon portion of the hybrid component in silicon of a substrate of the microelectronic device;
a wide bandgap (WBG) structure on the silicon, the WBG structure including WBG semiconductor material having a bandgap energy greater than a bandgap energy of the silicon;
a first current terminal of the hybrid component on the silicon portion of the hybrid component and contacting a first interconnect; and
a second current terminal of the hybrid component on the WBG structure and contacting a second interconnect.

20. The microelectronic device of claim 19, wherein the WBG semiconductor material includes a vertical segment adjacent to the silicon and a lateral segment extending laterally above the silicon, wherein the second current terminal contacts the WBG structure over the lateral segment.

* * * * *